(12) United States Patent
Ji et al.

(10) Patent No.: US 12,094,802 B2
(45) Date of Patent: Sep. 17, 2024

(54) DATA PROCESSING DEVICE

(71) Applicant: Delta Electronics (Shanghai) CO., LTD, Shanghai (CN)

(72) Inventors: Pengkai Ji, Shanghai (CN); Shouyu Hong, Shanghai (CN); Xin Zou, Shanghai (CN); Lanyan Xu, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 233 days.

(21) Appl. No.: 17/232,461

(22) Filed: Apr. 16, 2021

(65) Prior Publication Data
US 2021/0335692 A1  Oct. 28, 2021

(30) Foreign Application Priority Data

Apr. 26, 2020 (CN) .......................... 202010339094.0
Feb. 10, 2021 (CN) .......................... 202110184733.5

(51) Int. Cl.
*H01L 23/40* (2006.01)
*H01L 23/427* (2006.01)
(Continued)

(52) U.S. Cl.
CPC ........ *H01L 23/4012* (2013.01); *H01L 23/427* (2013.01); *H01L 25/18* (2013.01);
(Continued)

(58) Field of Classification Search
CPC ............. H05K 7/2039; H05K 7/20445; H05K 7/2049; H05K 7/20154; H05K 7/20963;
(Continued)

(56) References Cited

U.S. PATENT DOCUMENTS 5,343,940 A * 9/1994 Jean ...................... H01L 23/427
                                                    165/80.4
5,901,040 A * 5/1999 Cromwell ............. H01L 23/427
                                                    257/E23.114
(Continued)

FOREIGN PATENT DOCUMENTS

CN      1967437 A    5/2007
CN    101960591 A    1/2011
(Continued)

OTHER PUBLICATIONS

CN-115175537-A English Translation (Year: 2022).*
(Continued)

*Primary Examiner* — Amir A Jalali
(74) *Attorney, Agent, or Firm* — Qinghong Xu

(57) ABSTRACT

The present disclosure provides a data processing device. The data processing device includes a carrier board, a data processor, a power module, a first heat sink, and a heat transfer plate. The data processor is provided above the carrier board. The power module is provided below the carrier board and supplies power to the data processor through the carrier board. The first heat sink is provided above the carrier board. The heat transfer plate includes a main body portion and a first extension. The main body portion is provided below the power module. The first extension portion extends upward from the main body portion and is connected to the first heat sink.

17 Claims, 62 Drawing Sheets

(51) Int. Cl.
*H01L 25/18* (2023.01)
*H05K 7/20* (2006.01)
*H01L 23/64* (2006.01)

(52) U.S. Cl.
CPC .. *H05K 7/20445* (2013.01); *H01L 2023/4087* (2013.01); *H01L 23/642* (2013.01)

(58) Field of Classification Search
CPC .... H05K 7/20854; H05K 1/0201–0203; H01L 23/34; H01L 23/36; H01L 23/367; H01L 23/373; H01L 23/3672; H01L 23/3677; H01L 23/40–4006; H01L 23/4012; H01L 23/4087; H01L 2023/4037; H01L 2023/405; H01L 2023/4075–4087; H01L 2023/427; H01L 2023/642; H01L 2023/4062; G06F 1/20; G06F 1/203; H01H 9/05
See application file for complete search history.

(56) References Cited

U.S. PATENT DOCUMENTS

| | | | | |
|---|---|---|---|---|
| 6,212,074 | B1* | 4/2001 | Gonsalves | H01L 23/4275 174/16.3 |
| 10,492,335 | B1* | 11/2019 | Hung | H01L 23/36 |
| 2002/0139467 | A1* | 10/2002 | Tomioka | H05K 1/141 156/92 |
| 2003/0181075 | A1* | 9/2003 | Hartke | H05K 1/141 439/67 |
| 2006/0164811 | A1 | 7/2006 | Maxwell et al. | |
| 2006/0181852 | A1* | 8/2006 | Frank | H01L 23/4006 257/E23.084 |
| 2007/0115643 | A1* | 5/2007 | Chen | H01L 23/4006 257/E23.084 |
| 2010/0073877 | A1* | 3/2010 | Yu | H01L 23/467 361/697 |
| 2011/0094723 | A1 | 4/2011 | Meyer, IV et al. | |
| 2011/0299253 | A1* | 12/2011 | Nabilek | H05K 3/325 361/728 |
| 2012/0111538 | A1* | 5/2012 | Wang | F28D 15/0266 165/104.21 |
| 2012/0132402 | A1* | 5/2012 | Aoki | H05K 7/20809 165/104.21 |
| 2015/0156924 | A1* | 6/2015 | Wu | F28D 15/0275 165/104.21 |
| 2019/0239395 | A1* | 8/2019 | Joshi | F28D 15/046 |
| 2020/0357717 | A1* | 11/2020 | Maier | H01L 23/5386 |
| 2020/0396855 | A1* | 12/2020 | Ye | H05K 1/181 |
| 2021/0305125 | A1* | 9/2021 | Kugman | H01L 23/4006 |

FOREIGN PATENT DOCUMENTS

| | | | |
|---|---|---|---|
| CN | 102026522 A | | 4/2011 |
| CN | 104684343 A | | 6/2015 |
| CN | 204836913 U | | 12/2015 |
| CN | 105742252 A | | 7/2016 |
| CN | 106332499 A | | 1/2017 |
| CN | 207603459 U | | 7/2018 |
| CN | 207851675 U | | 9/2018 |
| CN | 209072628 U | | 7/2019 |
| CN | 210137554 U | | 3/2020 |
| CN | 115175537 A | * | 10/2022 |
| JP | 2015201538 A | | 11/2015 |
| TW | M471126 U | | 1/2014 |
| TW | 201510460 A | | 3/2015 |

OTHER PUBLICATIONS

The First Office Action dated Jun. 17, 2022 of Chinese Patent Application No. 202110184733.5.
Notice of Allowance dated Jan. 4, 2023 of Chinese Application No. 202110184733.5.

* cited by examiner

Boost Circuit

DATA PROCESSING DEVICE

CROSS-REFERENCE TO RELATED APPLICATIONS

This application claims priority to Chinese Patent Application No. 202010339094.0, filed on Apr. 26, 2020, and Chinese Patent Application No. 202110184733.5, filed on Feb. 10, 2021, the contents of which are hereby incorporated by reference in their entirety for all purposes.

TECHNICAL FIELD

The present disclosure relates to the field of electronic and electric technology, in particular to a data processing device.

BACKGROUND

In existing data processing devices, as data processor (e.g., smart ICs) has increasing functions, power consumption thereof also increases. In addition, the number of components on a system main board is also increasing. Thus, a power supply system of the data processing device requires higher dynamics, efficiency and overload capacity.

Usually, a horizontal power supply solution is used in existing data processing device. However, in this solution, the current has a long transmission path through the system main board, which is not conducive to improving the efficiency and dynamics of the power supply system, often takes up more space or resources of internal wiring of the system main board, and may often interfere with signal lines on the system main board, and thus it is not convenient for customers to use.

SUMMARY

A main purpose of the present disclosure is to overcome at least one of the above defects of the prior art and provide a data processor that can meet the heat dissipation requirements when a power module and the data processor are respectively provided on both opposite sides of a carrier board or a system main board.

In order to achieve the above purpose, the following technical solutions can be used in the present disclosure.

According to one aspect of the present disclosure, a data processing device is provided. The data processing device includes a carrier board, a data processor, a power module, a first heat sink, and a heat transfer plate. The data processor is provided above the carrier board. The power module is provided below the carrier board, and supplies power to the data processor through the carrier board. The first heat sink is provided above the carrier board. The heat transfer plate includes a main body portion and a first extension portion. The main body portion is provided below the power module. The first extension portion extends upward from the main body portion and is connected to the first heat sink.

BRIEF DESCRIPTION OF THE DRAWINGS

Various objectives, features, and advantages of the present disclosure will become more apparent by the following detailed description of preferred embodiments of the present disclosure in combination with the accompanying drawings. The drawings are merely exemplary illustrations of the present disclosure and are not necessarily drawn to scale. In the drawings, the same reference numerals always refer to the same or similar parts.

DETAILED DESCRIPTION

Figure 1:
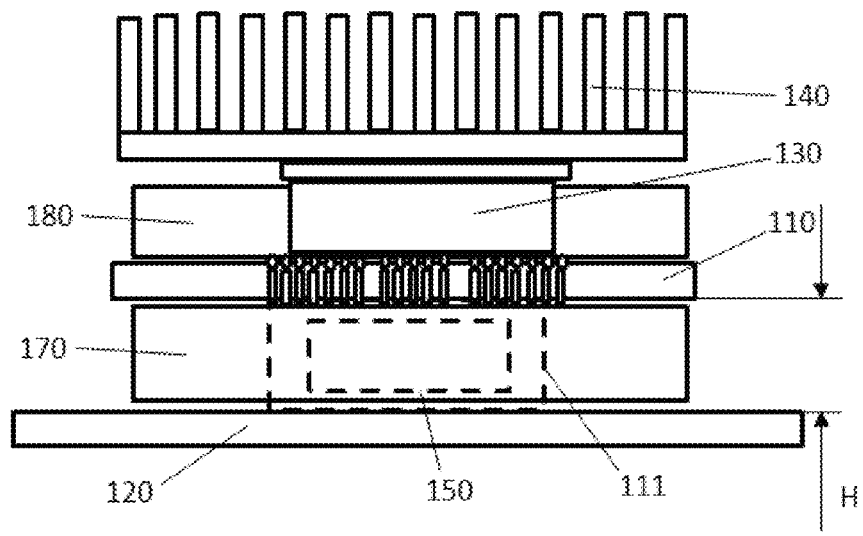
FIG. 1 is a schematic structural diagram of an existing data processing device using a vertical architecture.

Embodiments embodying features and advantages of the present disclosure will be described in detail as follows. It should be understood that according to the present disclosure, there are various changes in different embodiments, which do not depart from scope of the present disclosure, and the descriptions and drawings therein are essentially for illustrative purposes, rather than limiting the present disclosure.

Different exemplary embodiments of the present disclosure are described with reference to the accompanying drawings, which form a part of the present disclosure, and exemplarily show different exemplary structures, systems and steps that can implement various aspects of the present disclosure. It should be understood that other specific solutions of components, structures, exemplary devices, systems, and steps can be used, and structural and functional modifications can be made without departing from the scope of the present disclosure. Moreover, although the terms "above", "between", "within", etc. may be used in the specification to describe different exemplary features and elements of the present disclosure, these terms are used herein for convenience only, such as directions of the examples described in the drawings. Nothing in this specification should be construed as requiring a specific three-dimensional direction of the structure to fall within the scope of the present disclosure.

In order to solve the above problems, those skilled in the art have begun to study a vertical power supply solution. The vertical power supply solution is a system power supply solution that facilitates improving dynamics, efficiency and reducing capacitance. However, the vertical power supply solution brings great challenges to heat dissipation for a power system. Technical problems in the existing vertical power supply solutions are as follows.

A space in height direction between a carrier board and a system main board is small. For a system where a data processor is installed on the system main board, a gap between the carrier board and a housing is also small. Therefore, in the above two application conditions, the space for dissipating heat is small and with no wind, which makes heat dissipation difficult. As heat diffusion capacity of the housing is weak and there is no wind, diffusing heat into the air is limited when the heat is directly transferred to the housing. And it completely fails to meet heat dissipation requirements of power modules with high power. Furthermore, even if an additional heat dissipation channel is provided below the data processing device, it will greatly increase volume of an entire device (e.g., a server), and the data processing device requires two air ducts for heat dissipation, which will increase the cost.

To sum up, it is necessary to develop a heat dissipation structure to meet the heat dissipation requirements when the power module and an electrical load are respectively provided on both opposite sides of the carrier board or the system main board, especially, the heat dissipation requirements of the power module according to the vertical power supply solution.

The present disclosure provides a data processing device. In order to facilitate illustrating and understanding inventive concepts and effects of the disclosure, prior to the specific description of the data processing device provided by the present disclosure, the following will briefly introduce the existing solutions related to the present disclosure.

As shown in FIG. 1, it exemplarily shows a schematic structural diagram of an existing data processing device using a vertical architecture. The data processing device mainly includes a carrier board 110, a system main board 120, a data processor 130, a heat sink 140, and a power module 150. The power module 150 is provided below the carrier board 110. The data processor 130 is provided above the carrier board 110, the heat sink 140 is provided on an upper surface of the data processor 130, and the heat sink 140 is used for dissipating heat for the data processor 130. The system main board 120 is provided below the power module 150, and the carrier board 110 can be connected to another connector (not shown in the figure) provided on the system main board 120 through a connector 111 provided below the carrier board 110. A first reinforcement board 170 may be further provided below the carrier board 110, and a second reinforcement board 180 may be further provided above the carrier board 110. Since a height H between the carrier board 110 and the system main board 120 is small, usually less than 5 mm, the data processing device faces a situation where the heat dissipation space is small and with no wind, which increases the difficulty for heat dissipation. Furthermore, although additional heat dissipation channels may be provided below the data processing device, it will greatly increase the volume of server equipment In addition, two air ducts are required for heat dissipation, which greatly increases the cost.

Figure 2:
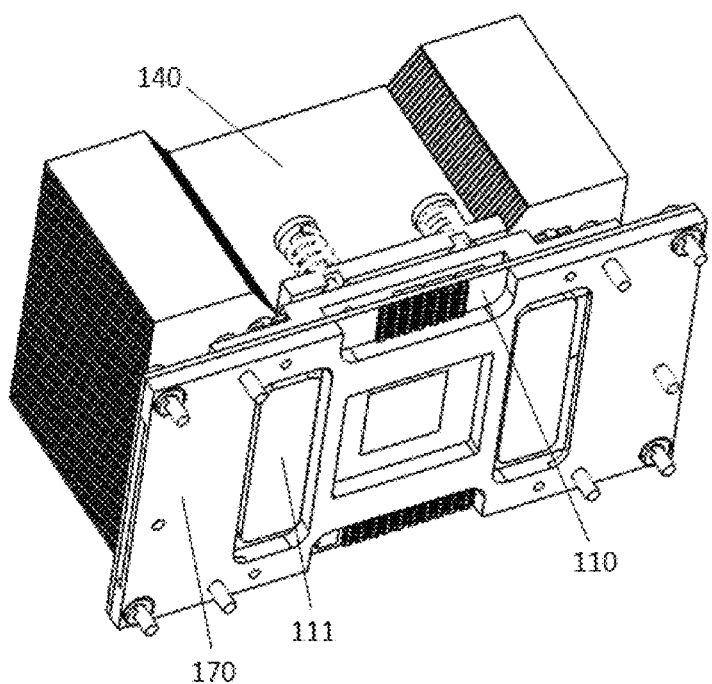
FIG. 2 is a perspective view of the existing data processing device shown in FIG. 1.
Figure 3:
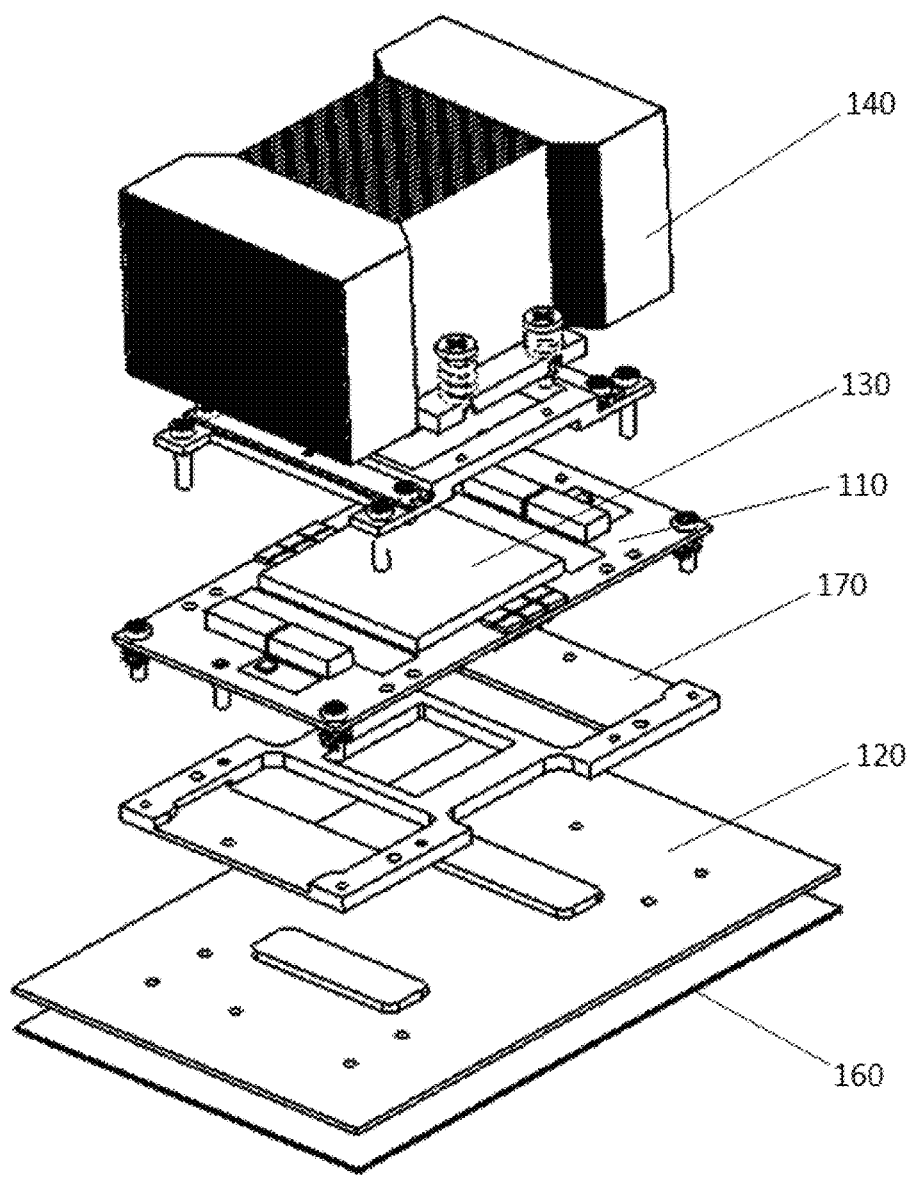
FIG. 3 is an exploded view of the existing data processing device shown in FIG. 2.

FIG. 2 exemplarily shows a perspective view of the existing data processing device shown in FIG. 1 and FIG. 3 exemplarily shows an exploded view of FIG. 2. The existing data processing device may further include a housing 160, and the housing 160 is provided below the system main board 120. If the heat is directly transferred to the housing 160 for heat dissipation, since the housing 160 is usually made of steel and has a thin thickness, the housing 160 has a weak heat diffusion ability, which makes the housing 160 have limited ability to diffuse heat into the air in no wind condition. And generally, it is far from meeting the heat dissipation requirements of the high-power power module 150. Furthermore, as shown in FIGS. 2 and 3, it can be seen that it is suitable for dissipating heat of the existing data processing device above the carrier board 110. As the space below the carrier board 110 is limited by the height restriction of the two connectors and the space occupation by the reinforcement board, there is almost no wind or heat dissipation path. Therefore, according to the above existing solution, if the power module 150 is provided below the carrier board 110, it is difficult for the power module 150 to dissipate heat.

Figure 4:
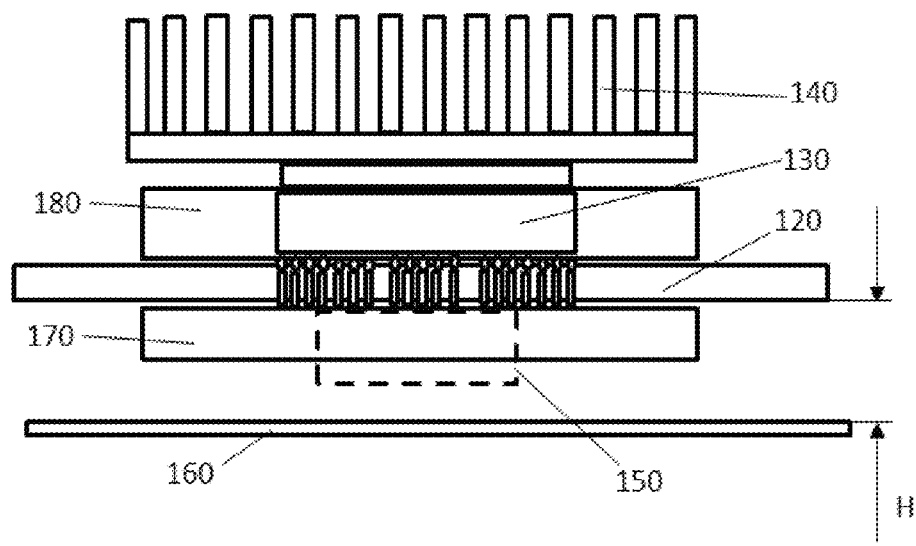
FIG. 4 is a schematic structural diagram of another existing data processing device using a vertical architecture.

As shown in FIG. 4, it exemplarily shows a schematic structural diagram of another existing data processing device using a vertical architecture. The difference between the existing data processing device in FIG. 4 and the existing data processing device as shown in FIGS. 1 to 3 is that the system main board 120 is used as carrier board, the data processor 130 is provided above the system main board 120, and the power module 150 is provided below the system main board 120. A first reinforcement board 170 may be further provided below the system main board 120, and a second reinforcement board 180 may be further provided above the system main board 120. Similar to the existing data processing device shown in FIGS. 1 to 3, the existing data processing device shown in FIG. 4 has a small height H between the system main board 120 and the housing 160, for example, usually 3 mm-10 mm, which also causes the data processing device to face a situation where the heat dissipation space is small and with no wind, thereby increasing the difficulty for heat dissipation.

In summary, based on the existing data processing device, the heat dissipation requirements of the power module cannot be met when the power module and the data processor are respectively provided on both sides of the carrier board or the system main board. Especially, the heat dissipation requirements of the power module with high power cannot be met when the data processing device uses the vertical power supply solution.

In order to solve the above technical problems, the present disclosure provides a data processing device, which can meet the heat dissipation requirements when the power module and the data processor are respectively provided on both sides of the carrier board or the system main board.

Figure 5:
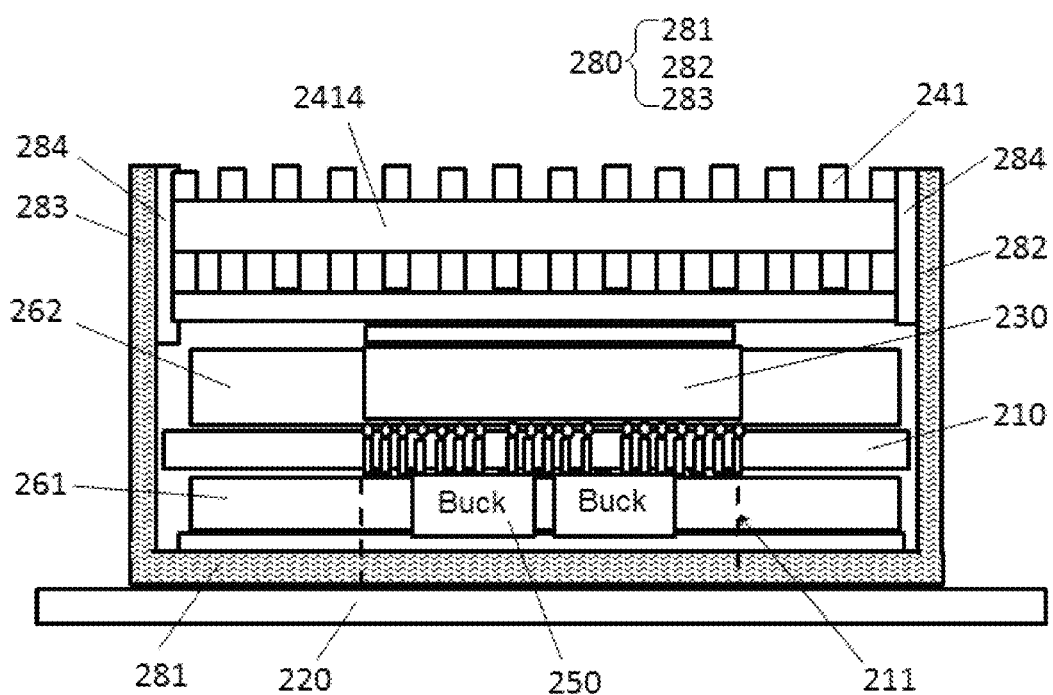
FIG. 5 is a schematic structural diagram of a data processing device according to a first embodiment of the present disclosure.

FIG. 5 exemplarily shows a schematic structural diagram of the data processing device provided by the present disclosure in a first embodiment. In this exemplary embodiment, the data processing device provided by the present disclosure is illustrated to be applied to a server. It is easy for those skilled in the art to understand that, in order to apply the relating design of the present disclosure to other types of equipment, various modifications, additions, substitutions, deletions or other changes can be made to the following specific embodiments without departing from the scope of the principle of the data processing device provided by the present disclosure.

Figure 8:
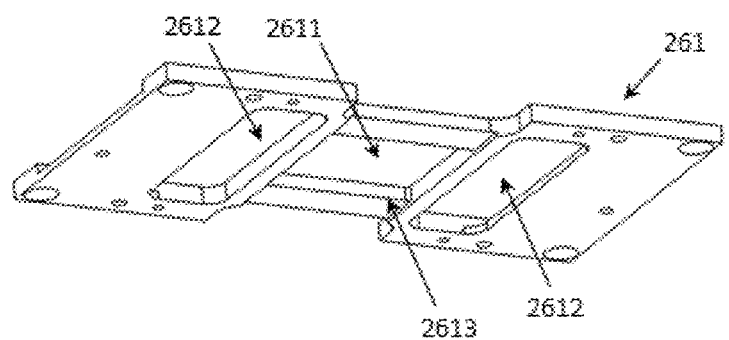
FIG. 8 is a perspective view of a first reinforcement board of the data processing device shown in FIG. 5.
Figure 9:
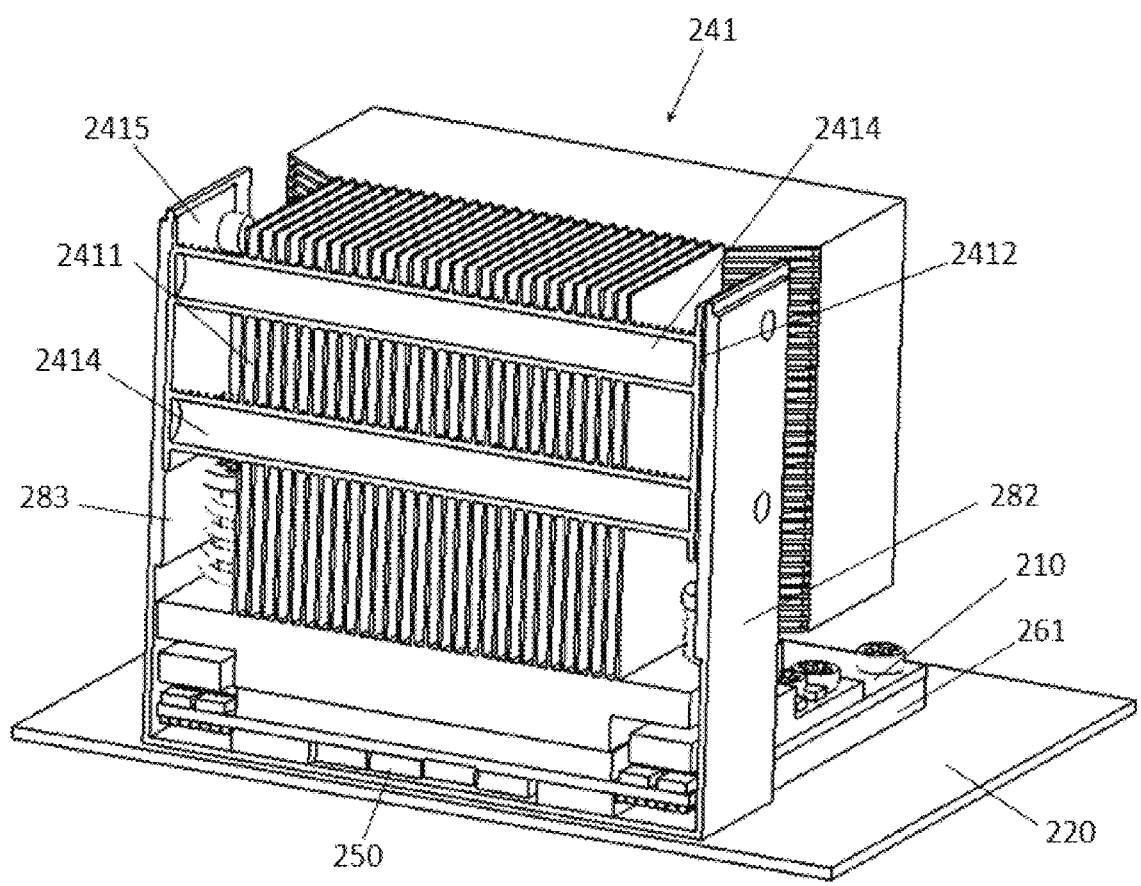
FIG. 9 is a cross-sectional view taken along plane A of FIG. 6.
Figure 10:
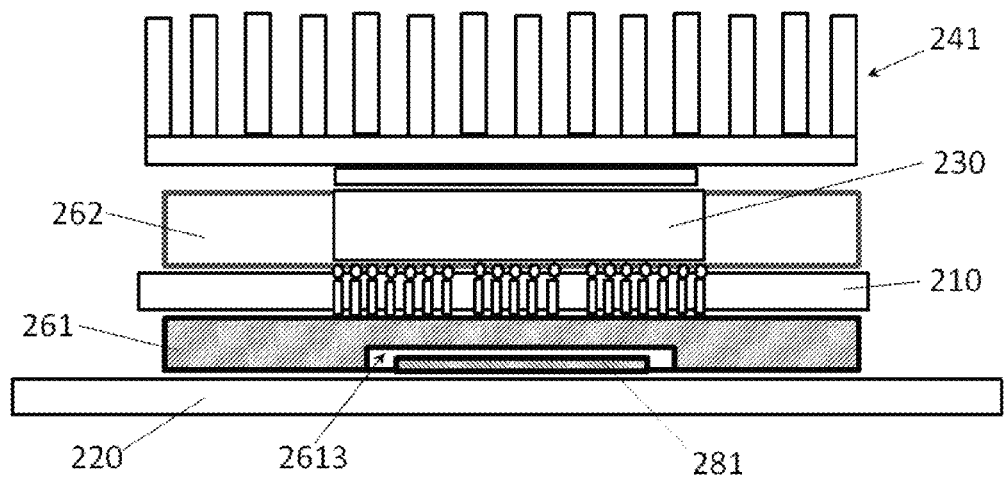
FIG. 10 is a side view shown in a direction B of FIG. 6.

As shown in FIG. 5, in this embodiment, the data processing device provided by the present disclosure includes a carrier board 210, a data processor 230 (such as GPU, CPU, ASIC or other artificial intelligence processing chips), a power module 250, and a first heat sink 241 and a heat transfer plate 280. With reference to FIGS. 6 to 10, FIG. 6 exemplarily shows a perspective view of the data processing device. FIG. 7 exemplarily shows an exploded view of the data processing device. FIG. 8 exemplarily shows a perspective view of a first reinforcement board 261 of the data processing device. FIG. 9 exemplarily shows a cross-sectional view taken along plane A of FIG. 6. FIG. 10 exemplarily shows a side view shown in a direction B of FIG. 6. Structure, connection mode, and functional relationship of main components of the data processing device provided by the present disclosure in the first embodiment will be described in detail below in conjunction with the above drawings.

Figure 6:
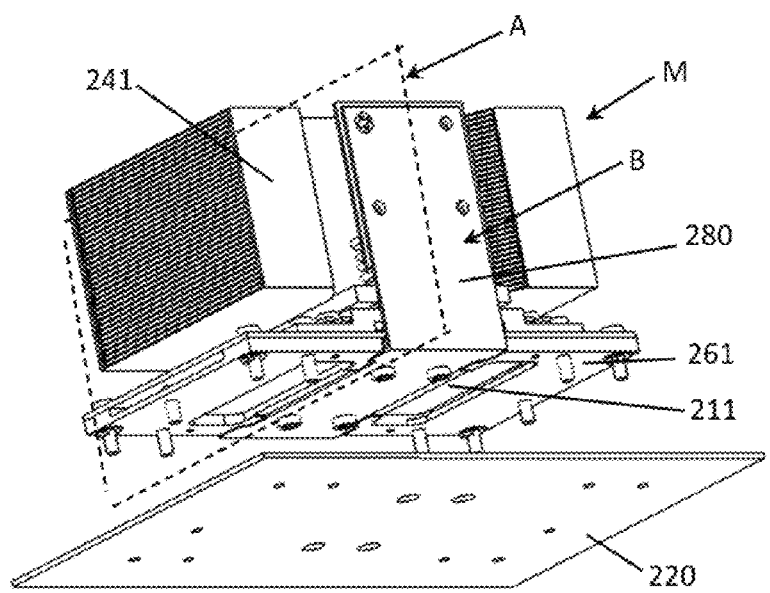
FIG. 6 is a perspective view of the data processing device shown in FIG. 5.
Figure 7:
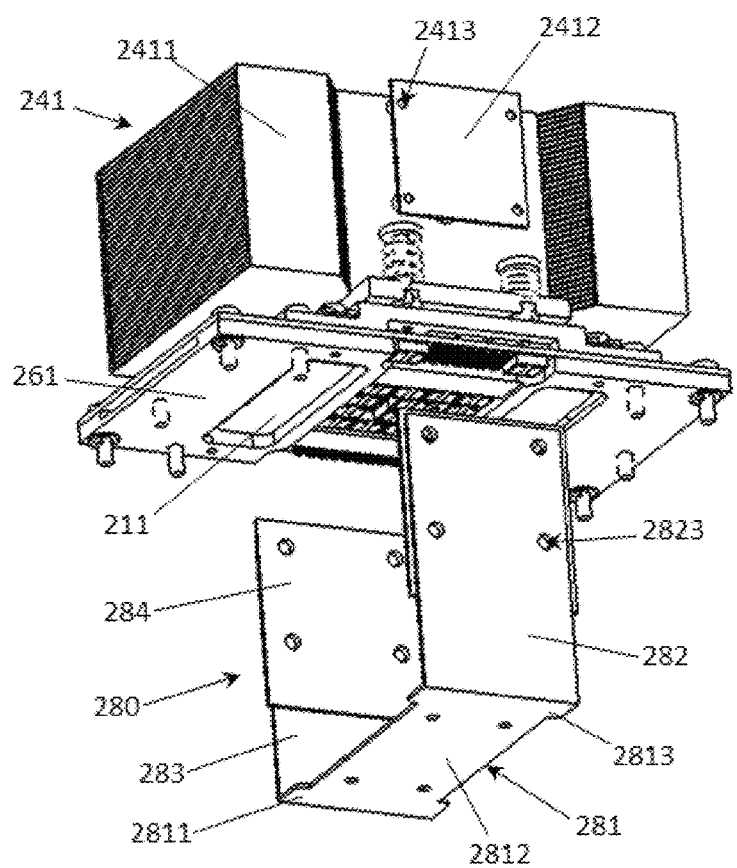
FIG. 7 is an exploded view of the data processing device shown in FIG. 5.

As shown in FIGS. 5 to 7, in this embodiment, the data processor 230 is provided above the carrier board 210. The power module 250 is provided below the carrier board 210, and the power module 250 supplies power to the data processor 230 through the carrier board 210. The first heat sink 241 is provided above the carrier board 210. The heat transfer plate 280 includes a main body portion 281 and a first extension portion 282. The main body portion 281 is provided below the power module 250. The first extension portion 282 extends upward from the main body portion 281, and the first extension portion 282 is connected to the first heat sink 241. The heat generated by the power module 250 can be transferred to the first heat sink 241 through the heat transfer plate 280. Since the first heat sink 241 is provided above the carrier board 210, the above heat dissipation solution is not limited by the space below the carrier board 210 or the windless environment under the carrier board 210. Therefore, the problem of increasing the space occupied by the processor due to the heat dissipation structure being provided below the data processing device can be avoided.

Based on the above, the data processing device provided by the present disclosure can meet the heat dissipation requirements when the power module 250 and the data processor 230 are respectively provided on both sides of the carrier board 210 or the system main board 220, and especially, the heat dissipation requirements of the power module 250 when the data processing device uses the vertical architecture can be met. Accordingly, the data processing device provided by the present disclosure has the advantages of being able to effectively dissipate heat from the power module in a small space, with better heat dissipation, compact structure, and lower cost. In addition, the data processing device provided by the present disclosure does not have the problem that it is difficult to install a heat dissipation structure due to the small space under the carrier board 210, so that the data processing device according to the present disclosure is more suitable for the design trend of thinning and miniaturization. Furthermore, the present disclosure can also maintain the integrity of the modular structure of the data processing module (e.g., a smart accelerator module), making the application of the data processing module more convenient.

As shown in FIGS. 5 to 7, in this embodiment, the first heat sink 241 may be provided above the data processor 230, and the first heat sink 241 is used to dissipate heat for the data processor 230. Based on the above, the first heat sink 241 can be used to dissipate heat transferred from the power module 250 through the heat transfer plate 280, and it also can be used to dissipate heat generated by the data processor 230.

As shown in FIG. 5, in this embodiment, a thermal interface material layer 284 can be provided between the first extension portion 282 and the first heat sink 241. The thermal interface material layer 284 can include thermal interface material. The thermal interface material layer 284 can improve the thermal conductivity between the first extension portion 282 and the first heat sink 241, thereby further optimizing the heat dissipation.

As shown in FIGS. 7 and 9, the first heat sink 241 may include a body 2411 and a first mounting board 2412. The first mounting board 2412 can be fixed to the body 2411. The first mounting board 2412 ban be connected to the first extension portion 282. That is, the heat transfer plate 280 and the first heat sink 241 can be connected by connecting the first extension portion 282 and the mounting board 2412. In addition, the thermal interface material layer 284 may be provided between the first extension portion 282 and the first mounting board 2412.

As shown in FIG. 7, in this embodiment, the first mounting board 2412 may be provided with a first threaded hole 2413, and the first extension portion 282 of the heat transfer plate 280 may be provided with a first mounting hole 2823. Accordingly, when the heat transfer plate 280 is connected to the first mounting board 2412 of the first heat sink 241 through the first extension portion 282, the position of the first mounting hole 2823 of the first extension portion 282 is corresponding to the first threaded hole of the first mounting board 2412, and the first mounting hole 2823 and the first threaded hole 2413 can be connected by a fastener, such as a bolt.

As shown in FIGS. 5 and 9, the first heat sink 241 may include a heat pipe 2414. The heat pipe 2414 is provided in the body 2411 of the first heat sink 241, and one end of the heat pipe 2414 is connected to the first mounting board 2412. In addition, the first heat sink 241 may include one heat pipe 2414 or two or more heat pipes 2414, such as one heat pipe (shown in FIG. 5), two heat pipes (shown in FIG. 9), and so on. The heat transferred by the heat transfer plate 280 can be quickly transferred to fins of the first heat sink 241 through the heat pipe 2414, thereby facilitating to reduce the thermal resistance for the heat dissipation.

As shown in FIG. 5, FIG. 7 and FIG. 9, the heat transfer plate 280 may also include a second extension portion 283. The second extension portion 283 extends upward from the other side of the main body portion 281, and the second extension portion 283 is connected to the first heat sink 241. That is, the first extension portion 282 and the second extension portion 283 are respectively located on opposite sides of the main body portion 281, and the heat transfer plate 280 has a substantially U-shaped structure. In other embodiments, the first extension portion 282 and the second extension portion 283 may be located on two adjacent sides of the main body portion 281 or on one side of the main body portion 281.

As shown in FIG. 9, the first heat sink 241 may also include a second mounting board 2415. The second mounting board 2415 is fixed to the body 2411 of the first heat sink 241, and the second mounting board 2415 is connected to the second extension 283 of the heat transfer plate 280. When the first heat sink 241 includes heat pipe 2414, the other end of the heat pipe 2414 may be connected to the second mounting board 2415.

Preferably, the heat transfer plate 280 may have a water-cooling plate structure or a sheet structure. For example, as shown in FIG. 5, the heat transfer plate 280 may be designed to have a water-cooling plate structure. At this time, the heat transfer plate 280 is still connected to the first heat sink 241 through the first extension portion 282, and the first extension portion 282 of the heat transfer plate 280 can still be connected to the first heat sink 241 through the thermal interface material layer 284. When the heat transfer plate 280 has a water-cooling plate structure, the heat dissipation can be further improved. As another example, as shown in FIG. 6, FIG. 7 and FIG. 9, the heat transfer plate 280 can also has a sheet structure, wherein the sheet structure can be a copper sheet or a graphene sheet, or can be made in other ways or materials. For example, as the heat transfer plate 280 in this embodiment is designed to have a U-shaped structure, the heat transfer plate 280 can be a U-shaped heat pipe or a U-shaped copper plate, and the heat transfer plate 280 can be formed by a vapor chamber.

Preferably, the body 2411 of the first heat sink 241 may include at least one of a radiating fin, a cooling fin, a water-cooling plate and a vapor chamber. For example, as shown in FIG. 5, the body 2411 of the first heat sink 241 has a structure including radiating fins, and the heat pipe 2414 in the body 2411 passes through the radiating fins.

As shown in FIGS. 5 and 6, the first extension portion 282 of the heat transfer plate 280 may extend from the main body portion 281 and upward across periphery of the carrier board 210. In addition, when the heat transfer plate 280 includes the second extension portion 283, the second extension portion 283 may also extend from the main body portion 281 and upward across the periphery of the carrier board 210. It should be noted that, when the first extension portion 282 and the second extension portion 283 extend upward, relationships between the two extension portions and the carrier board 210 are not limited to be the same, and it can extend upward in an appropriate manner according to the structure of the carrier board 210.

It should be noted that in other embodiments of the present disclosure, it is not limited that the heat transfer plate 280 include only the first extension portion 282 or include only the first extension portion 282 and the second extension 283. For example, the heat transfer plate 280 may include three or more extension portions, such as three, four, six, etc., and these extension portions are provided at intervals along the periphery of the main body portion 281. Regardless of the number of extension portions of the heat transfer plate 280, one extension portion connected to the first heat sink 241 is included, that is, the first extension portion 282. Further, w % ben the number of extension portions of the heat transfer plate 280 is two or more, it may include at least one pair of extension portions, and the pair of two extension portions are respectively provided on opposite sides of the main body portion 281.

As shown in FIGS. 6, 7 and 9, the main body portion 281 and the first extension portion 282 of the heat transfer plate 280 may be integrated. When the heat transfer plate 280 further includes a second extension portion 283 or other extension portions, each extension portion can be integrally formed with the main body portion 281. However, not all the extension portions are limited thereto. That is, part of the extension portions can use other structural relationships, e.g., a split structure.

Preferably, in this embodiment, an orthographic projection of the data processor 230 on the carrier board 210 may be at least partially overlapped with an orthographic projection of the power module 250 on the carrier board 210. Further, when the orthographic projection of the data processor 230 on the carrier board 210 and the orthographic projection of the power module 250 on the carrier 210 have the same shape and the same size, the orthographic projection of the data processor 230 and the orthographic projection of the power module 250 may be completely overlapped with each other.

As shown in FIGS. 5 to 10, the data processing device provided by the present disclosure may also include a first reinforcement board 261. The first reinforcement board 261 is provided between the carrier board 210 and the main body portion 281 of the heat transfer plate 280. The first reinforcement board 261 is provided with a first through hole 2611, and the power module 250 can pass through the first through hole 2611 to contact the main body portion 281. It can be understood that the power module 250 is provided below the carrier board 210 and is located in the first through hole 2611. Alternatively, one part of the power module 250 may be provided between the carrier board 210 and the first reinforcement board 261, and the other part of the power module 250 can be provided in the first through hole 2611.

As shown in FIGS. 7, 8 and 10, a lower surface of the first reinforcement board 261 may also be provided with a first recess 2613, and the first recess 2613 is a lower surface of the first reinforcement board 261 and is recessed from bottom to top in the vertical direction. The first recess 2613 may pass through opposite sides of the first reinforcement board 261 in the horizontal direction. The first recess 2613 corresponds to the position of the first through hole 2611. That is, an upper orifice of the first through hole 2611 is located on an upper surface of the first reinforcement board 261, and a lower orifice of the first through hole 2611 is located on a lower surface of the first reinforcement board 261 provided with the first recess 2613. That is, the lower orifice of the first through hole 2611 is located on the recessed bottom surface of the first recess 2613. When the main body portion 281 of the heat transfer plate 280 is provided below the first reinforcement board 261, it can be further provided in the first recess 2613, so that the thickness of the combined structure formed by the first reinforcement board 261 and the main body portion 281 can be further reduced.

Further, as shown in FIGS. 7 and 8, the main body portion 281 includes a first portion 2811, a second portion 2812, and a third portion 2813. The first portion 2811 and the third portion 2813 are located at opposite sides of the second portion 2812 in a horizontal direction. The first portion 2811 and the third portion 2813 pass through the first recess 2613 to be connected to the first extension portion and the second extension portion, and the second portion 2812 of the main body portion is in thermal contact with the power module. Width of the first part 2811 and the third part 2813 may be larger than that of the second part 2812, and alternatively, the widths may also be the same. On this basis, the shape of the first recess 2613 is substantially the same as the shape of the main body portion 281. That is, widths of two side regions (at the two opposite sides in the horizontal direction) of the first recess 2613 are greater than the width of the central region of the first recess 2613. When the main body portion 281 is provided in the first recess 2613, the first portion 2811 and the third portion 2813 are respectively located in the above two side regions of the first recess 2613, and the second portion 2812 is located in the above central region of the first recess 2613.

As shown in FIGS. 6 and 10, a lower surface of the main body portion 281 of the heat transfer plate 280 and the lower surface of the first reinforcement board 261 may be flush. When the lower surface of the first reinforcement board 261 is provided with the first recess 2613, a recessed depth of the first recess 2613 can be designed to be approximately equal to thickness of the main body portion 281. Accordingly, when the main body portion 281 is provided within the first recess 2613, the lower surface of the main body portion 281 can be flush with the lower surface of the first reinforcement board 261. Therefore, the space can be fully utilized and the structure becomes compact. In addition, based on the contact between the main body portion 281 and the first recess 2613, the first reinforcement board 261 can be used to facilitate heat dissipation of the main body portion 281 in a horizontal direction, thereby enhancing the heat dissipation.

In this embodiment, the first reinforcement board 261 and the heat transfer plate 280 may be integrated. Accordingly, the heat transfer plate 280 can serve as a reinforcement board and transfer heat to the first heat sink 241 above the carrier board 210. For example, the heat transfer plate 280 can be made of copper alloy or aluminum alloy with high strength and high thermal conductivity. The system structure can be simplified, and it is beneficial to save more space under the carrier board 210 and facilitate the placement of the power module 250.

As shown in FIG. 5, the data processing device provided by the present disclosure may further include a second reinforcement board 262. The second reinforcement board 262 is provided above the carrier board 210. For example, when the first heat sink 241 is provided above the carrier board 210, the second reinforcement board 262 may be provided between the carrier board 210 and the first heat sink 241.

Figure 24:
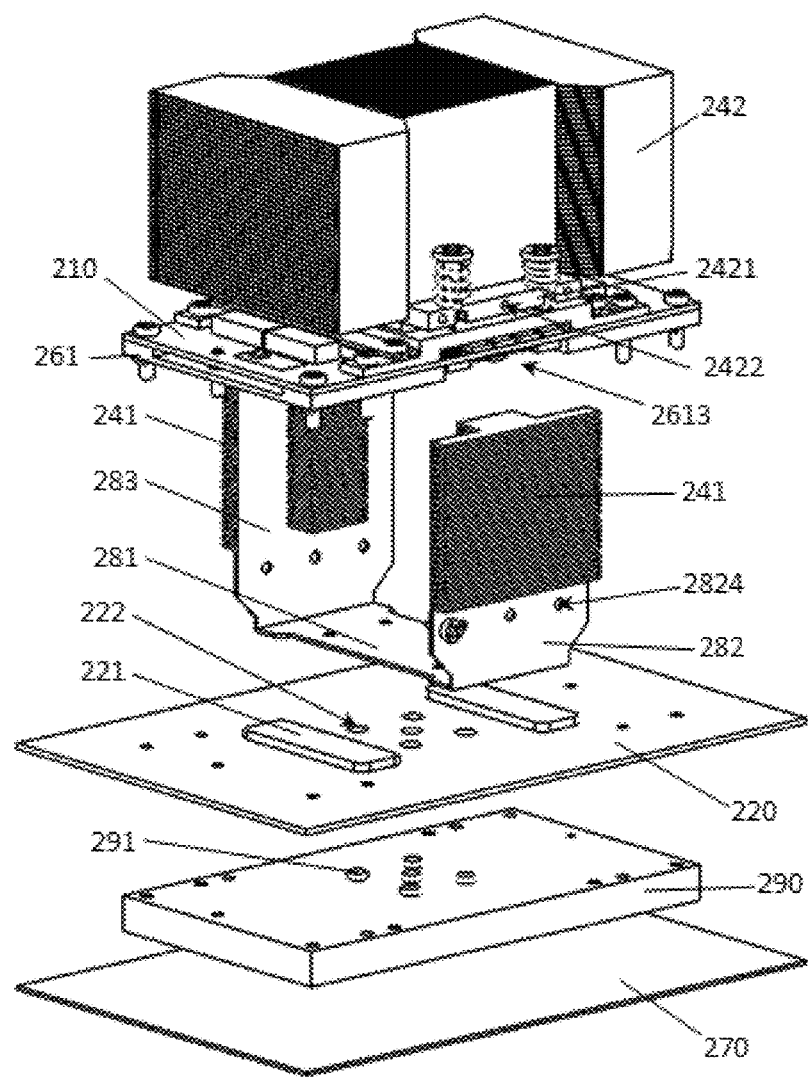
FIG. 24 is another perspective view of the data processing device shown in FIG. 23.

As shown in FIGS. 5, 6, 9 and 10, the data processing device provided by the present disclosure may include a system main board 220. In the data processing device provided by the present disclosure, carrier board 210, data processor 230, first heat sink 241, power module 250 and heat transfer plate 280 can form a data processing module (e.g., smart accelerator module) together. The system main board 220 can be provided below the data processing module. Specifically, the system main board 220 is provided below the main body portion 281 of the heat transfer plate 280. A lower surface of the carrier board 210 can be provided with a first connector 211, and an upper surface of the system main board 220 can be provided with a second connector 221 (as shown in FIGS. 7 and 24). The carrier board 210 can be connected to the second connector 221 of the system main board 220 through the first connector 211. In this embodiment, the data processing device provided by the present disclosure includes the carrier board 210 and the system main board 220, and the data processor 230 and the power module 250 are respectively provided on opposite sides of the carrier board 210. In other embodiments, the system main board 220 can be used as the carrier board, and the data processor 230 and the power module 250 can be respectively provided on opposite sides of the system main board.

As shown in FIGS. 6 to 8, based on the design that the data processing device includes the first reinforcement board 261 and the carrier board 210 and the system main board 220 are connected to the second connector 221 of the carrier board 210 through the first connector 211, the first reinforcement board 261 may be provided with a second through hole 2612, and the first connector 211 can pass through the second through hole 2612 and be connected to the second connector 221 of the system main board 220.

In this embodiment, when the data processing device provided by the present disclosure includes the first reinforcement board 261, the first reinforcement board 261 and the main body portion 281 of the heat transfer plate 280 may be integrated. Further, the material of the integrated structure may include copper alloy or aluminum alloy.

Figure 56:
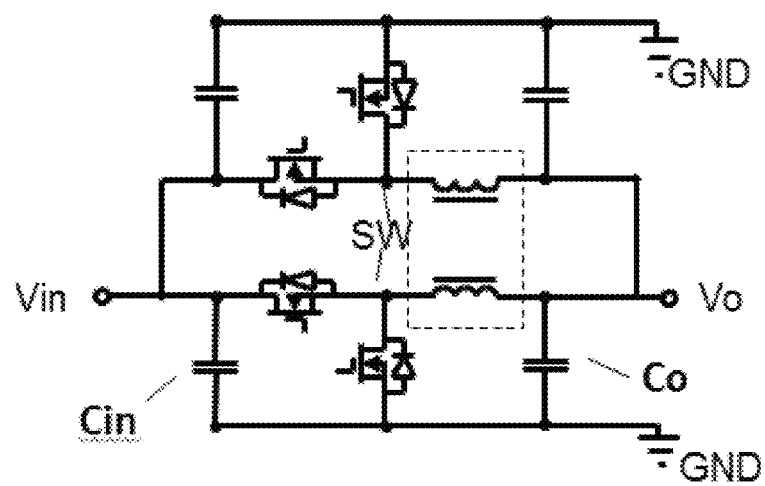
FIG. 56 to FIG. 62 are respectively a part of circuit diagrams that can be applied to the power module provided by the present disclosure.

As shown in FIG. 5, in this embodiment, the power module 250 can adopt a Buck circuit, and the representative circuit diagram of the Buck circuit is shown in FIG. 56. Type of circuit applicable to the power module 250 of the data processing device provided by the present disclosure will be described below, which will not be repeated here.

Figure 11:
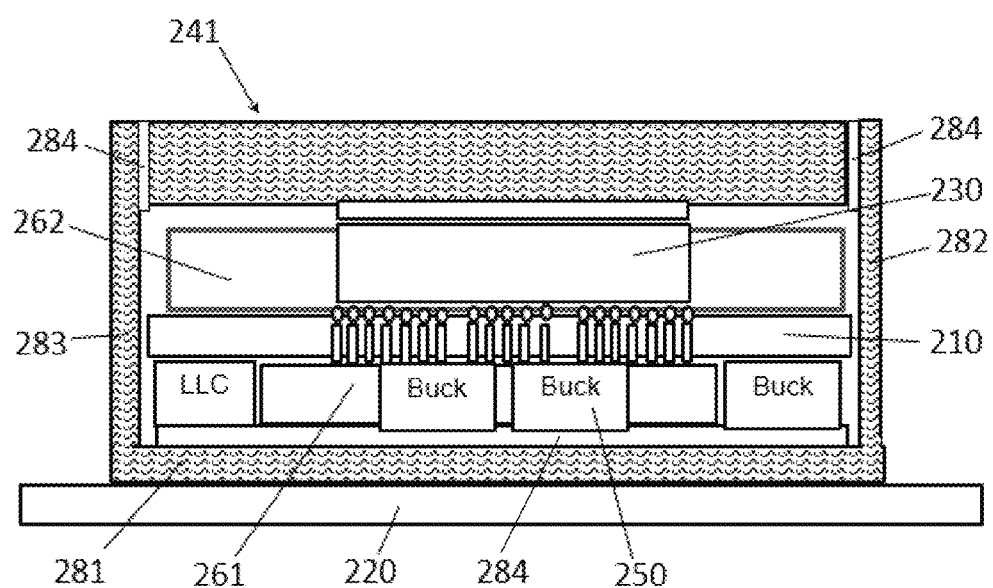
FIG. 11 is a schematic structural diagram of a data processing device according to a second embodiment of the present disclosure.
Figure 12:
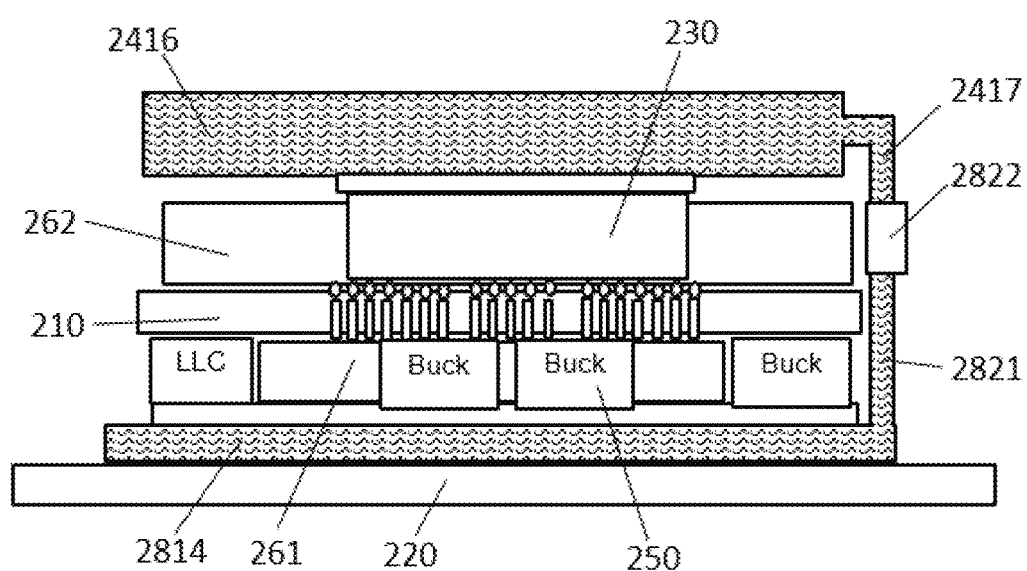
FIG. 12 is a schematic structural diagram of a data processing device according to a third embodiment of the present disclosure.
Figure 13:
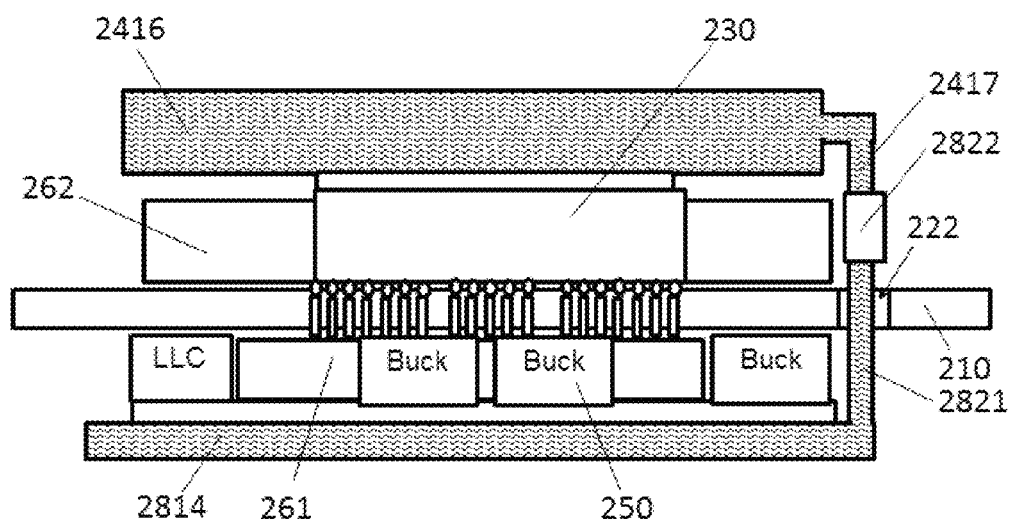
FIG. 13 is a schematic structural diagram of a data processing device according to a fourth embodiment of the present disclosure.

Refer to FIG. 11 to FIG. 13, which respectively and exemplarily show schematic structural diagrams of data processing devices provided by the present disclosure in the second embodiment, the third embodiment, and the fourth embodiment. In these embodiments, the design of the data processing device provided by the present disclosure is substantially the same as that in the first embodiment. Differences of the design of the data processing device in the second, third and fourth embodiments from the other embodiments will be described below with reference to the drawings. The same or similar design as in the other embodiments will not be repeated here.

As shown in FIG. 11, in the second embodiment, a water-cooling plate is used for the first heat sink 241, and a water-cooling plate may also be used for the heat transfer plate 280. The main body portion 281, the first extension portion 282, and the second extension portion 283 of the heat transfer plate 280 may be integrated, and the first extension portion 282 and the second extension portion 283 are connected to the first heat sink 241 through the thermal interface material layer 284, respectively. Accordingly, the first heat sink 241 and the heat transfer plate 280 with a water-cooling plate structure can facilitate the improvement of the heat dissipation, and has advantages of flexible application and easy layout.

As shown in FIG. 11, the thermal interface material layer 284 may be provided between the main body portion 281 of the heat transfer plate 280 and the power module 250. The providing of the thermal interface material can increase a connection area between the heat transfer plate 280 and the power module 250, and can expand heat dissipation channel and reduce thermal resistance.

As shown in FIG. 12, in the third embodiment, a water-cooling plate is used for the first heat sink 241, a water-cooling plate may also be used for the heat transfer plate 280. Specifically, the first heat sink 241 may at least include a first water-cooling plate structure 2416 and a first cooling pipe 2417, and the first cooling pipe 2417 can be communicated to the first water-cooling plate structure 2416. The main body portion 281 of the heat transfer plate 280 includes at least a second water-cooling plate structure 2814, and the first extension portion 282 of the heat transfer plate 280 may include at least a second cooling pipe 2821, and the second cooling pipe 2821 can be communicated to the second water-cooling plate structure 2814. The first cooling pipe 2417 of the first heat sink 241 is in communication with the second cooling pipe 2821 of the heat transfer plate 280. Further, when the heat transfer plate 280 further includes the second extension portion 283, the second extension portion 283 may include at least another cooling pipe, and the another cooling pipe may also be communicated to the second water-cooling plate structure 2814.

As shown in FIG. 12, the first cooling pipe 2417 can be provided with a quick connector 2822, and the first cooling pipe 2417 can be connected to the second cooling pipe 2821 through the quick connector 2822. Cooling medium (such as cooling water) in the second water-cooling plate structure 2814 of the main body portion 281 can be communicated to the first cooling pipe 2417 of the first heat sink 241 through the second cooling pipe 2821 of the first extension portion and the quick connector 2822, which can further improve the heat dissipation performance of the heat transfer plate 280. Moreover, by providing the quick connector 2822, it can easily achieve disassembly and assembly of the heat transfer plate 280 and the first heat sink 241. When an extension portion of the heat transfer plate 280 is communicated to the first heat sink 241 through the quick connector 2822, the cooling medium flowing through the heat transfer plate 280 can be communicated with the cooling medium flowing in the first heat sink 241, and thus the heat in the heat transfer plate 280 can be dissipated by the cooling medium.

In addition, as shown in FIG. 12, the data processing device includes the carrier board 210 and the system main board 220. The first extension portion 282 of the heat transfer plate 280 extends from the main body portion 281 and upward cross the periphery of the carrier board 210.

As shown in FIG. 13, in the fourth embodiment, the carrier board 210 is a system main board. As the system main board having a large size, the first extension portion 282 of the heat transfer plate 280 extends through the carrier board 210 from the main body portion 281, and then extends upward.

As shown in FIG. 13, the carrier board 210 may be provided with an opening 222 through which the first extension portion 282 of the heat transfer plate 280 extends upward. Alternatively, a groove can be provided on the periphery of the carrier board 210, and the first extension portion 282 of the heat transfer plate 280 extends upward through the groove. The opening 222 or the groove provided on the carrier board 210 can be flexibly provided according to the size of the carrier board 210 and a positional relationship between the carrier board 210 and the extension portion of the heat transfer plate 280. The present disclosure can realize proper arrangement of the extension portion when the carrier board 210 has a large size, or can meet a requirement of not providing the heat transfer plate 280 outside the carrier board 210, so as to avoid increasing of footprint of an intelligent processing module. Furthermore, by providing the opening 222 or the groove, the structural modification of the carrier board 210 can be minimized, and a heat dissipation channel that penetrates from the bottom of the carrier board 210 to the top of the carrier board 210 can be formed.

Figure 14:
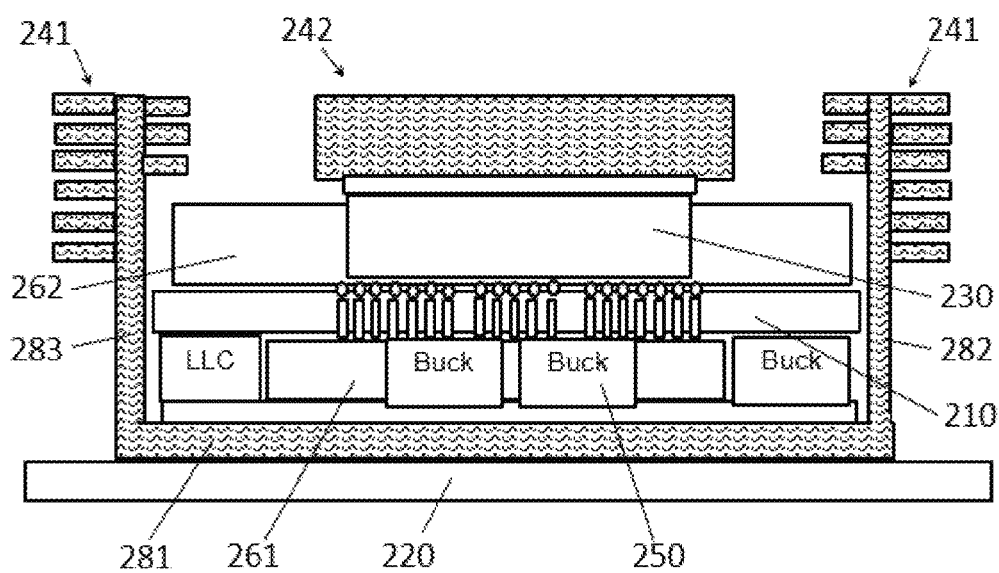
FIG. 14 is a schematic structural diagram of a data processing device according to a fifth embodiment of the present disclosure.
Figure 15:
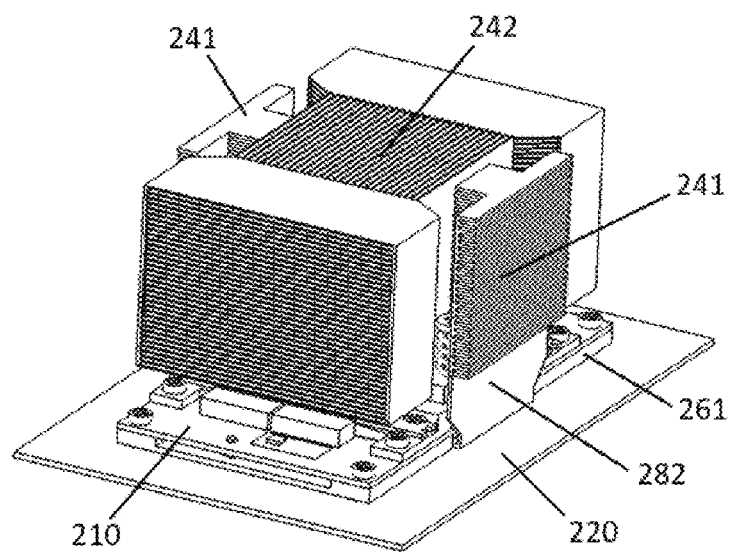
FIG. 15 is a perspective view of the data processing device shown in FIG. 14.
Figure 16:
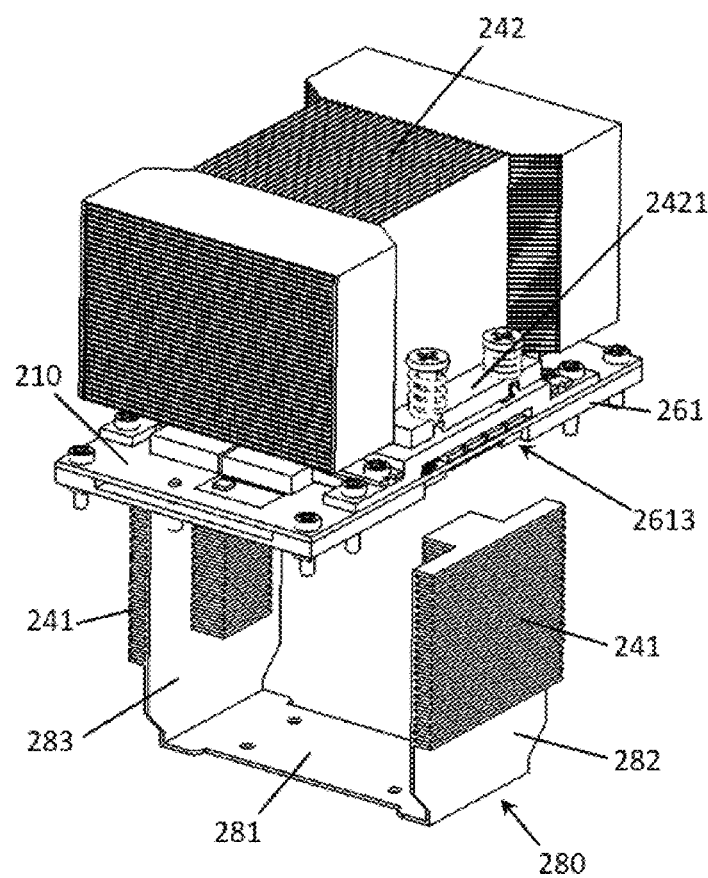
FIG. 16 is another perspective view of the data processing device shown in FIG. 14.

Refer to FIG. 14, which exemplarily shows a schematic structural diagram of a data processing device provided by the present disclosure in the fifth embodiment. In the fifth embodiment, the design of the data processing device provided by the present disclosure is substantially the same as that in the first to fourth embodiments. With reference to FIGS. 15 and 16, FIG. 15 exemplarily shows a perspective view of the data processing device in the fifth embodiment; FIG. 16 exemplarily shows another perspective view of the data processing device in the fifth embodiment, and it specifically shows a state when the heat transfer plate 280 is separated from other structures. Differences between the data processing devices in the fifth embodiment from the other embodiments will be described below in combination with the drawings. The same or similar design as in other embodiments will not be repeated here.

As shown in FIGS. 14 to 16, the data processing device provided by the present disclosure may further include a second heat sink 242. Specifically, the second heat sink 242 is provided above the data processor 230 and is used to dissipate heat for the data processor 230. In addition, the first heat sink 241 is provided on the first extension portion 282 of the heat transfer plate 280 to dissipate heat for the power module 250 through the heat transfer plate 280. In addition, the heat transfer plate 280 includes a plurality of extension portions. For example, the heat transfer plate 280 includes a first extension portion 282 and a second extension 283, and the first heat sink 241 may be arranged at one or two extension portions. That is, the first heat sink 241 may be provided on at least one of the plurality of extension portions, or may be provided on each extension portion. The heat generated by the power module 250 can be diffused into the air through the heat transfer plate 280 and the first heat sink 241 without changing the second heat sink 242 and occupying the second heat sink 242, which can reduce heat dissipation burden of the heat sink 242 and it is convenient for customer applications.

As shown in FIG. 14, in the fifth embodiment, the first heat sink 241 may have the water-cooling heat dissipation structure such as the water-cooling plate and the heat pipe, and the second heat sink 242 may also include the water-cooling heat dissipation structure, such as the water-cooling plate and the heat pipe. In addition, as shown in FIGS. 15 and 16, the first heat sink 241 may have an air-cooling heat dissipation structure such as radiating fins or cooling fins, and the second heat sink 242 may also have an air-cooling heat dissipation structure such as radiating fins or cooling fins. In addition, in other embodiments, when the first heat sink 241 has an air-cooling heat dissipation structure, the second heat sink 242 may have a water-cooling heat dissipation structure or other types of heat dissipation structures. Correspondingly, when the first heat sink 241 has a water-cooling heat dissipation structure, the second heat sink 242 may has an air-cooling heat dissipation structure or other types of heat dissipation structures. Moreover, for each heat sink, it can have only the air-cooling heat dissipation structure, or only the water-cooling heat dissipation structure, or both the air-cooling heat dissipation structure and the water-cooling heat dissipation structure, or other types of heat dissipation structure. The first heat sink 241 and the second heat sink 242 can be flexibly selected, which is beneficial to reduce system complexity, improve reliability and facilitate maintenance.

In the fifth embodiment, the first heat sink 241 and the second heat sink 242 may be connected with each other. The first heat sink 241 and the second heat sink 242 can be connected in any suitable manner. For example, the first heat sink 241 and the second heat sink can be directly connected through mounting boards respectively provided on the first heat sink 241 and the second heat sink 242, or can be connected indirectly by a heat transfer structure such as a heat pipe, etc.

As shown in FIGS. 14 to 16, the extension portion has two sides which are respectively facing the second heat sink 242 and away from the second heat sink 242, and the first heat sink 241 may be provided on each of the two sides of the extension portions. Further, when the first heat sink 241 is connected to the second heat sink 242, a part of the first heat sink 241 provided on the side of the extension portion facing the second heat sink 242 can be connected to the second heat sink 242. In other embodiments, the first heat sink 241 may be provided just on the side of the extension portion facing away from the second heat sink 242, and the extension portion may be connected with the second heat sink 242 through a side of the extension portion facing the second heat sink 242.

Figure 17:
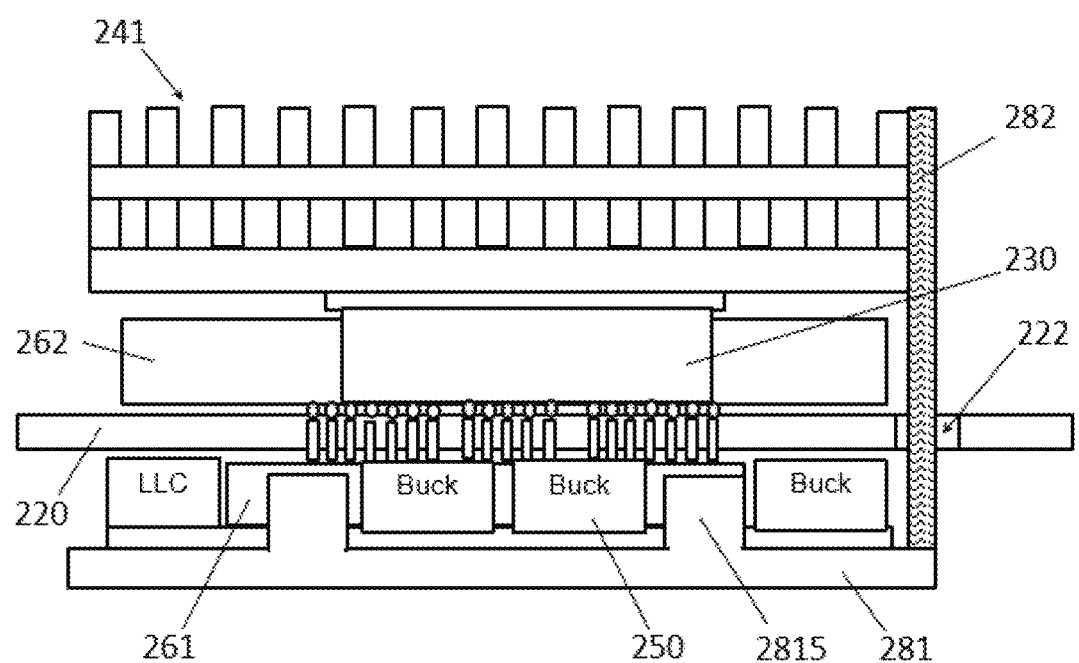
FIG. 17 is a schematic structural diagram of a data processing device according to a sixth embodiment of the present disclosure.

Refer to FIG. 17, which exemplarily shows a schematic structural diagram of a data processing device provided by the present disclosure in the sixth embodiment. In the above embodiment, the design of the data processing device provided by the present disclosure is substantially the same as that in the first to fifth embodiments. Differences between the data processing devices in the sixth embodiment from the other embodiments will be described below in combination with the drawing. The same or similar design as in other embodiments will not be repeated here.

As shown in FIG. 17, in the sixth embodiment, a heat transfer plate 280 includes a main body portion 281 and a first extension portion 282. The main body portion 281 and the first extension portion 282 of the heat transfer plate 280 may have a split structure, and the main body portion 281 and the first extension portion 282 may be connected in various ways. For example, the main body portion 281 and the first extension portion 282 may be connected by a connecting member, and the connecting member may be a bolt, a rivet, and the like. For another example, the main body portion 281 and the first extension portion 282 may be directly connected by welding or other proper processes. In addition, the heat transfer plate 280 may have a plurality of extension portions. For example, when the heat transfer plate 280 further includes the second extension 283, each extension and the main body portion can form a split structure, but it is not limited thereto. That is, part of the extension portions may be provided to have other structural relationships with the main body portion 281, such as an integrated structure.

As shown in FIG. 17, the main body portion 281 and the first extension portion 282 of the heat transfer plate 280 are based on the split structure design. In the sixth embodiment, the main body portion 281 may be a copper plate, a vapor chamber or the like. The first extension portion 282 may be a water-cooling plate, a vapor chamber or the like. The main body portion 281 and the first extension portion 282 may have different heat transfer structures.

As shown in FIG. 17, at least one protrusion 2815 may be provided on an upper surface of the heat transfer plate 280, and the protrusion 2815 is located on a side of the power module 250. FIG. 17 shows that two protrusions 2815 are provided on the upper surface of the heat transfer plate 280. Based on the above design, the protrusion 2815 can be connected to the side of the power module, thereby increasing the connection area between the heat transfer plate 280 and the power module 250, and reducing thickness of the thermal interface provided between the heat transfer plate 280 and the power module 250 and the thermal resistance.

Figure 18:
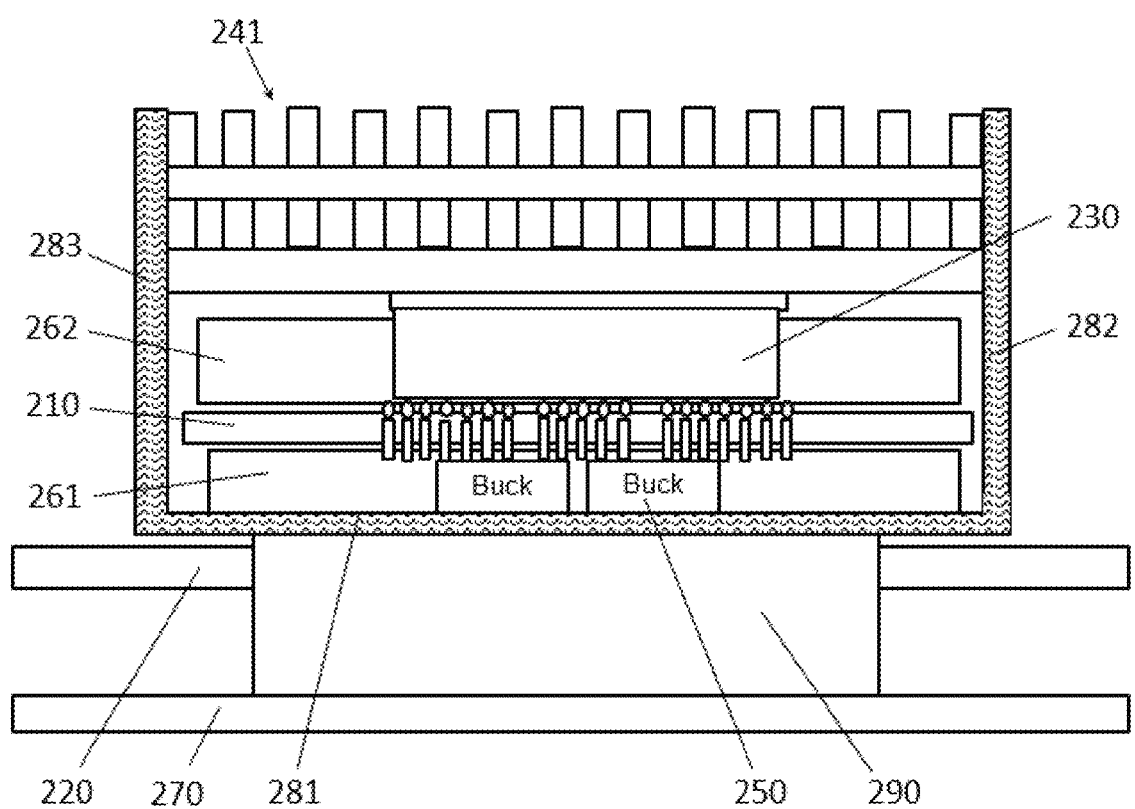
FIG. 18 is a schematic structural diagram of a data processing device according to a seventh embodiment of the present disclosure.
Figure 19:
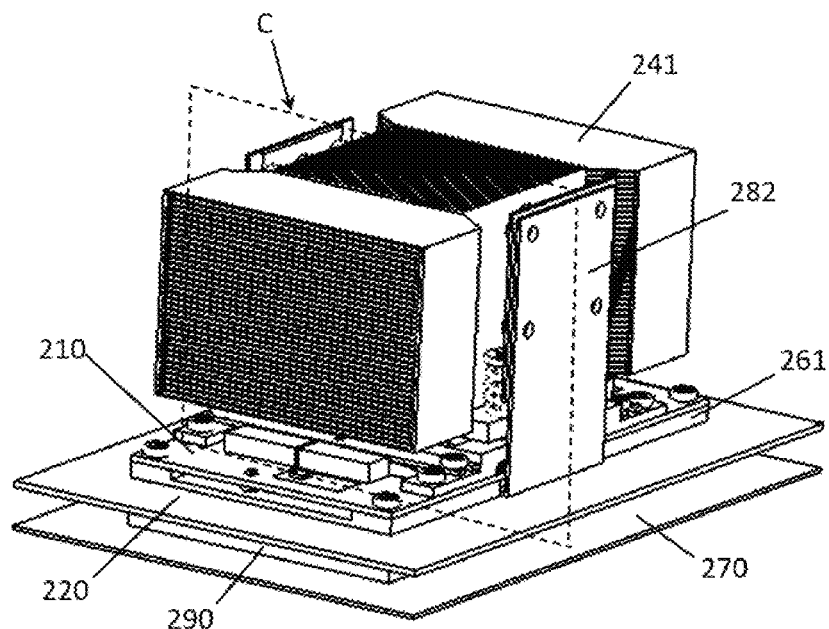
FIG. 19 is a perspective view of the data processing device shown in FIG. 18.
Figure 20:
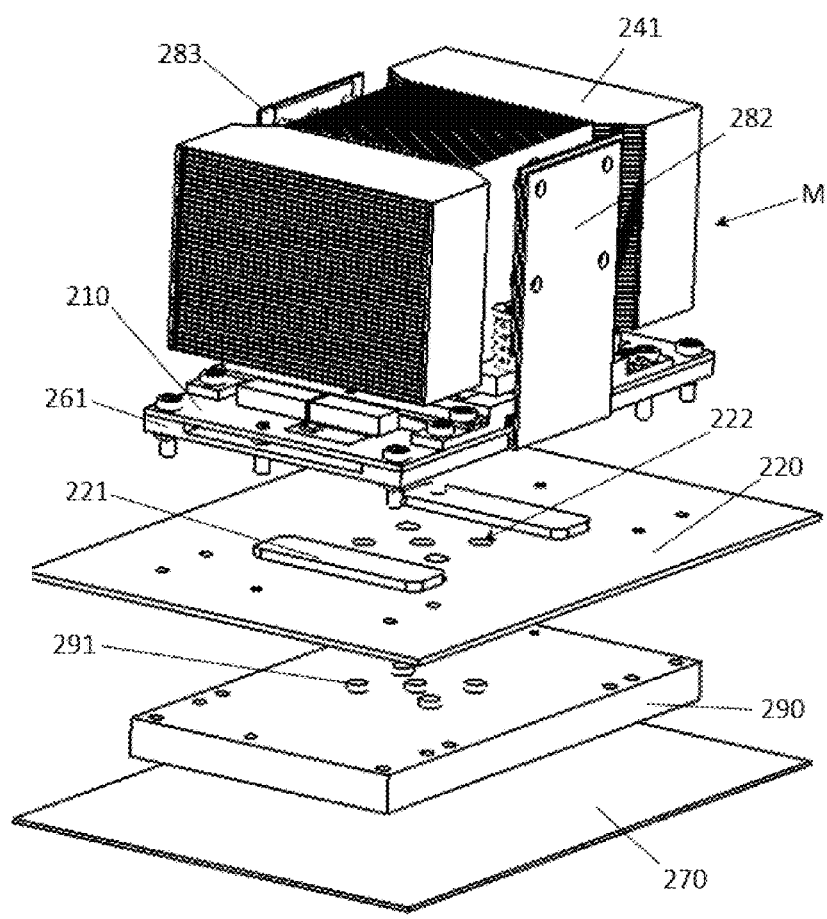
FIG. 20 is another perspective view of the data processing device shown in FIG. 18.
Figure 21:
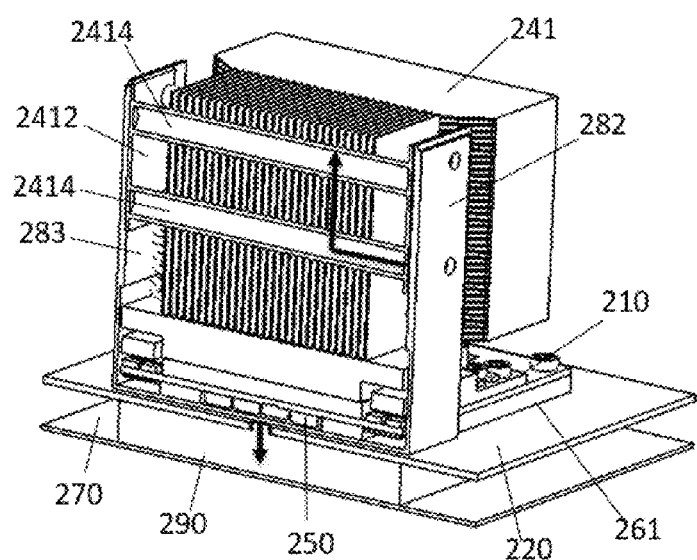
FIG. 21 is a perspective cross-sectional view taken along plane C of FIG. 19.

Refer to FIG. 18, which exemplarily shows a schematic structural diagram of a data processing device provided by the present disclosure in the seventh embodiment. In the seventh embodiment, the design of the data processing device provided by the present disclosure is substantially the same as that in the first to sixth embodiments. With reference to FIGS. 19 to 21, FIG. 19 exemplarily shows a perspective view of the data processing device in the seventh embodiment; FIG. 20 exemplarily shows another perspective view of the data processing device in the seventh embodiment, and specifically shows the state when the data processing module is separated from other structures; FIG. 21 exemplarily shows a perspective cross-sectional view taken along the plane C of FIG. 19. Differences of the design of the data processing device in the seventh embodiment from the other embodiments will be described below with reference to the drawings. The same or similar design as in other embodiments will not be repeated here.

As shown in FIGS. 18 to 20, in the seventh embodiment, the data processing device provided by the present disclosure includes a carrier board 210 and a main board 220, and the main board 220 is provided below the main body portion 281 of the heat transfer plate 280 (i.e., below the data processing module). The data processing device may further include a base 290. The base 290 is provided below the main board 220 and is in contact with the main body portion 281. Accordingly, as shown in FIG. 21, according to the heat dissipation path shown by the arrow in FIG. 21, a part of the heat generated by the power module 250 can be transferred upward through the main body portion 281, the extension portion, a first heat sink 241 and the like, and other part of the heat can be transferred downward (e.g., transferred to a housing 270) through the main body portion 281, the base 290, and the like for diffusion. The heat generated by the power module 250 can be transferred and diffused through the above mentioned heat dissipation paths, and the heat dissipation capability can be further improved.

As shown in FIG. 20, in the seventh embodiment, the system main board 220 may be provided with a third through hole 222, and an upper surface of the base 290 is provided with a protrusion 291, and the protrusion 291 can pass through the third through hole 222 to be in contact with the main body portion 281. Further, the number of the third through hole 222 and the protrusion 291 may be multiple, that is, a plurality of protrusions 291 respectively pass through the plurality of third through holes 222 to contact the main body portion 281.

In the seventh embodiment, a thermal interface material can be provided between the upper surface of the base 290 (i.e., the protrusion 291) and the lower surface of the main body portion 281 of the heat transfer plate 280, so that thermal conductivity between the base 290 and the heat transfer plate 280 can be improved.

In the seventh embodiment, the base 290 may be provided with radiating fins. Radiating fins are provided on the lower surface of the base 290 to dissipate heat.

The data processing device provided by the present disclosure may further include a housing 270. The housing 270 can be provided below the base 290 and in contact with the lower surface of the base 290.

In the seventh embodiment, the base 290 may include at least one of heat transfer structures such as a heat pipe 2414, a copper plate, and a vapor chamber.

Figure 22:
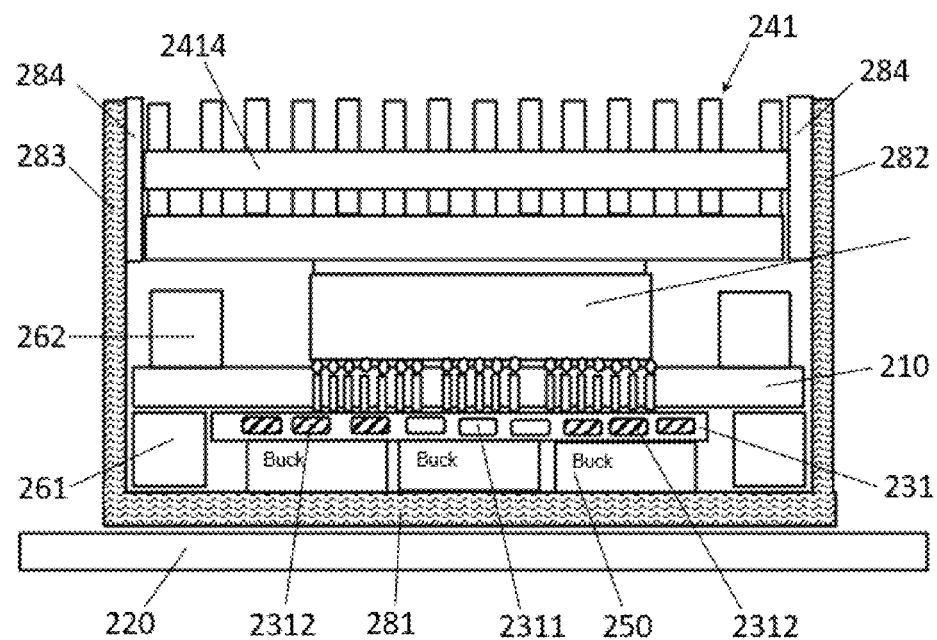
FIG. 22 is a schematic structural diagram of a data processing device according to an eighth embodiment of the present disclosure.

Refer to FIG. 22, which exemplarily shows a schematic structural diagram of a data processing device in the eighth embodiment of the present disclosure. In the above embodiments, the design of the data processing device provided by the present disclosure is substantially the same as that of the first to seventh embodiments. Differences of the design of the data processing device in the eighth embodiment from the other embodiments will be described below with reference to the drawing. The same or similar design as in the other embodiments will not be repeated here.

As shown in FIG. 22, in the eighth embodiment, the data processing device provided by the present disclosure may further include a capacitor board 231. The capacitor board 231 is provided between the carrier board 210 and the power module 250. A capacitor is provided in the capacitor board 231, the capacitor is electrically connected to the power module 250 and is also electrically connected to the data processor 230 through the carrier board 210. Accordingly, the power module 250 can supply power to the data processor 230 via the capacitor board 231. The above design can facilitate arrangement of an output loop capacitor in a vertical power supply system, simplify the current transmission path and the wiring design of the carrier board 210, and reduce parasitic inductance of the capacitor loop of the input loop of the data processor 230, thereby improving power supply efficiency, dynamic performance and voltage accuracy.

As shown in FIG. 22, in the eighth embodiment, the capacitor provided in the capacitor plate 231 may include a first capacitor 2311 and a second capacitor 2312. The first capacitor 2311 may be an I/O decoupling capacitor of the data processor 230, and the second capacitor 2312 may be an input loop capacitor through which the power module 250 supplying power to the data processor 230. Specifically, the first capacitor 2311 is connected to a signal line of the data processor 230 or a line connected to a memory corresponding to a signal processor. The second capacitor 2312 is electrically connected to an output terminal of the power module 250. The position of the first capacitor 2311 can be relatively fixed and the power module 250 cannot directly occupy the area of the carrier board 210 occupied by the first capacitor 2311. By using a capacitor board 231 in which the first capacitor 2311 is integrated and embedded, the power module 250 and the first capacitor 2311 can be stacked in perpendicular to the surface of the carrier board 210, which can increase area where the power module 250 can be arranged when the arrangement of the first capacitor 2311 is limited, thereby realizing more arrangements of the power module 250, and increasing the total power of the nearby power modules 250.

Figure 23:
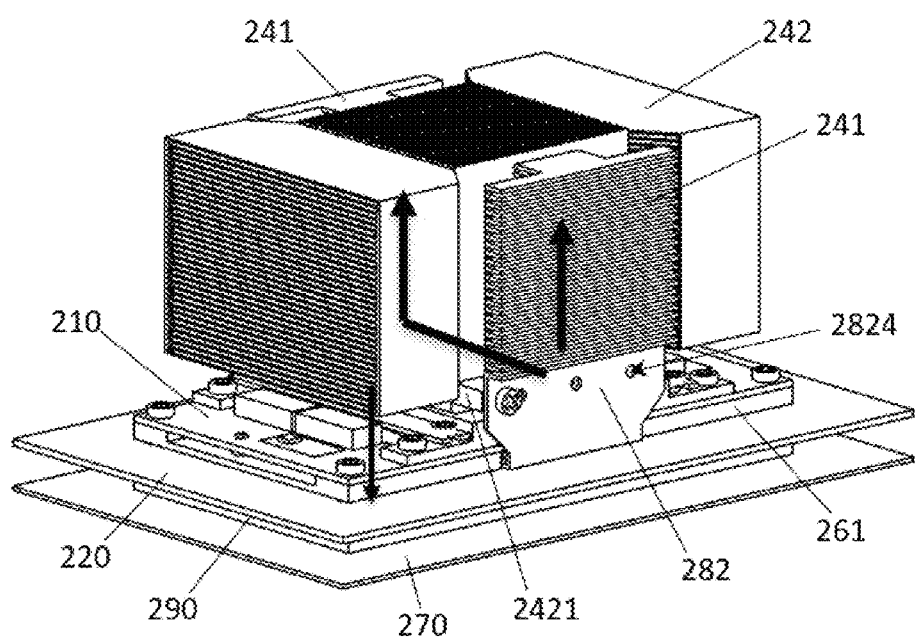
FIG. 23 is a perspective view of a data processing device according to a ninth embodiment of the present disclosure.

Refer to FIG. 23, which exemplarily shows a schematic structural diagram of a data processing device provided by the present disclosure in the ninth embodiment. In the ninth embodiment, the design of the data processing device provided by the present disclosure is substantially the same as that in the first to eighth embodiments. FIG. 24 exemplarily shows a perspective view of the data processing device in the ninth embodiment, and specifically shows a state when structures are separated from each other. Differences of the design of the data processing device in the ninth embodiment from the other embodiments will be described below with reference to the drawing. The same or similar design as in the other embodiments will not be repeated here.

As shown in FIG. 23 and FIG. 24, in the ninth embodiment, the data processing device provided by the present disclosure using a combination of designs in the first to eighth embodiments. The data processing device includes the carrier board 210, the power module 250, the data processor 230, the heat transfer plate 280, the first heat sink 241, the second heat sink 242, the first reinforcement board 261, the system main board 220, the base 290 and the housing 270. Specifically, the heat transfer plate 280 includes the main body portion 281, the first extension portion 282 and the second extension portion 283. The first heat sink 241 is arranged at two extension portions, and the second heat sink 242 is provided above the data processor 230. The lower surface of the first reinforcement board 261 is provided with the first recess 2613, the main body portion 281 of the heat transfer plate 280 is provided in the first recess 2613, and the lower surface of the main body portion 281 is flush with the lower surface of the first reinforcement board 261. The first connector is on the lower surface of the carrier board 210, and the second connector 221 is on the upper surface of the system main board 220. The first connector is connected to the second connector 221. The system main board 220 is provided with the third through hole 222, the upper surface of the base 290 is provided with the protrusion 291, and the base 290 can contact the main body portion 281 of the heat transfer plate 280 by the protrusion 291 passing through the third through hole 222. According to the heat dissipation path shown by the arrow in FIG. 23, part of the heat generated by the power module 250 can be transferred upward via the main body portion 281, the extension portion, the first heat sink 241 and the second heat sink 242, and the other part of the heat can be transferred downward to the housing 270 via the main body portion 281 and the base 290. It should be noted that, although the above designs are respectively described in different embodiments of the present disclosure, in other embodiments according to the present disclosure, these designs can be combined to form a new solution.

As shown in FIGS. 23 and 24, in the ninth embodiment, the second heat sink 242 can be provided above the data processor 230 through a mounting seat 2421. The extension portion of the heat transfer plate 280 can be connected to a side of the mounting seat 2421 to achieve a connection of the heat transfer plate 280 and the second heat sink 242. For example, a second mounting hole 2824 may be provided on the extension portion, a second threaded hole 2422 may be provided on the side of the mounting seat 2421 of the second heat sink 242, and position of the second threaded hole 2422 corresponds to that of the second mounting hole 2824, the extension portion can be fixed to the side of the mounting seat 2421 of the second heat sink 242 by fasteners, and through the mounting seat 2421 of the second heat sink 242, the heat can be transferred to the second heat sink 242 by the heat transfer plate 280 for dissipation.

Figure 25:
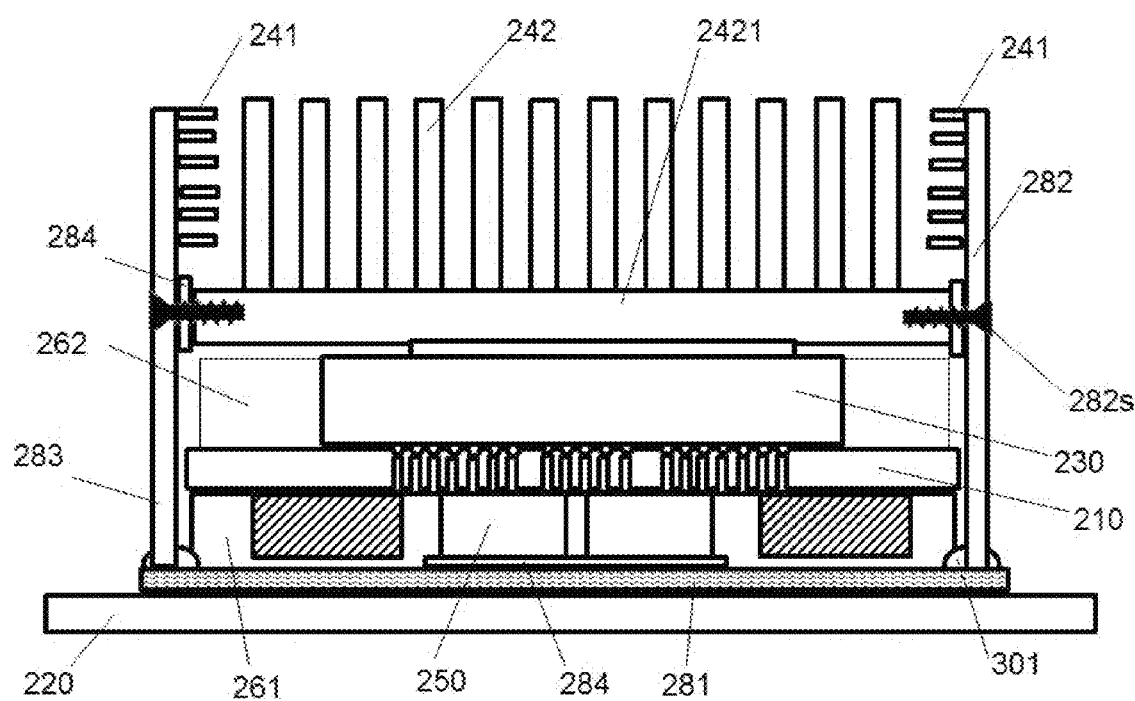
FIG. 25 is a schematic structural diagram of a data processing device according to a tenth embodiment of the present disclosure.
Figure 27:
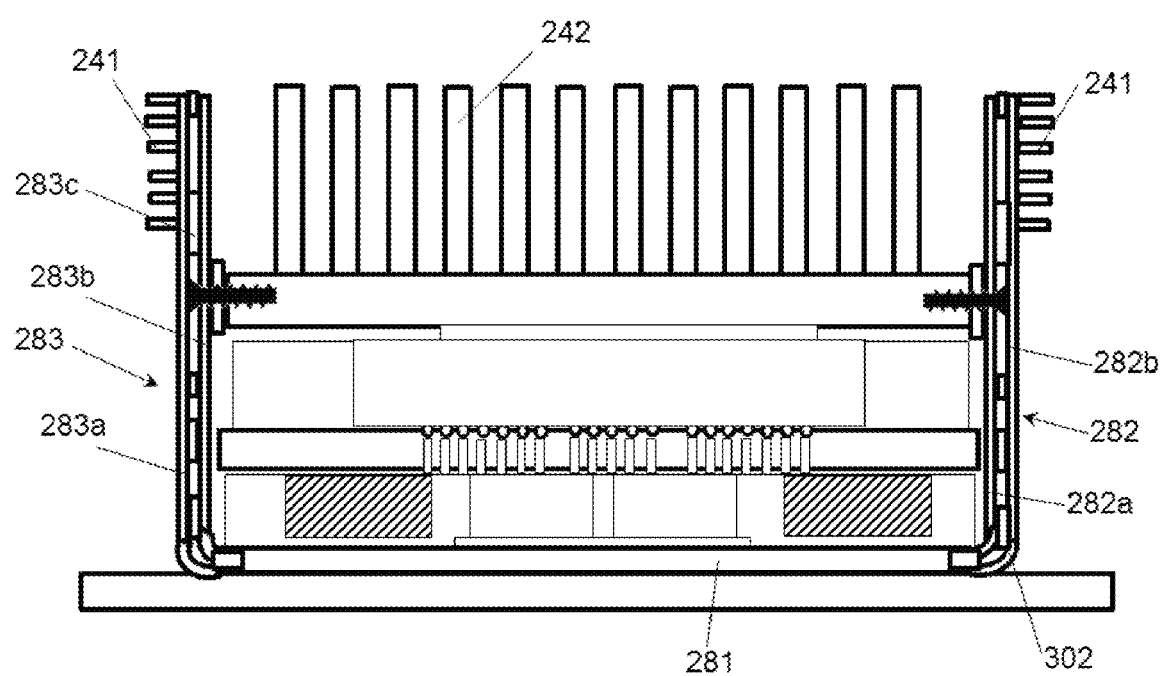
FIG. 27 is another schematic structural diagram of a data processing device according to the tenth embodiment of the present disclosure.
Figure 28:
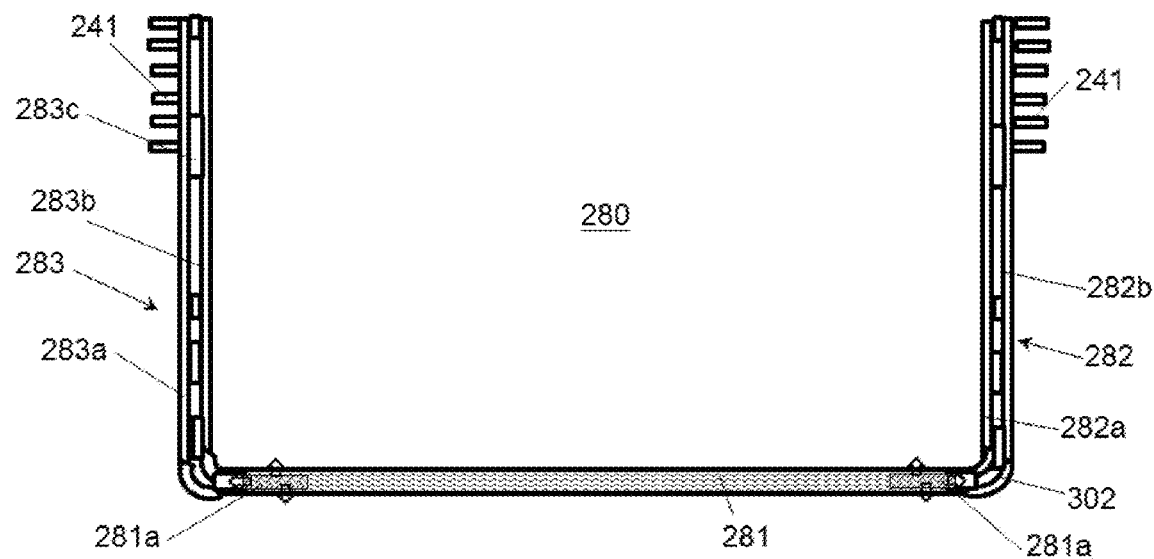
FIG. 28 is a schematic structural diagram of a heat transfer plate shown in FIG. 27.
Figure 29:
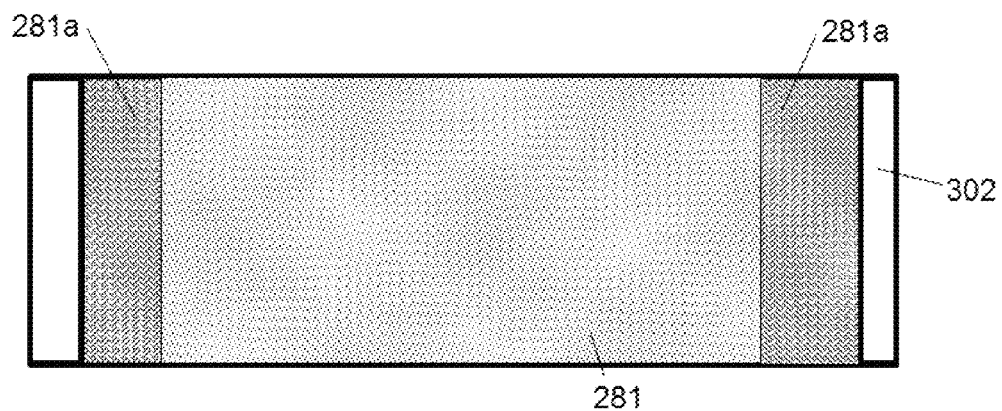
FIG. 29 is a top view of FIG. 28.
Figure 30:
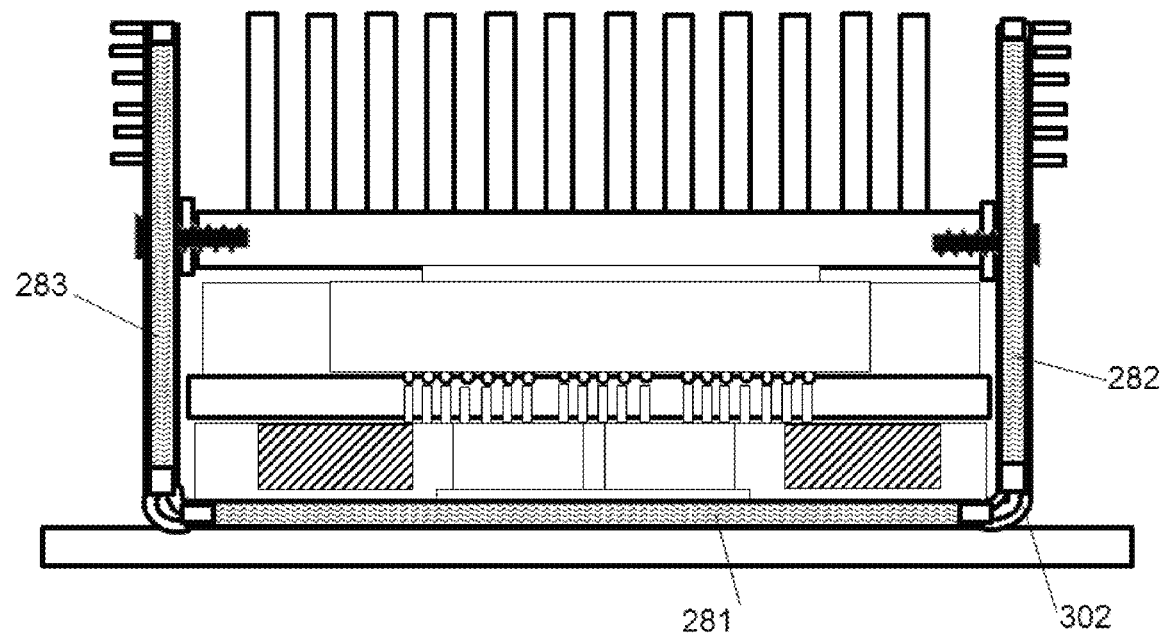
FIG. 30 is another schematic structural diagram of a data processing device according to the tenth embodiment of the present disclosure.
Figure 31:
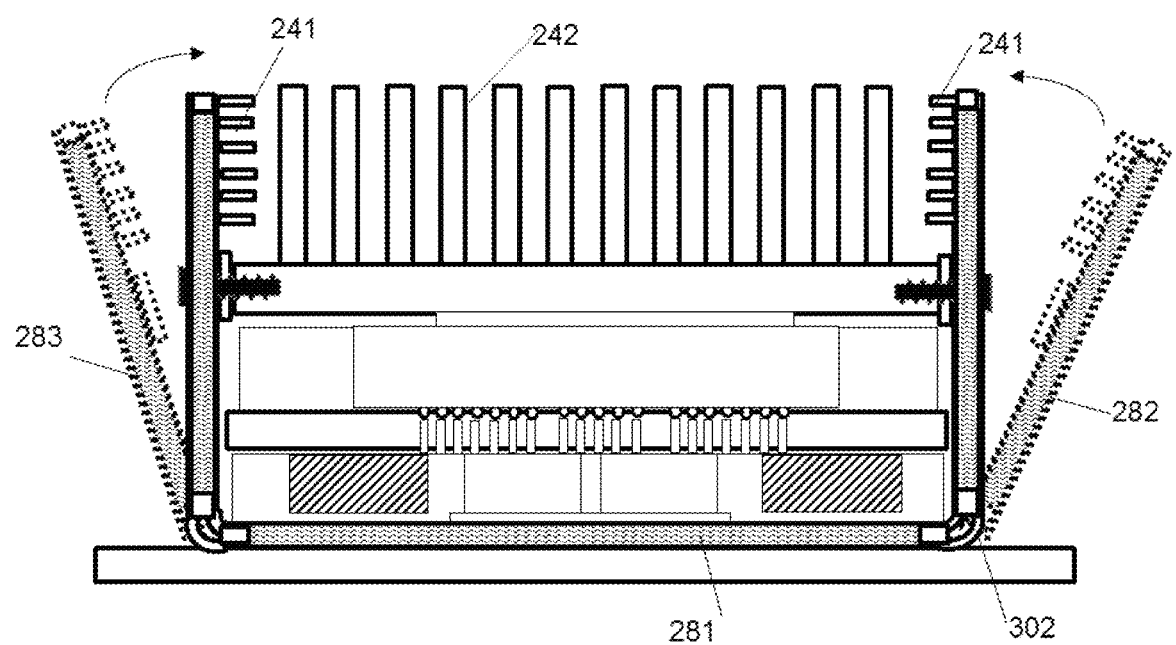
FIG. 31 is an assembly schematic diagram of part of structures in FIG. 30.

Refer to FIG. 25, which exemplarily shows a schematic structural diagram of a data processing device in the tenth embodiment of the present disclosure. In the tenth embodiment, the design of the data processing device provided by the present disclosure is substantially the same as that in the first to ninth embodiments. With reference to FIGS. 26 to 31, FIG. 26 exemplarily shows an assembly schematic diagram of part of structures of the data processing device shown in FIG. 25; FIG. 27 exemplarily shows another schematic structural diagram of the data processing device in the tenth embodiment; FIG. 28 exemplarily shows a schematic diagram of the structure of the heat transfer plate 280 in FIG. 27; FIG. 29 exemplarily shows a top view of the heat transfer plate 280 in FIG. 27; FIG. 30 exemplarily shows another schematic structural diagram of the data processing device in the tenth embodiment; FIG. 31 exemplarily shows an assembly schematic diagram of part of structures of the data processing device shown in FIG. 30. Differences of the design of the data processing device in the tenth embodiment from the other embodiments will be described below with reference to the drawings. The same or similar design as in the other embodiments will not be repeated here.

As shown in FIG. 25, in the tenth embodiment, the main body portion 281 uses a vapor chamber, and the first extension portion 282 and the second extension portion 283 are respectively welded to the main body portion 281 by solder joints 301. The first extension portion and the second extension portion can be more flexibly connected to the main body portion, and the resulting structure can be compact. For example, the first extension portion 282 and the second extension portion 283 can be respectively made of a copper plate or the vapor chamber; the first extension portion 282 and the second extension 283 can be respectively fixed to the left and right sides of the second heat sink 242 with screws 282s, and the heat can be transferred to the second heat sink 242 through the thermal interface material layer 284 for dissipation. In addition, the first heat sink 241 may be provided on the first extension portion 282 and the second extension portion 283 to enhance the heat dissipation capability.

Figure 26:
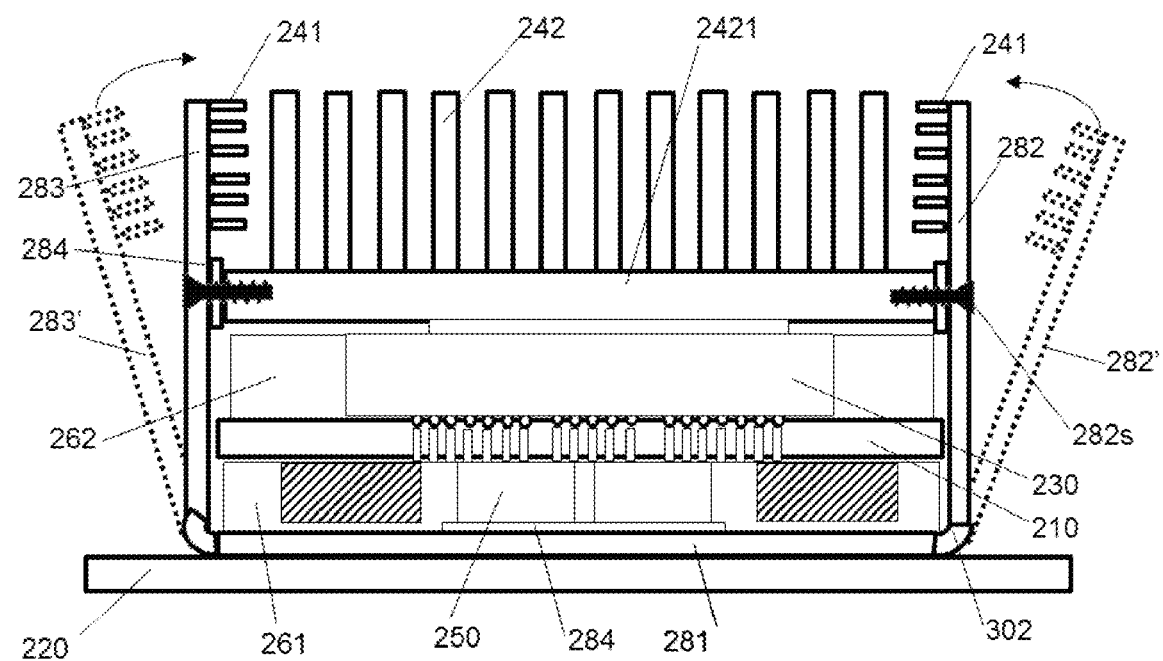
FIG. 26 is an assembly schematic diagram of part of structures in FIG. 25.

As shown in FIG. 26, in the tenth embodiment, the first extension portion 282 and the second extension portion 283 are respectively made of copper plates, and are respectively connected to the main body portion by the bending portion 302. The bending portion 302 has an elastic structure. The state and position of the first extension portion 282' and the second extension portion 283' when they are not installed are indicated by the dashed line as in FIG. 26. By fastening the first extension portion 282' and the second extension portion 283' to the second heat sink 242 via screws, the radiating fins of the first heat sink 241 can be provided to face inside, thereby not affecting the installation, and sizes of left and right sides of the data processor 230 (e.g., a smart accelerator card) can be reduced.

As shown in FIG. 27, in the tenth embodiment, the copper sheets of the first extension portion 282 and the second extension portion 283 are integrated with the copper plates on the upper or lower surface of the main body portion 281 formed by the vapor chamber. For example, the first extension portion 282 includes a copper sheet 282a and a copper sheet 282b, so that the resulting structure can be more concise and the cost is lower. Similarly, the second extension portion 283 includes a copper sheet 283a and a copper sheet 283b, and a copper sheet 283c can be provided between the copper sheets 283a and 283b to control a distance therebetween, which can form air ducts and strengthen heat dissipation.

As shown in FIGS. 28 and 29, in the tenth embodiment, on the basis of the structure of the heat transfer plate shown in FIG. 27, porous structures 281a may be provided at positions on both ends of the main body portion 281 where the first extension portion 282 and the second extension portion 283 are respectively connected, thereby increasing the surface area of the above positions. In other embodiments, other structures that can increase the surface area can also be used.

As shown in FIG. 30, in the tenth embodiment, on the basis of the structure shown in FIG. 27, both the first extension portion 282 and the second extension portion 283 are made of vapor chambers, and the first extension portion 282 and the second extension portion 283 are respectively connected to the main body portion 281 through the bending portion 302, so as to further improve the heat dissipation performance. In other embodiments, the first extension portion 282 and the second extension 283 may also be made of heat pipes.

As shown in FIG. 31, in the tenth embodiment, on the basis of FIG. 30, the bending portion 302 can be an elastic structure, so that the heat sink 241 can be provided at inner sides of the first extension portion 282 and the second extension portion 283 (i.e., between the first extension portion 282 and the second extension portion 283), thereby reducing volume of the data processor 230, and not affecting installation of the heat transfer plate 280.

Figure 32:
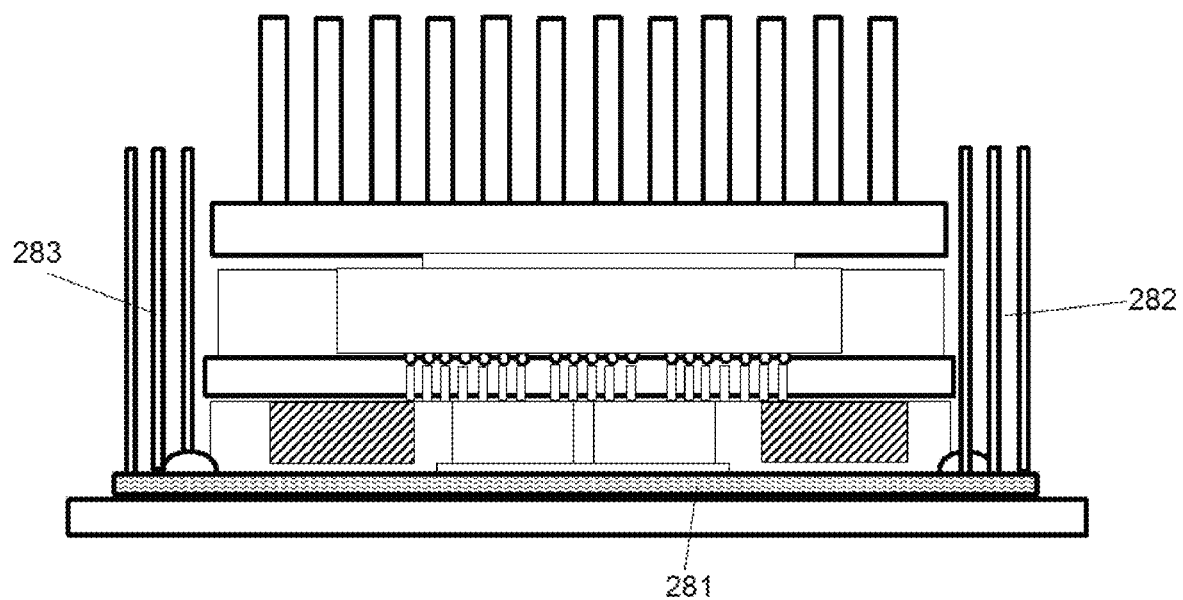
FIG. 32 is a schematic structural diagram of a data processing device according to an eleventh embodiment of the present disclosure.
Figure 33:
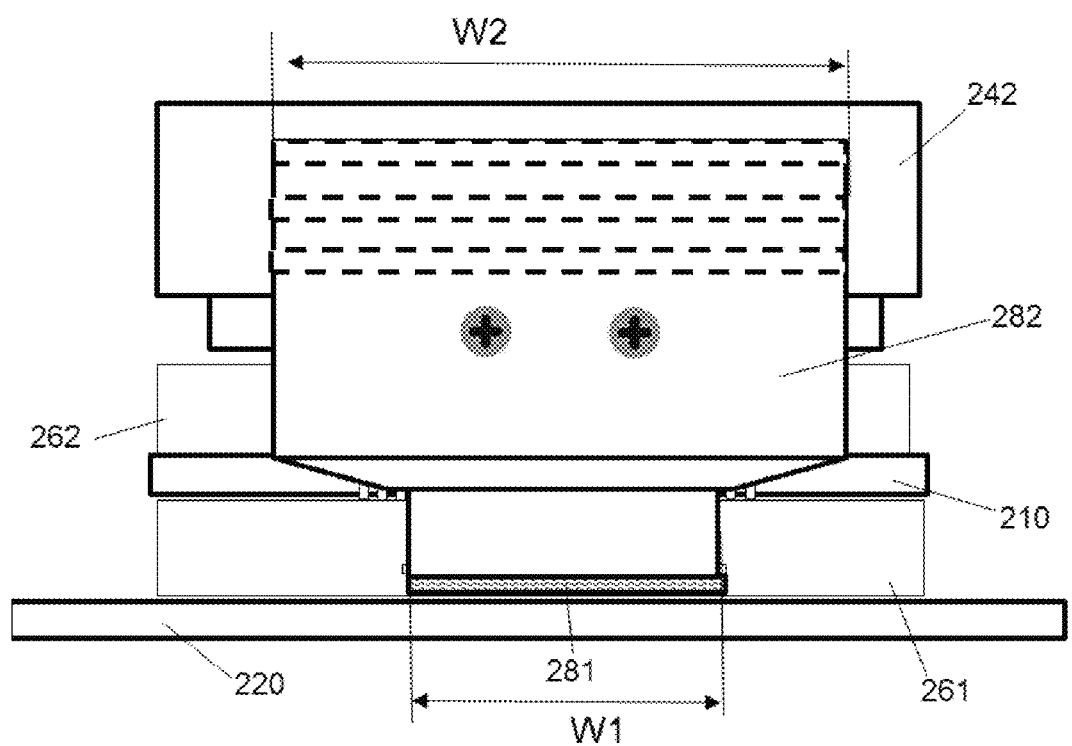
FIG. 33 is a side view of FIG. 32.

Refer to FIG. 32, which exemplarily shows a schematic structural diagram of a data processing device in the eleventh embodiment of the present disclosure. In the eleventh embodiment, the design of the data processing device provided by the present disclosure is substantially the same as that in the first to tenth embodiments. With reference to FIG. 33, FIG. 33 exemplarily shows a side view of the data processing device shown in FIG. 32. Differences of the design of the data processing device in the eleventh embodiment from the other embodiments will be described below with reference to the drawings. The same or similar design as in the other embodiments will not be repeated here.

As shown in FIGS. 32 and 33, in the eleventh embodiment, a plurality of first extension portions 282 and a plurality of second extension portions 283 may be provided on the main body portion 281. The plurality of first extension portions 282 are provided at intervals, and the plurality of second extension portions 283 are provided at intervals, and the plurality of first extension portions 282 and the plurality of second extension portions 283 are respectively thermally connected to the main body portion 281, which has a simple structure. Width W2 of the first extension portion 282 and the second extension portion 283 in the side direction may be greater than the width W1 of the main body portion 281 in the side direction, so that the heat dissipation performance can be improved.

Figure 34:
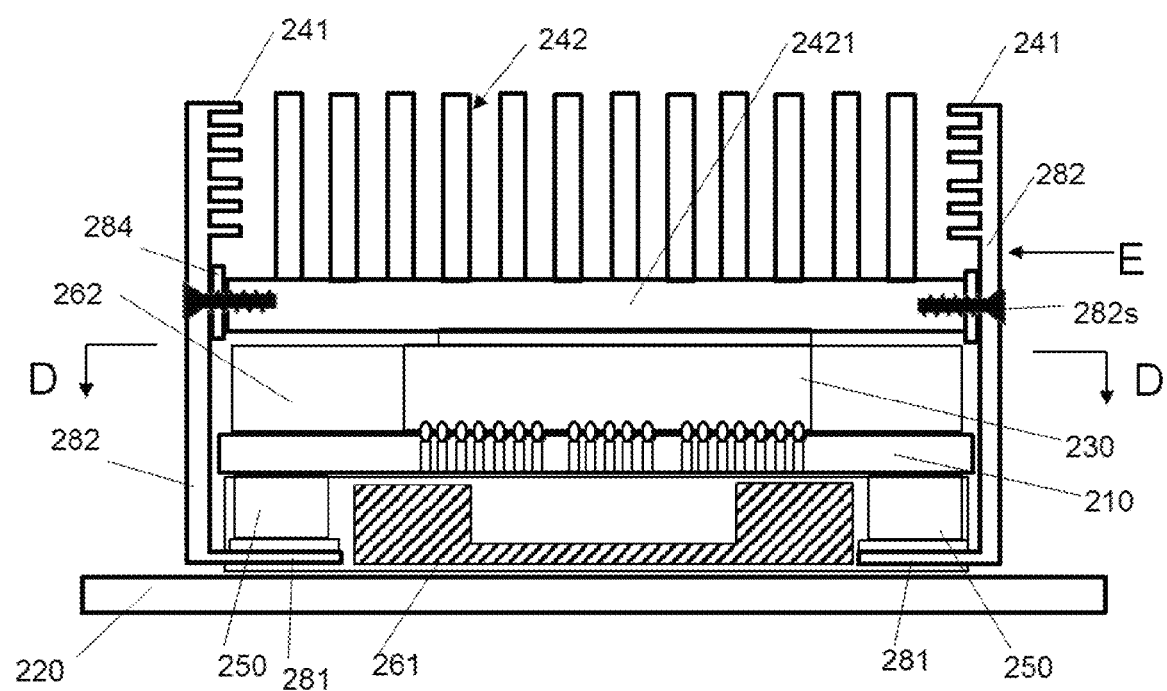
FIG. 34 is a schematic structural diagram of a data processing device according to a twelfth embodiment of the present disclosure.
Figure 35:
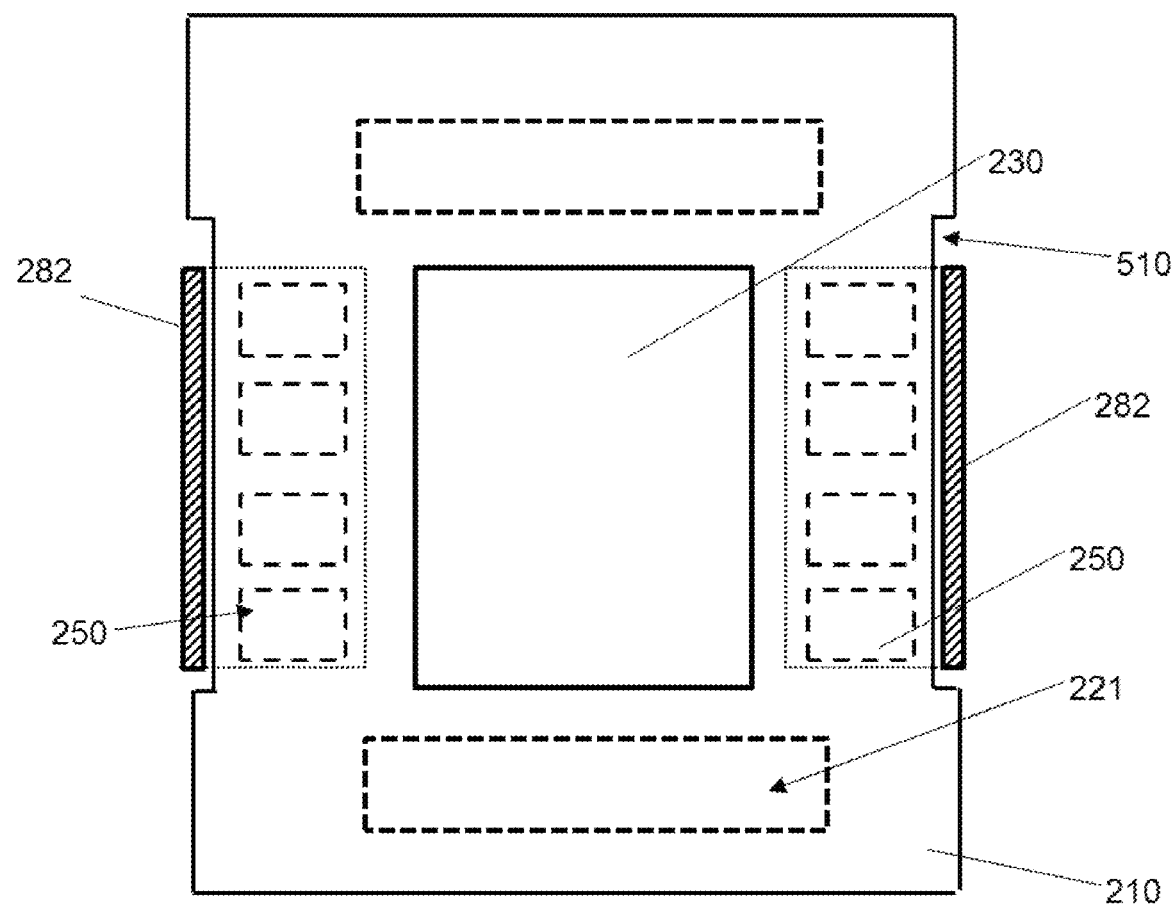
FIG. 35 is a cross-sectional view taken along line D-D of FIG. 34.
Figure 36:
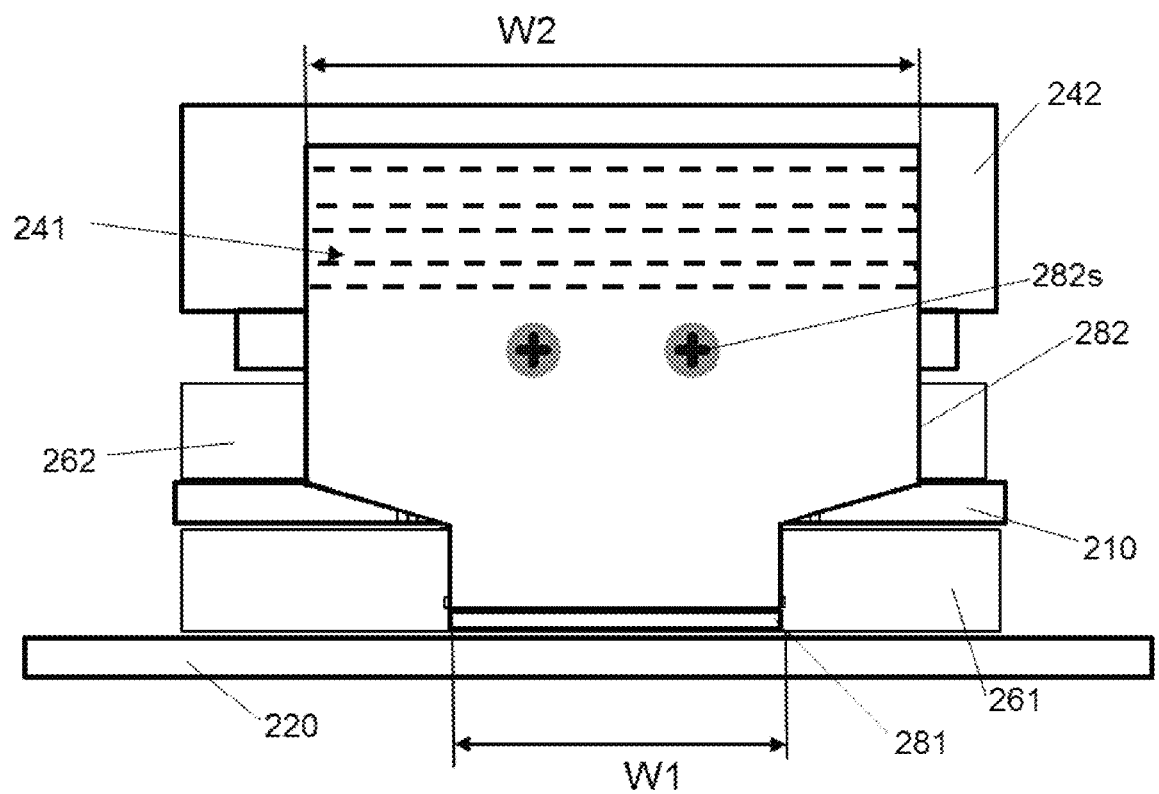
FIG. 36 is a side view of FIG. 34 along the E direction.

Refer to FIG. 34, which exemplarily shows a schematic structural diagram of a data processing device in the twelfth embodiment of the present disclosure. In the twelfth embodiment, the design of the data processing device provided by the present disclosure is substantially the same as that in the first to eleventh embodiments. With reference to FIGS. 35 and 36, FIG. 35 exemplarily shows a cross-sectional view taken along the line D-D of FIG. 34; FIG. 36 exemplarily shows a side view of FIG. 34 along the E direction. Differences of the design of the data processing device in the twelfth embodiments from the other embodiments will be described below with reference to the drawings. The same or similar design as in the other embodiments will not be repeated here.

As shown in FIGS. 34 to 36, in the twelfth embodiment, the heat transfer plate 280 of the data processing device provided by the present disclosure can use a design of thermal diffusion plate structure based on an OAM-based smart accelerator card (i.e., smart accelerator module OAM defined according to the OCP industry standard). Specifically, the power module 250 and the data processor 230 can be provided on two opposite sides of the carrier board 210. In some embodiments, the orthographic projection of the power module 250 on the upper surface of the carrier board 210 may be located at both sides of the orthographic projection of the data processor 230 on the upper surface of the carrier 210. That is, the power module 250 can be arranged in two groups. The orthographic projection of the power module 250 may overlap (e.g., completely overlap or partially overlap) or may not overlap with the orthographic projection of the data processor 230. For example, as shown in FIG. 35, in the cross-sectional view, the orthographic projection of the power module 250 is located at the left and right sides of the data processor 230, and the orthographic projection of the second connector 221 on the upper surface of the carrier board 210 is located at lower and upper sides of the data processor 230. Based on the above design and the arrangement, the power module 250 can be easier to supply power to the data processor 230, and the power module 250 can be close to an edge of the carrier board 210. In other embodiments, according to different structures, the orthographic projection of the power module 250 can be located at one side or on more than two sides of the data processor 230, and the number and arrangement of the heat transfer plates 280 can be adjusted accordingly, which is not limited to the embodiments.

As shown in FIGS. 34 to 36, in the twelfth embodiment, the main body portion 281 of the heat transfer plate 280 is provided on a bottom surface of the power module 250 (i.e., a surface away from the carrier board 210), and the first extension portion 282 at can extend upward until above the carrier board 210 along the outer side of the carrier board 210. On this basis, the first heat sink 241 can be provided on the first extension portion 282 and the first heat sink 241 may be provided on the relatively inner side of the first extension portion 282 (i.e., the side facing the data processor 230). For example, radiating fins can be provided on the relatively inner side of the first extension portion 282. Based on the above design, it can be beneficial to reduce the overall size of the OAM data processor.

Further, as shown in FIG. 35, both sides of the carrier board 210 (e.g., the left and right sides of the carrier board 210 respectively corresponding to the two first extension portions 282 in the FIG. 35) may be provided with side grooves 510, the first extension portions 282 at both sides can respectively pass through the two side grooves 510 and extend upward from the bottom of the carrier board 210. Based on the above design, the heat transfer plate 280 can be provided without increasing the overall size of the OAM data processor.

Further, as shown in FIGS. 34 to 36, in the twelfth embodiment, the left and right sides of the carrier board 210 may be provided with heat transfer plates 280 respectively, and the two heat transfer plates 280 are not necessarily connected to each other to form an integral structure. That is, as shown in FIG. 34, the two main body portions 281 under the battery module are not connected to form an integral structure. That is, the heat transfer plates 280 on both sides each has a substantially "L"-shaped structure. Based on the above design, the main body portion 281 of the twelfth embodiment has a shorter size than other embodiments, which has more advantages for the power module 250 to transfer heat to the first heat sink 241, and the volume of the heat transfer plate 280 can be greatly reduced, thereby easily manufacturing, packaging and transporting the heat transfer plate 280, which can reduce costs and the possible deformation of the heat transfer plate 280, and improve application reliability. In addition, since the left and right sides of the "L"-shaped heat transfer plates 280 are not integrated, the first heat sink 241 can be provided at an inner side of the first extension portion 282 (i.e., the side close to the smart processor 230). That is, it can be realized that the radiating fins are provided on the inner side of the first extension portion 282, so that the radiating fins cannot extend outside of the footprint of the smart accelerator card, and the heat transfer plate 280 can be easily installed on the OAM smart accelerator card without changing the footprint of the smart accelerator card. For example, the heat transfer plate 280 at the right side in FIG. 34 can be installed in a direction from right to left. Similarly, the heat transfer plate 280 on the left can be installed from the left to the right. Based on the above, the overall size of the data processor 230 can be greatly reduced, or at least, the overall size of the data processor 230 will not be increased.

It should be noted that, in order to facilitate understanding and observation, the second reinforcement board 262 and the main board 220 are omitted in FIG. 35, and the devices represented by the dashed lines in FIG. 35 are arranged on the bottom of the carrier board 210. In addition, as shown in FIG. 34, it is not necessary to provide the first recess 2613 on the first reinforcement board 261, or to provide the first through hole 2611, and the structure of the first reinforcement board 261 can be kept unchanging, which can facilitate the installation of the heat transfer plate 280 on the smart accelerator card in the form of OAM package, thereby simplifying the structure, reducing the cost and improving the structure.

Further, as shown in FIG. 36, in the twelfth embodiment, the first heat sink 241 indicated by a dashed line can be provided on the inner side (i.e., inward side in FIG. 36) of the first extension portion 282. When the second heat sink 242 is provided to dissipate heat for the data processor 230, the first extension portion 282 may be connected to the second heat sink 242 to dissipate heat. On this basis, the first extension portion 282 and the second heat sink 242 may be connected by the screw 282s, or the first extension portion 282 and the second reinforcement board 262 may be connected by the screw 282s. Based on the above design, the stability of the installation of the heat transfer plate 280 on the data processor 230 can be further improved, and a heat conducting connection between the heat transfer plate 280 and the second reinforcement board 262 can be realized.

Figure 37:
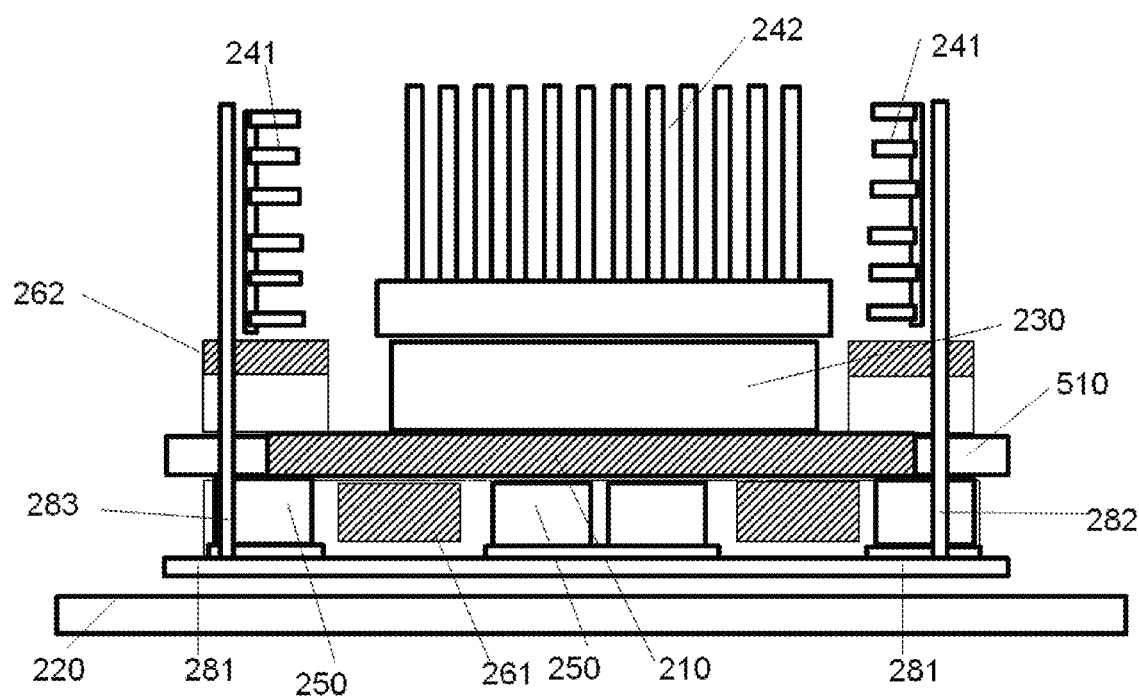
FIG. 37 is a schematic structural diagram of a data processing device according to an embodiment of the present disclosure.

FIG. 37 is a schematic structural diagram of a data processing device according to an embodiment of the present disclosure. FIG. 37 shows that the heat transfer plate is a U-shaped structure formed by the main body portion 281, the first extension portion 282, and the second extension 283 which are integrally connected to each other. It can be assembled from the bottom of the data processing device, so that the main body portion 281 can contact the power module 250 to transfer heat. The sheet-like first extension portion 282 and second extension 283 can be provided in the side grooves 510 on the left and right sides of the carrier 210, and the first extension portion 282 and the second extension 283 extend above the carrier 210. The first extension portion 282 and the second extension portion 283 can be provided with the heat sink 241, respectively. In some embodiments, the heat sink 241 can be provided on the inner side of the first extension portion 282 and the second extension portion 283, thereby not increasing the footprint of the data processing device. Thermally conductive silicone grease can be provided between the heat sink 241 and the inner sides of the first extension portion 282 and the second extension 283 to improve the thermal conductivity.

In summary, when the data processing device provided in the present disclosure adopts the design in the above twelfth embodiment, at least the following effects can be achieved. First, for example, the first heat sink 241 with the radiating fin is arranged inward (i.e., facing the data processor 230), which is easy to install, and can greatly reduce the size of the data processor 230. Second, the size of the heat transfer plate 280 can be significantly reduced, the structure can be simplified, thereby reducing costs, simplifying package and transportation, and improving reliability. Third, the first reinforcement board 261 can accommodate the heat transfer plate without the first recess, which greatly improves the convenience for application.

Figure 38:
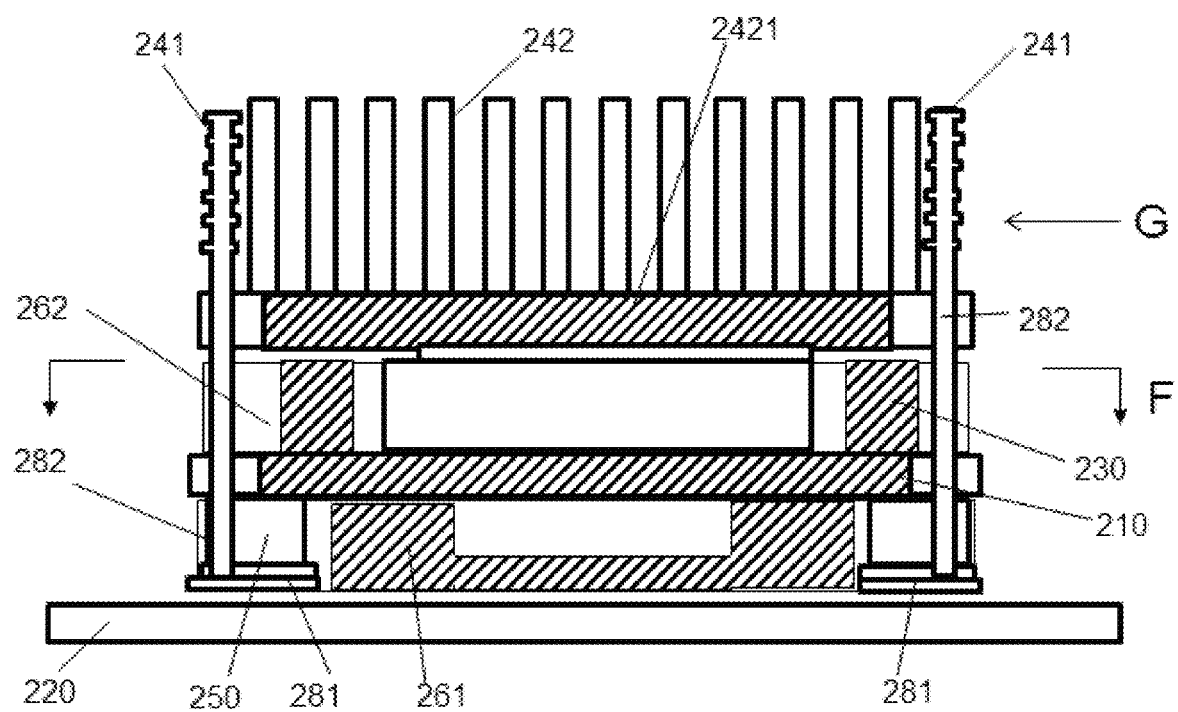
FIG. 38 is a schematic structural diagram of a data processing device according to a thirteenth embodiment of the present disclosure.
Figure 39:
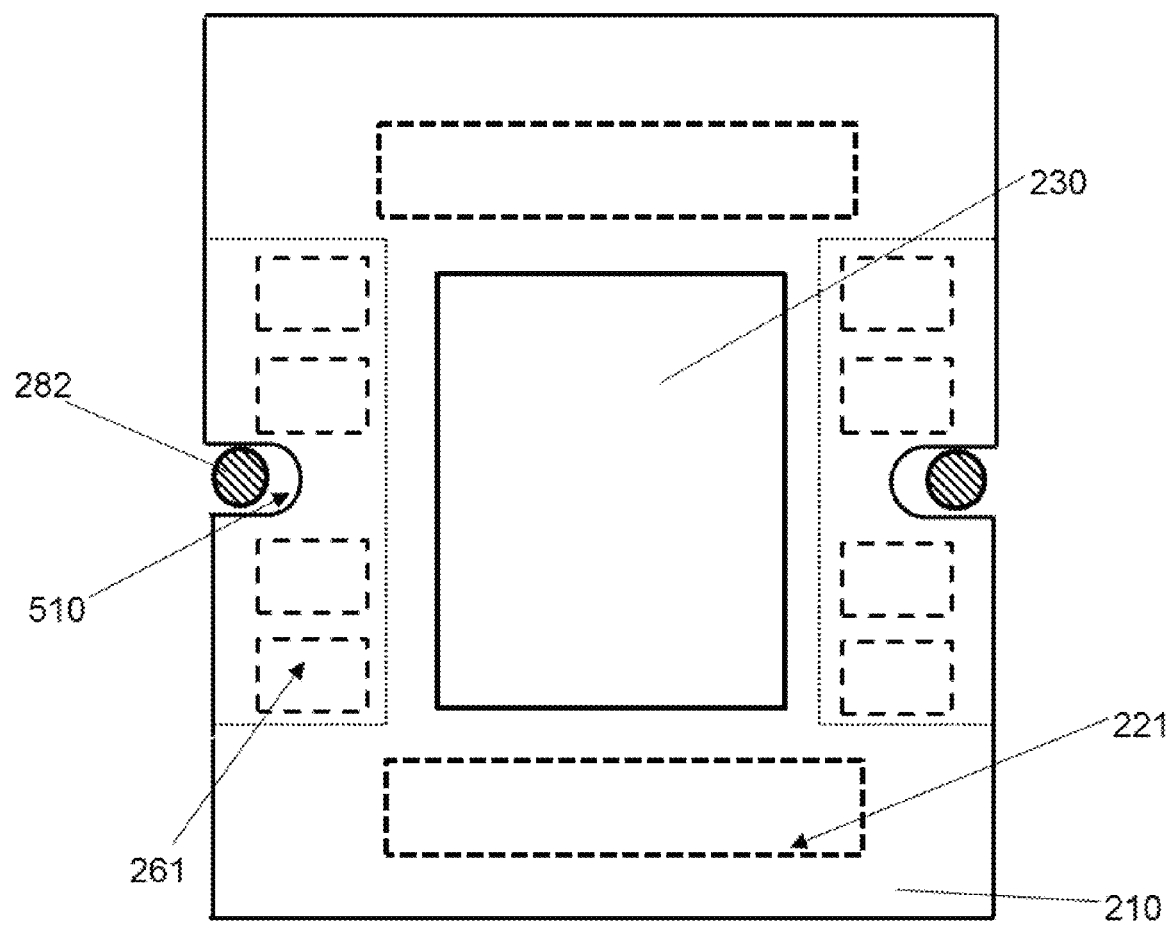
FIG. 39 is a cross-sectional view taken along line F-F of FIG. 38.
Figure 40:
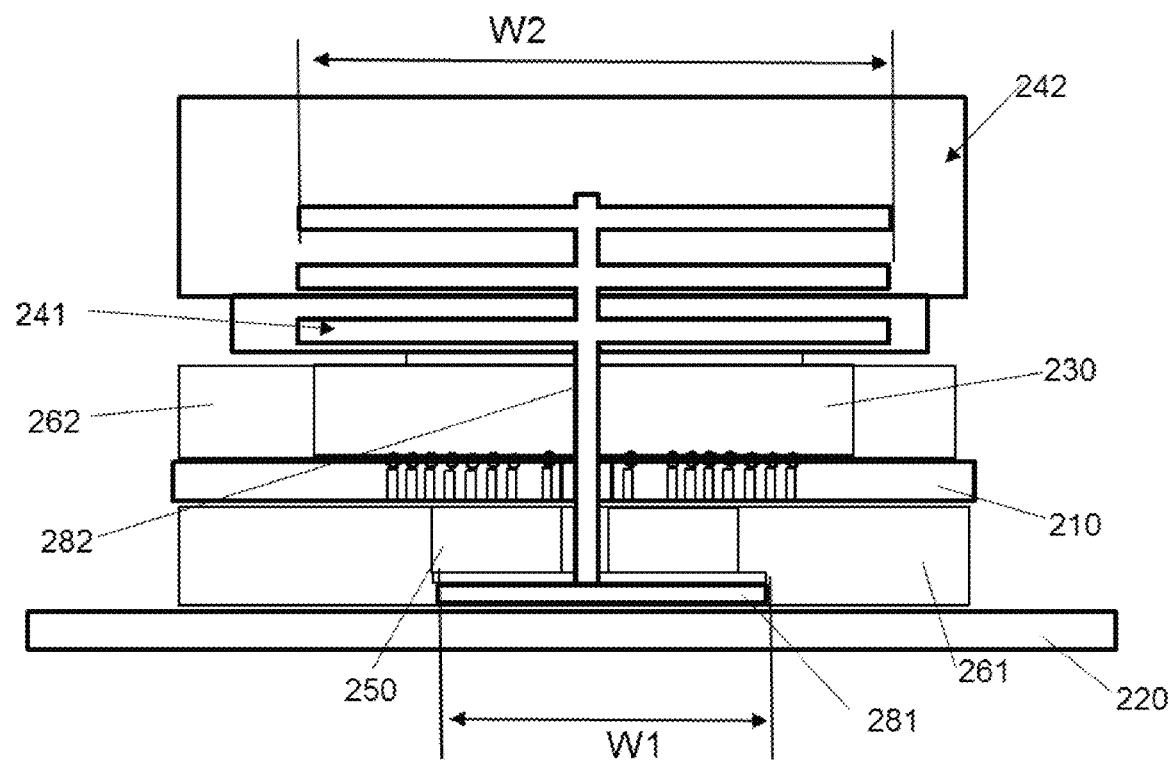
FIG. 40 is a side view of FIG. 38 along the G direction.
Figure 41:
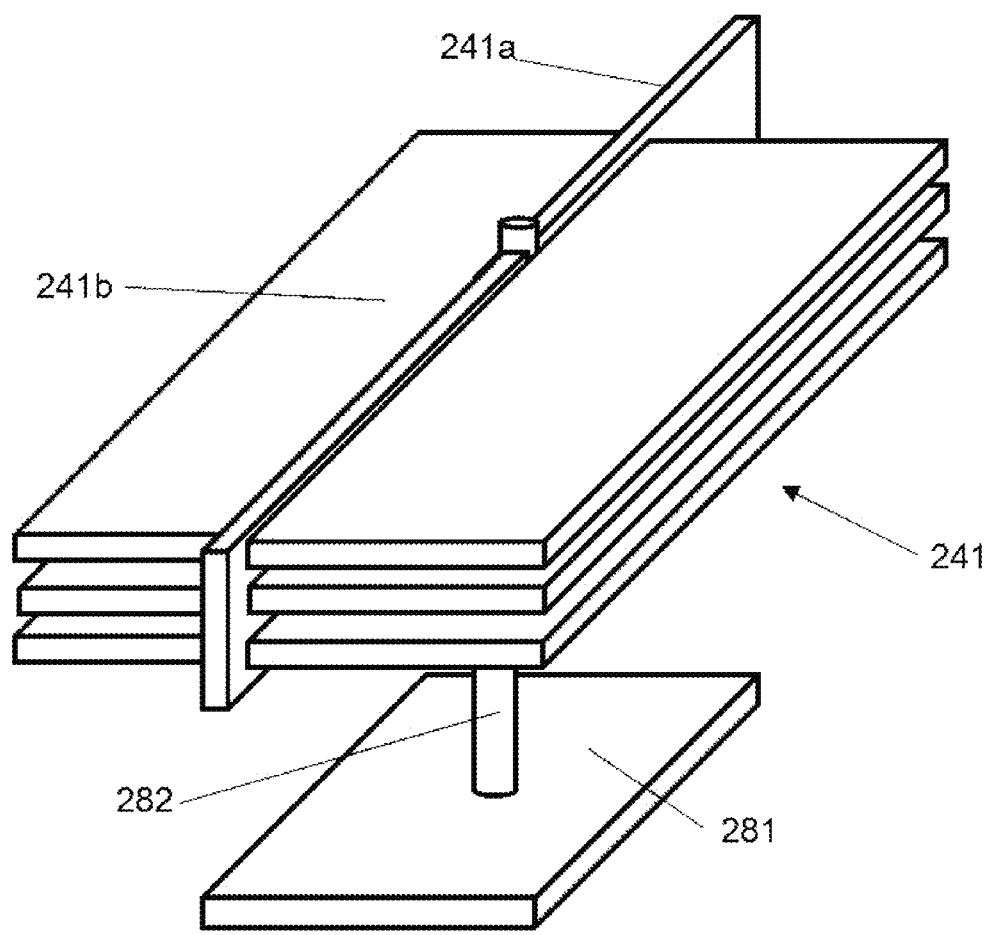
FIG. 41 is a perspective view of a heat transfer plate and a first heat sink of the data processing device shown in FIG. 40.

Refer to FIG. 38, which exemplarily shows a structural diagram of a data processing device in the thirteenth embodiment of the present disclosure. In the thirteenth embodiment, the design of the data processing device provided by the present disclosure is substantially the same as that in the first to twelfth embodiments. With reference to FIGS. 39 to 41, FIG. 39 exemplarily shows a cross-sectional view taken along line F-F of FIG. 38; FIG. 40 exemplarily shows a side view of FIG. 38 along the G direction; FIG. 41 exemplarily shows a perspective view of the heat transfer plate and the first heat sink of the data processing device. Differences of the design of the data processing device in the thirteenth embodiments from the other embodiments will be described below with reference to the drawings. The same or similar design as in the other embodiments will not be repeated here.

As shown in FIGS. 38 and 39, in the thirteenth embodiment, preferably, the first extension portion 282 may use a heat pipe structure. The position of the carrier 210 corresponding to the first extension portion 282 may be provided with a side groove 510, and the side groove 510 may have a smaller size than the side groove 510 in the twelfth embodiment (which the sheet-like first extension portion 282 can pass through) to allow only the heat pipe to pass through. On this basis, the bottom of the first extension portion 282 using the heat pipe structure can be connected to the main body portion 281 and the upper portion of the first extension portion 282 can be connected to the first heat sink 241. Since in the thirteenth embodiment as shown in the figure, the heat transfer plates 280 at the left and right sides are not connected to form an integral structure, the heat transfer plates 280 on the left and right sides can be respectively installed at the left and right sides and it is easy to install. In this way, the data processor 230 can be provided with the heat transfer plate 280 without changing the overall size of the data processor 230 and the heat dissipation performance is better.

Further, as shown in FIGS. 40 and 41, based on the design of the first extension portion 282 using the heat pipe structure, in the thirteenth embodiment, the first heat sink 241 may include a first radiating fin 241a and a second radiating fin 241b. Specifically, the first radiating fins 241a are provided substantially in the vertical direction and are in contact with the first extension portion 282 to diffuse the heat of the heat pipe. The second radiating fin 241b is substantially connected to the first radiating fin 241a in a horizontal direction or other directions, thereby increasing the surface area of the first heat sink 241 and improving the heat dissipation performance.

Further, as shown in FIGS. 40 and 41, based on the design in which the first heat sink 241 includes first radiating fins 241a and second radiating fins 241b, in the thirteenth embodiment, the first heat sink 241 may include a plurality of second radiating fins 241b, and the plurality of second radiating fins 241b may be connected to the first radiating fins 241a at intervals in the vertical direction.

Further, as shown in FIG. 38, based on the design of the first extension portion 282 using the heat pipe structure, and the design of the data processing device including the second heat sink 242, in the thirteenth embodiment, the mounting seat 2421 of the second heat sink 242 may be provided with a side groove, and the side groove of the mounting seat 2421 can allow the first extension portion 282 to pass through.

Furthermore, as shown in FIG. 38, in the thirteenth embodiment, the data processing device provided by the present disclosure may include a second reinforcement board 262. The second reinforcement board 262 can be provided above the carrier board 210. For example, when the second heat sink 242 is provided above the carrier board 210, the second reinforcement board 262 may be provided between the carrier board 210 and the second heat sink 242. On this basis, in other embodiments, the first extension portion 282 of the heat transfer plate 280 can also be connected to the second reinforcement board 262 by a connector such as a screw 282s. That is, when the second reinforcement board 262 is provided between the carrier board 210 and the second heat sink 242, an indirect connection between the first extension portion 282 and the second heat sink 242 can be achieved by the connection between the first extension portion 282 of the heat transfer plate 280 and the second reinforcement board 262. Based on the above design, it is beneficial to improve installment stability of the heat transfer plate 280 on the data processor 230, and a heat conducting connection between the heat transfer plate 280 and the second reinforcement board 262 can also be realized.

Figure 42:
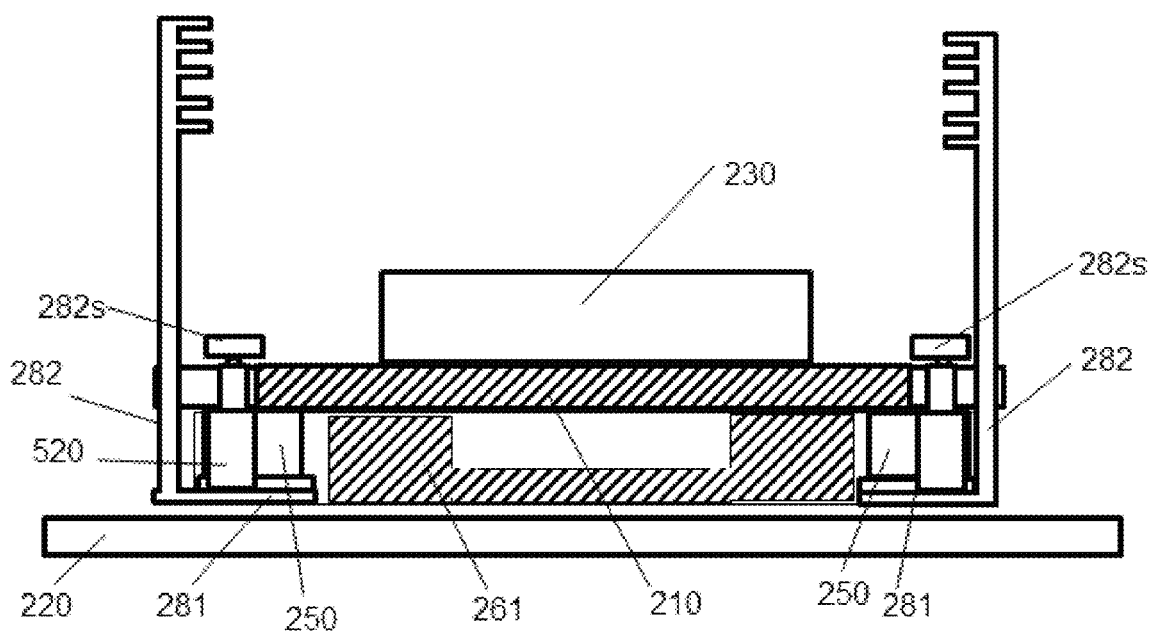
FIG. 42 is a schematic structural diagram of a data processing device according to a fourteenth embodiment of the present disclosure.

Refer to FIG. 42, which exemplarily shows a schematic structural diagram of a data processing device in the fourteenth embodiment of the present disclosure. In the fourteenth embodiment, the design of the data processing device provided by the present disclosure is substantially the same as that in the first to thirteenth embodiments. Differences of the design of the data processing device in the fourteenth embodiment from the other embodiments will be described below with reference to the drawings. The same or similar design as in the other embodiments will not be repeated here.

As shown in FIG. 42, in the fourteenth embodiment, the main body portion 281 is provided with a positioning column 520, which extends upward and passes through the carrier board 210 (e.g., through a side groove or a through hole on the carrier board 210). The top of the positioning column 520 is provided with a threaded hole, the threaded hole can be threadingly matched with the screw 282s, and the positioning column 520 can be detachably fixed to the carrier board 210 via the screw 282s. According to the present disclosure, based on the cooperation of the screws 282s and the positioning columns 520, the heat transfer plate 280 can be pressed to a lower surface of the power module 250 and to be fixedly connected to the carrier board 210. Based on the above design, this fixing method of the present disclosure has a simple structure, can easily achieve disassembly and assembly, and reliable connection. A gap between the heat transfer plate 280 and the lower surface of the power module 250 can be adjusted by adjusting the height of the positioning column 520.

Further, based on the design of the main body portion 281 provided with the positioning column 520, in the fourteenth embodiment, the threaded column (i.e., the positioning column) 520 and an upper surface of the main body portion 281 can be fixedly connected by means of welding, etc., which can avoid a protrusion on the lower surface of the main body portion 281, thereby avoiding of providing avoidance holes or avoidance grooves at corresponding positions on the system main board 220.

Further, as shown in FIG. 42, based on the design of the positioning column 520, in the fourteenth embodiment, the positioning column 520 may have a stepped structure and have a first-stage column and a second-stage column, and the first-stage column is provided on the main body portion. The second-stage column is provided on top of the first-stage column and has an outer diameter smaller than that of the first-stage column. The second-stage column passes through the carrier board 210, and the threaded hole is on top of the second-stage column. Accordingly, a step surface is formed at a junction between the first-stage column and the second-stage column, and the step surface abuts against the lower surface of the carrier board 210. Based on the above design, a distance between the main body portion 281 and the carrier board 210 can be adjusted by the positioning column 520 with the stepped structure, a gap between the main body portion 281 and the lower surface of the power module 250 can be properly adjusted, each power module 250 can be allowed to receive uniform pressure from the main body portion and can be prevented from being damaged due to excessive pressure, and meanwhile the heat dissipation can be more uniform.

Figure 43:
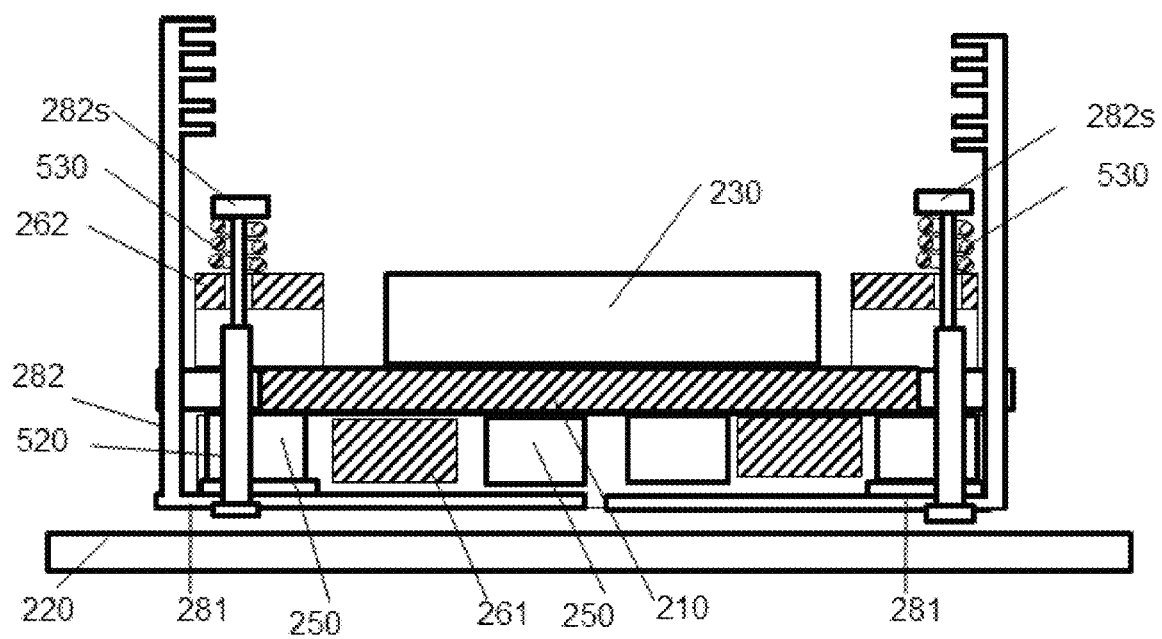
FIG. 43 is a schematic structural diagram of a data processing device according to a fifteenth embodiment of the present disclosure.

Refer to FIG. 43, which exemplarily shows a schematic structural diagram of a data processing device provided by the present disclosure in the fifteenth embodiment. In the fifteenth embodiment, the design of the data processing device provided by the present disclosure is substantially the same as that in the first to fourteenth embodiments. Differences of the design of the data processing device in the fifteenth embodiment from the other embodiments will be described below with reference to the drawing. The same or similar design as in the other embodiments will not be repeated here.

As shown in FIG. 43, based on the design of the positioning column 520 of the fourteenth embodiment and the design of the second reinforcement board 262, in the fifteenth embodiment, the screw 282s can be sleeved with a spring 530, and the screw 282s penetrates the second reinforcement board 262 from above the second reinforcement board 262, and then is threadedly engaged to the threaded hole at the top of the positioning column 520. Two ends of the spring 530 are respectively against a nut of the screw 282s and an upper surface of the second reinforcement board 262. Based on the above design, the present disclosure can adjust the pressure of the main body portion 281 on the power module 520 by adjusting the compression amount of the spring 530 sleeved and installed on the screw 282s. In other embodiments, even if the second reinforcement board 262 is provided, the screw 282 can be provided between a bottom of the second reinforcement board 262 and the top of the carrier board 210. That is, the two ends of the spring 530 can be respectively against the nut of the screw 282s and the upper surface of the carrier board 210, and the resulting structure can be simplified and the installation is convenient.

Further, as shown in FIG. 43, in the fifteenth embodiment, the positioning column 520 may use a countersunk screw structure, so that the screw head (i.e., the nut) can be embedded in the main body portion 281, avoiding protrusions on the bottom surface of the main body 281, which simplifies a fitting structure with the system main board 220. Obviously, the positioning column 520 in the fifteenth embodiment can also use a structure similar to the positioning column fixedly connected to the main body portion 281 shown in FIG. 42, which is not limited to this embodiment.

Figure 44:
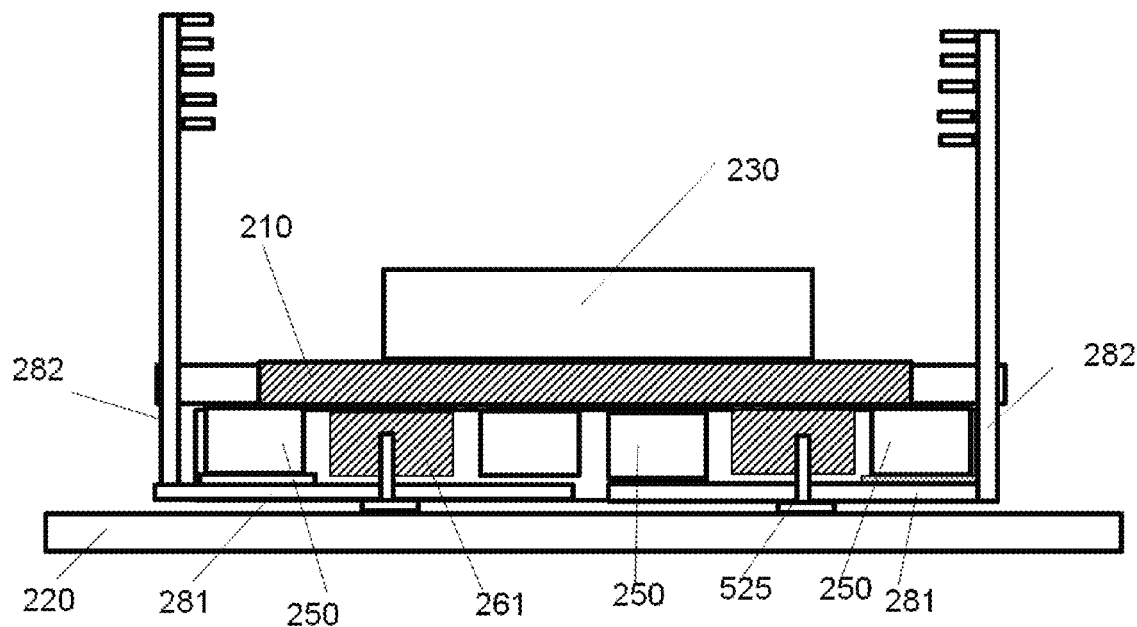
FIG. 44 is a schematic structural diagram of a data processing device according to a sixteenth embodiment of the present disclosure.

FIG. 44 exemplarily shows a schematic structural diagram of a data processing device provided by the present disclosure in the sixteenth embodiment. In the sixteenth embodiment, the main body portions 281 of the heat transfer plates 280 at both sides can be extended inward to be below the data processor 230. For example, a power module 250 may be provided below the projection area of the data processor 230, and the heat of the power module 250 can be dissipated. In addition, a fastener 525 may be provided by which the main body portion 281 of the heat transfer plate 280 can be fixed to the first reinforcement board 261, so that the main body portion 281 of the heat transfer plate 280 can be reliably pressed against the power module 250.

Figure 45:
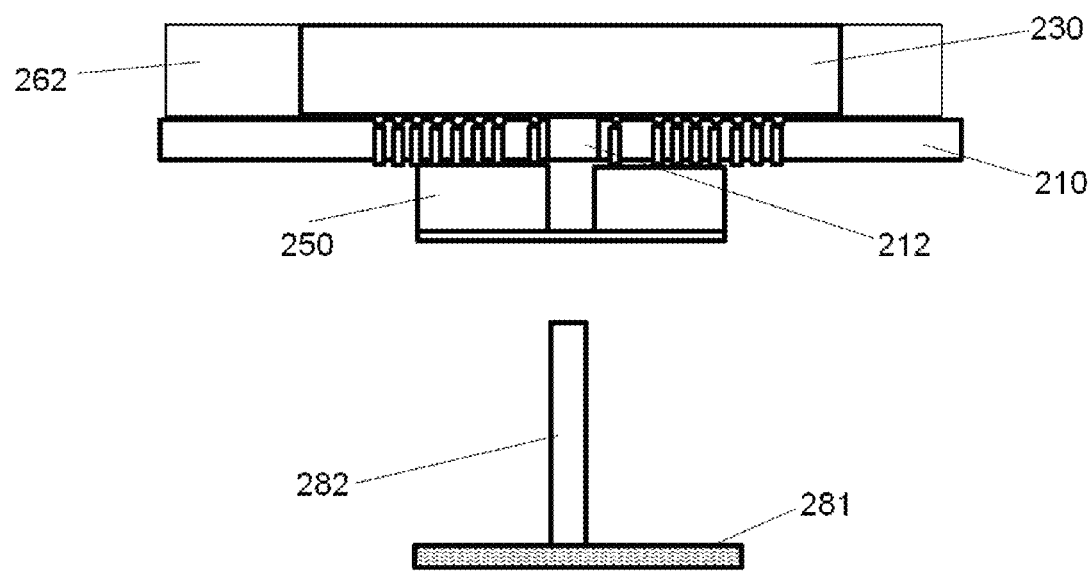
FIG. 45 to FIG. 48 are schematic side views of a data processing device in steps of assembling process according to a seventeenth embodiment of the present disclosure.
Figure 46:
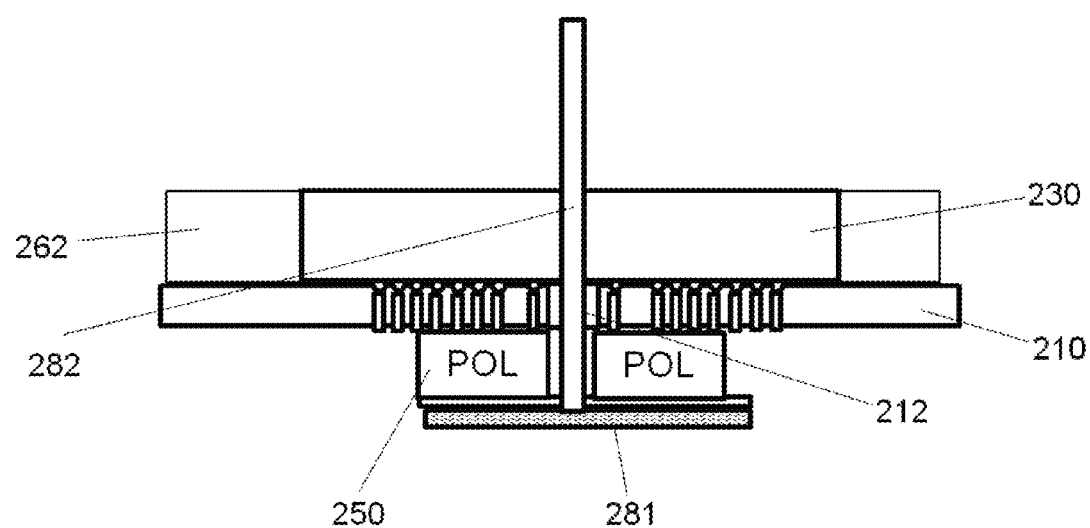
Figure 47:
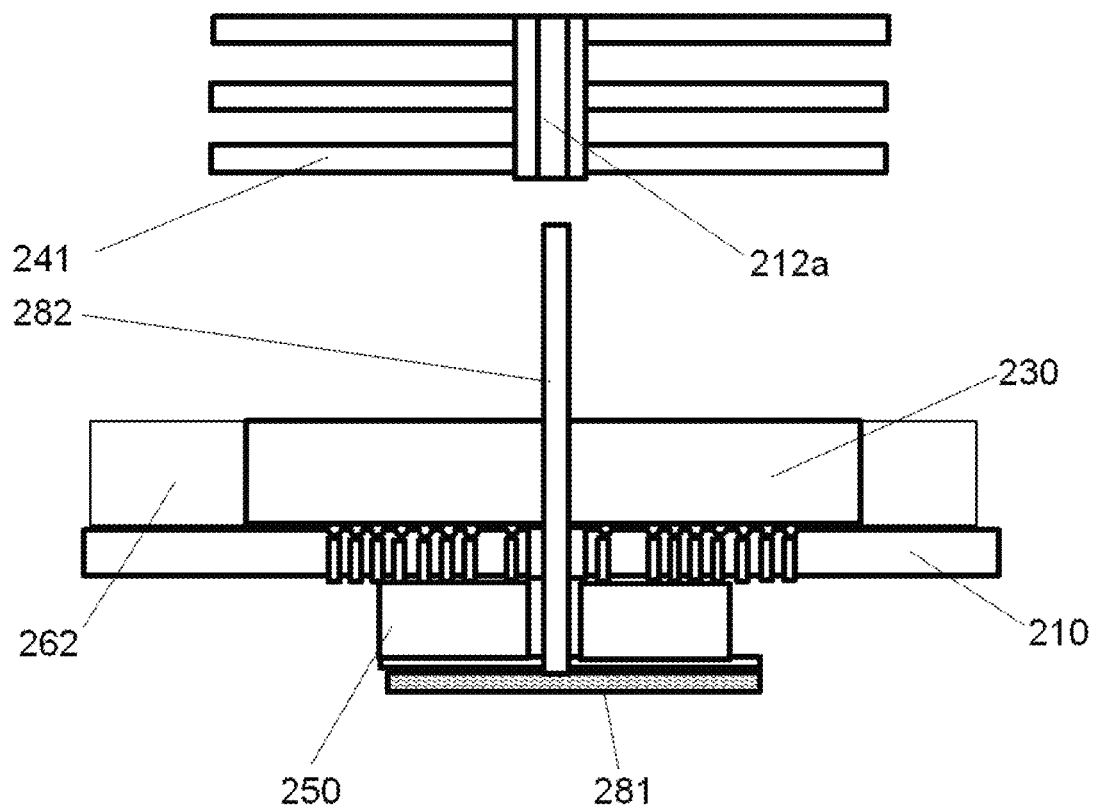
Figure 48:
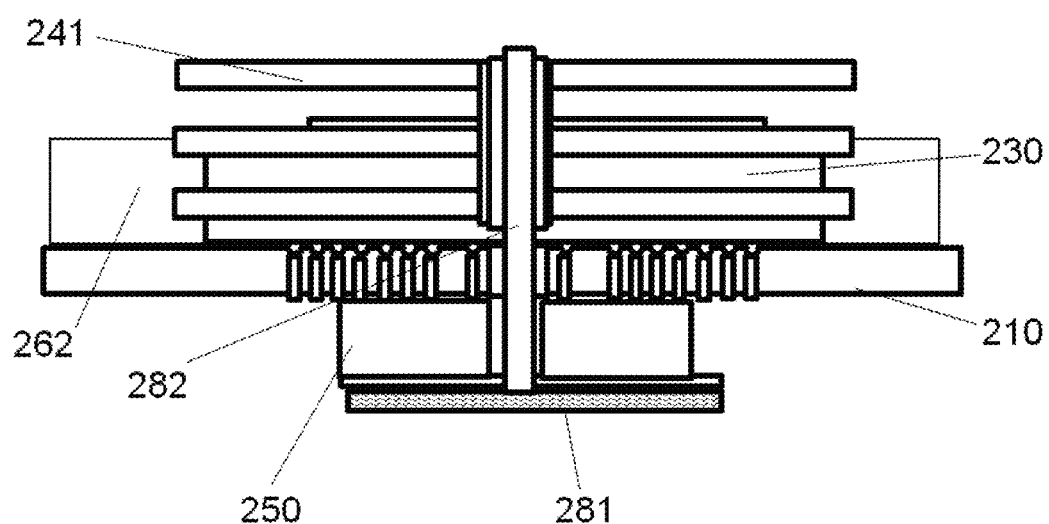

As shown in FIGS. 45 to 48, which exemplarily show schematic structural diagrams of a data processing device provided by the present disclosure in steps of the assembling process in the seventeenth embodiment. As shown in FIG. 45, the heat transfer plate 280 includes the main body portion 281 and the extension portion 282. The extension portion 282 may be a columnar structure, and the extension portion 282 corresponds to the opening 212 or the side groove 510 on the carrier board 210 (see FIG. 39). The power module 250 and the data processor 230 are respectively provided on both sides of the carrier board 210, and the projections of the power module 250 and the data processor 230 on the carrier board are at least partially overlapped. As shown in FIG. 46, the extension portion 282 passes through the opening 212, and the main body portion 281 is against to the bottom of the power module 250 (i.e., a side of the power module 250 away from the data processor 230). As shown in FIG. 47, the first heat sink 241 is provided with a fitting hole 212a, and the fitting hole 212a corresponds to the extension portion 282. As shown in FIG. 48, the fitting hole 212a of the first heat sink 241 is assembled with the extension portion 282, so that the heat of the power module 250 can be transferred to the first heat sink 241 through the main body portion 281 and the extension portion 282, and then can be diffused into the air by the heat sink 241.

Figure 49:
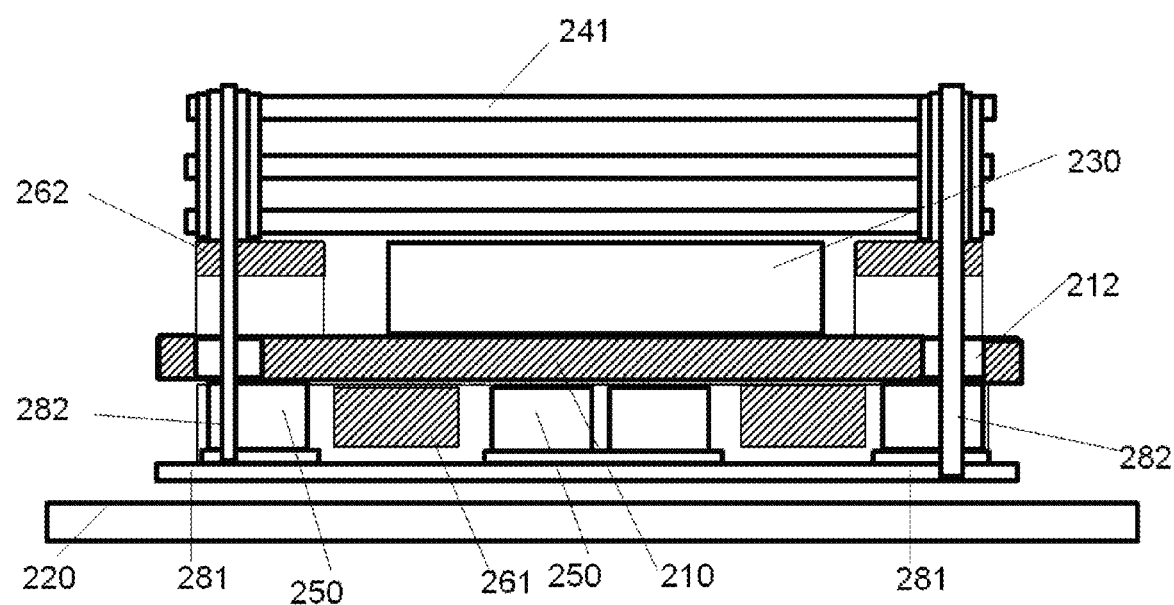
FIG. 49 is a schematic structural diagram of the data processing device according to the seventeenth embodiment of the present disclosure.
Figure 50:
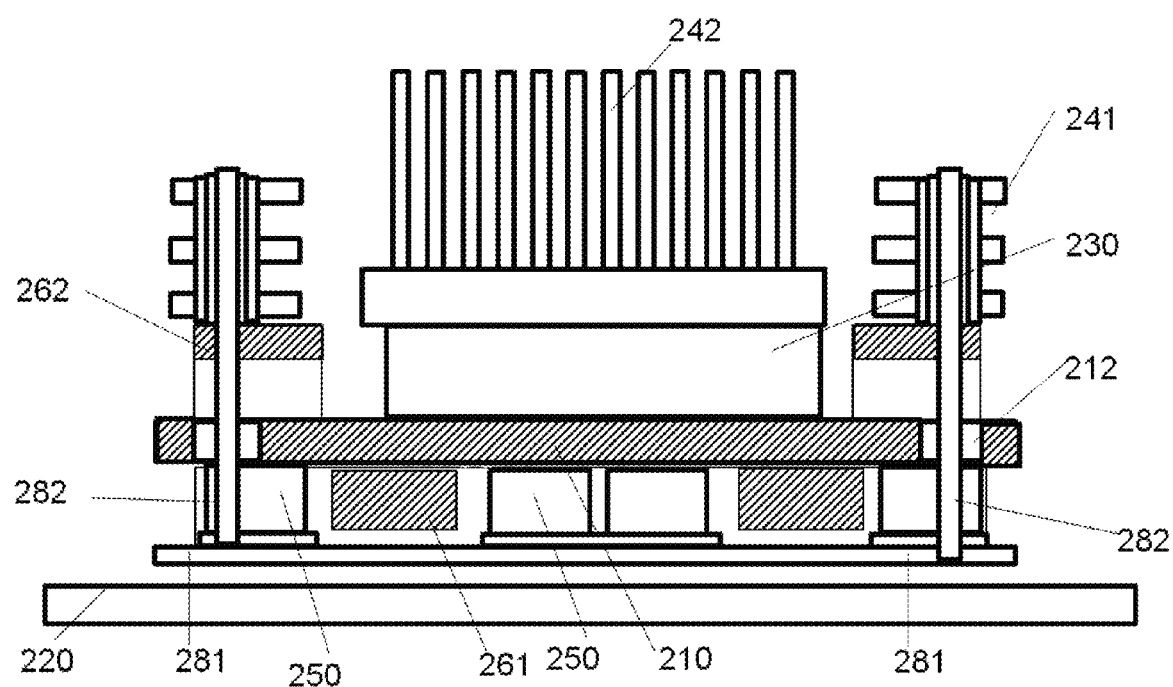
FIG. 50 is another schematic structural diagram of the data processing device according to the seventeenth embodiment of the present disclosure.

As shown in FIG. 49, the heat sink 241 for dissipating heat to the data processor 230 can be assembled and connected with the extension portion 282 to transfer heat. The heat of the power module 250 can be transferred to the heat sink 241 through the main body portion 281 and the extension portion 282. Alternatively, as shown in FIG. 50, first heat sink 241 may be additionally provided to be assembled and connected to the extension portion 282 to transfer heat. The heat of the power module 250 can be transferred to the first heat sink 241 through the main body portion 281 and the extension portion 282. The main body portion 281 and the left and right extension portions 282 can form an integral structure, and then be assembled to the data processing device. This is advantageous for the power module 250 to dissipate heat from the left and right sides at the same time, and it is possible to dissipate the heat of the power module 250 in the middle or at both sides of the carrier board. Obviously, the main body portion 281 may also be a split structure similar to that shown in FIG. 42 or FIG. 43.

Figure 51:
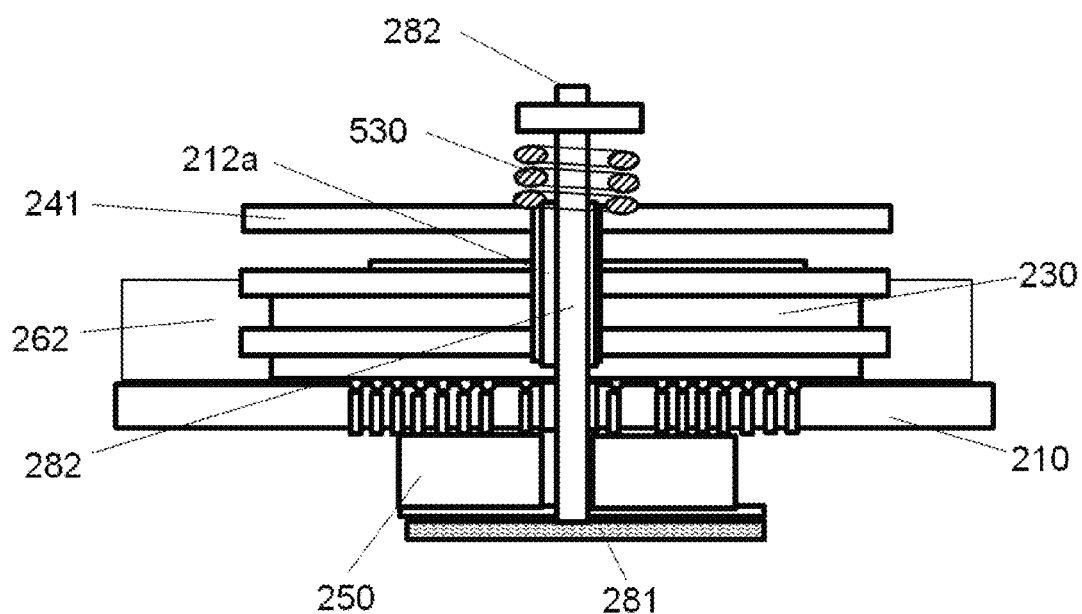
FIG. 51 is a schematic side view of a data processing device according to an eighteenth embodiment of the present disclosure.
Figure 52:
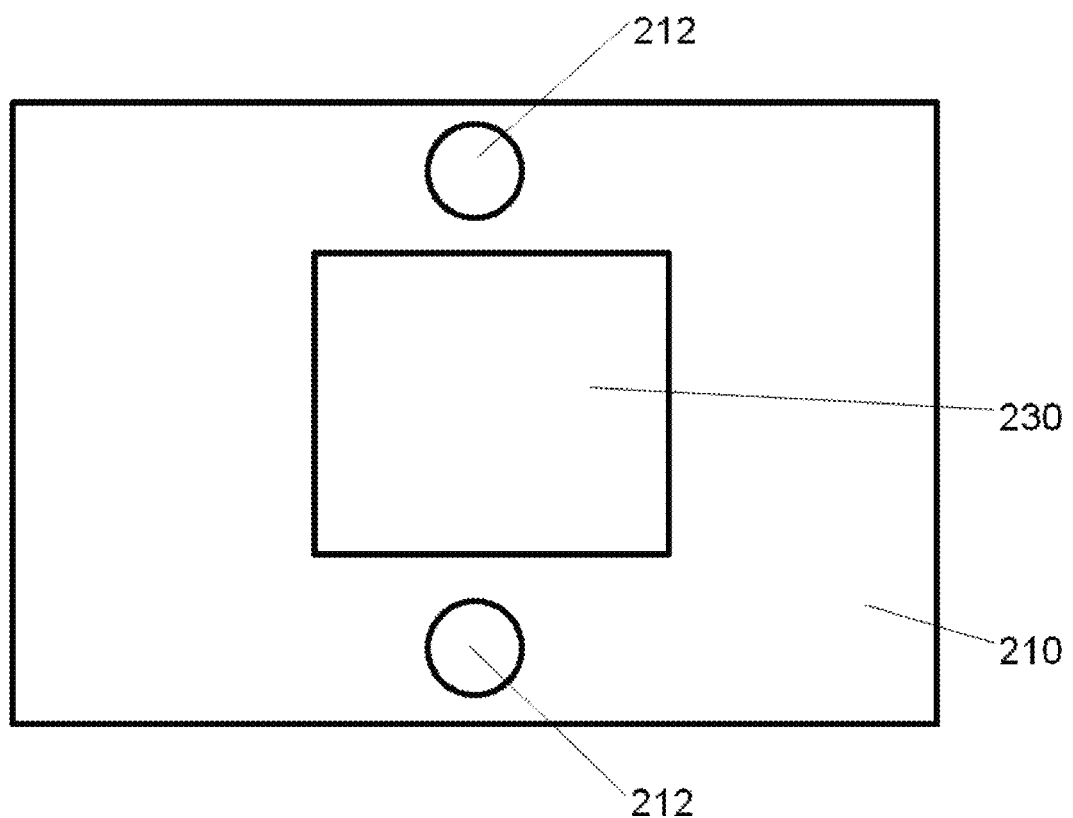
FIG. 52 is a schematic top view of the data processing device shown in FIG. 51.

Refer to FIG. 51, which exemplarily shows the schematic side view of the data processing device provided by the present disclosure in the eighteenth embodiment. With reference to FIG. 52, it exemplarily shows a schematic top view of the data processing device shown in FIG. 51. For facilitating illustration, the figure only illustrates the data processor 230, the carrier board 210, and the opening 212 on the carrier board 210. The extension portion 282 may be sleeved with the spring 530, thereby enabling the first heat sink 241 and the extension portion 282 to be tightly combined. In addition, the extension portion 282 may have a tapered structure with a small top and a large bottom. The fitting hole 212a of the first heat sink 241 may be approximately a tapered hole corresponding to the tapered structure of the extension portion 282, which facilitates a more solid assembly of the fitting hole 212a of the first heat sink 241 and the tapered structure of the extension portion 282 to reduce the thermal resistance of the connection. A thermally conductive material such as thermally conductive silicone grease can be provided between the first heat sink 241 and the extension 282 to reduce the thermal resistance.

Figure 53:
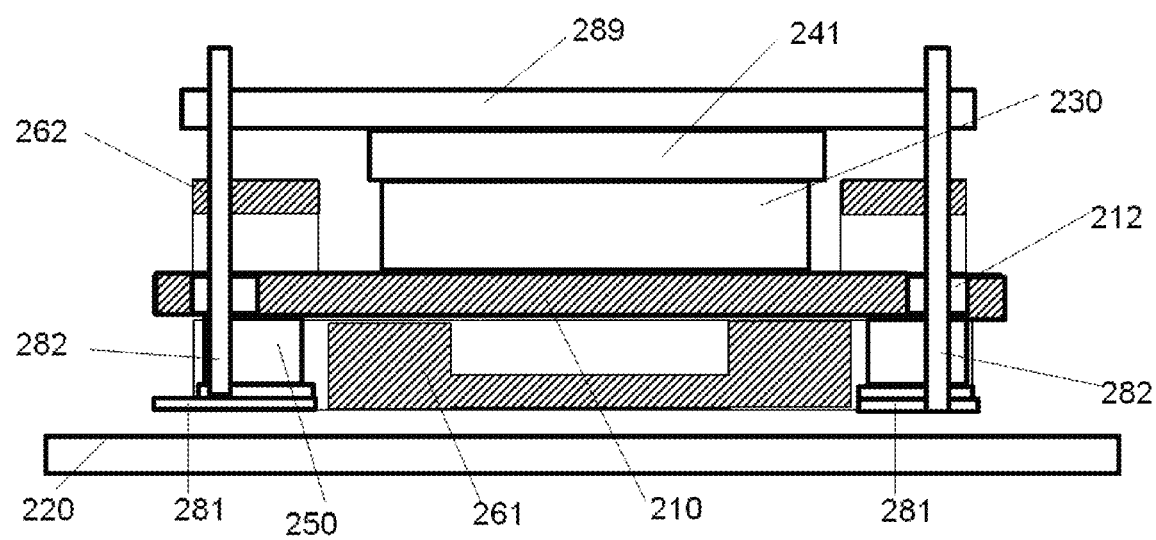
FIG. 53 is a schematic structural diagram of a data processing device according to a nineteenth embodiment of the present disclosure.

Refer to FIG. 53, which exemplarily shows a schematic side view of the data processing device in the nineteenth embodiment of the present disclosure. In the nineteenth embodiment, when the heat sink of the data processor 230 is a water-cooling plate, a bottom of the first heat sink 241 can be in contact with the upper surface of the data processor 230 to dissipate heat, and the extension 282 passes through the opening 212 of the carrier board 210 to be assembled and connected to the main body portion 281 to transfer heat. The heat transfer plate 281 transfers heat to a transverse heat transfer plate 289 via the first extension portion 282, and the transverse heat transfer plate 289 is provided above the water-cooling first heat sink 241 (i.e., a side away from the data processor 230) to contact and transfer heat to the first heat sink 241, and the liquid refrigerant (such as water) inside the first heat sink 241 can take heat away. In addition, the transverse heat transfer plate 289 may not be required, so that the extension 282 can be directly connected to the water-cooling first heat sink 241 by assembling and then to transfer heat, thereby further reducing the thermal resistance and connections of components. FIG. 53 shows that the main body portion 281 has a split structure for easy installation.

Figure 54:
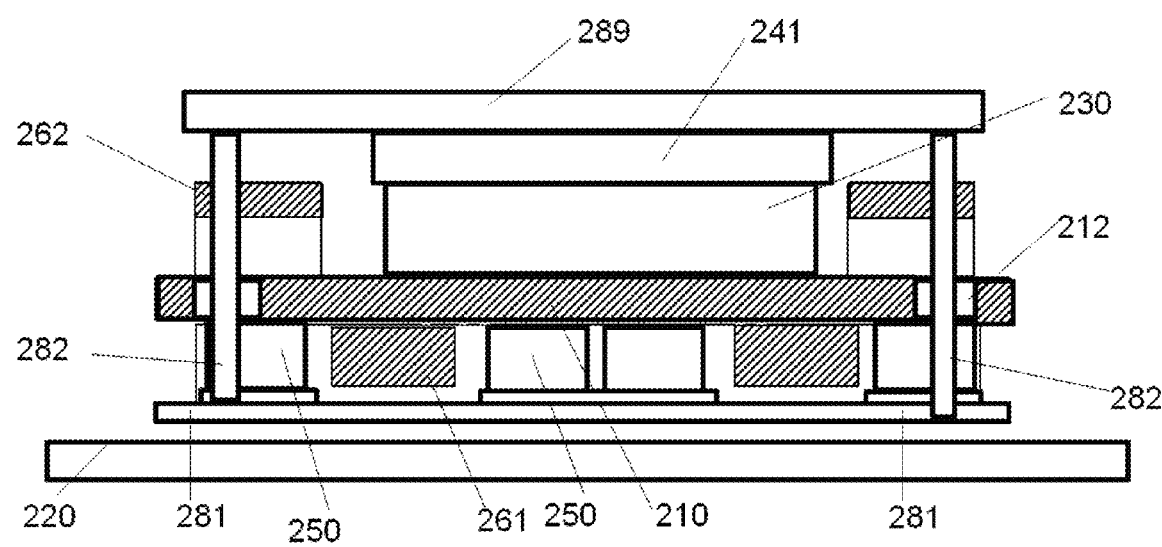
FIG. 54 is a schematic structural diagram of a data processing device according to a twentieth embodiment of the present disclosure.

In other embodiments, based on the design in the nineteenth embodiment described above, the main body portion 281 is not limited to a split structure. For example, in the twentieth embodiment of the data processing device provided by the present disclosure, as shown in FIG. 54, the main body portion 281 can also be an integral structure.

Figure 55:
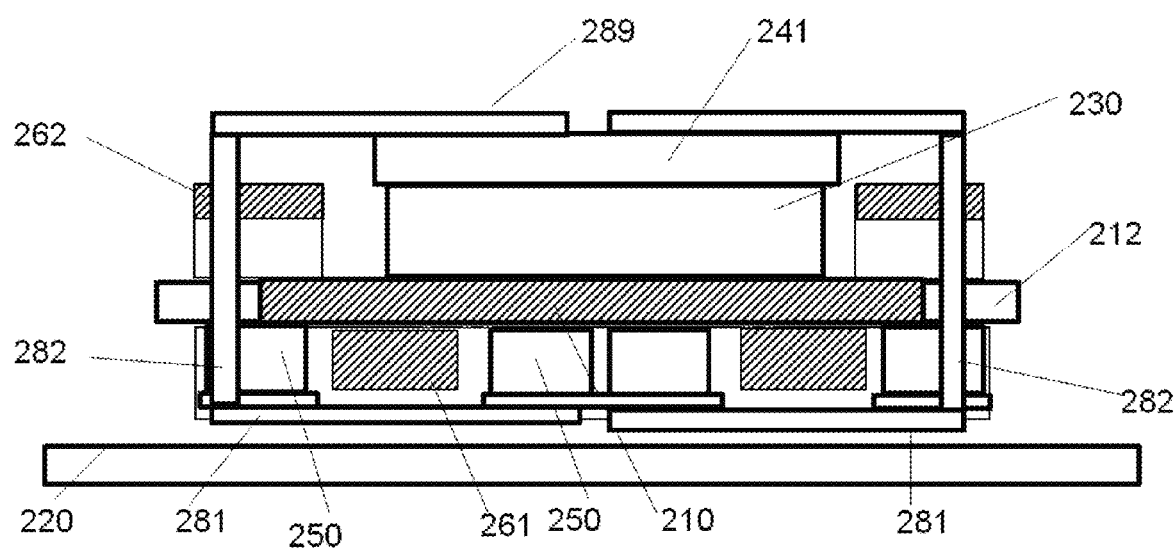
FIG. 55 is a schematic structural diagram of a data processing device according to a twenty-first embodiment of the present disclosure.

Refer to FIG. 55, which exemplarily shows a schematic side view of the data processing device in the twenty-first embodiment of the present disclosure. In the twenty-first embodiment, the heat transfer plate 280 may be a substantially U-shaped structure formed by the main body portion 281, the extension portion 282 and the transverse heat transfer plate 289 which are integrally connected with each other, and the heat transfer plate 280 can be assembled from the left and right sides of the data processing device, so that the main body portion 281 and the power module 250 are thermally connected. The extension portion 282 can be provided in the opening 212, and the transverse heat transfer plate 289 can be provided above the carrier board 210 and is assembled and connected with the water-cooling plate heat sink 241 to transfer heat. For example, the transverse heat transfer plate 289 can be assembled and laid on the upper surface of the water-cooling plate heat sink 241 to increase the heat conduction area and reduce the thermal resistance. This solution has a simple structure and few components. The extension 282 of the main body portion 281 and the transverse heat transfer plate 289 can be pre-connected as a whole, which is easy to be achieved and can ensure the heat conduction performance.

It should be noted that, the smart accelerator module OAM (i.e., OCP Accelerator Module) according to the Open Computer Project (OCP) industry standard (i.e., the OCP Accelerator Module Design Specification) specifies the main structure and dimensions of the smart accelerator. For example, according to the OCP Accelerator Module Design Specification V1.0, the main structure of the OAM smart accelerator (i.e., the data processor 230) sequentially includes the above second reinforcement board 262, the carrier board 210 (e.g., a circuit board), the lower first reinforcement board 261, a smart IC (i.e., the data processor 230) arranged above the carrier board 210 and a heat sink (i.e., the first heat sink 241 or the second heat sink 242)

provided above the smart IC. In addition, connectors are provided at two symmetrical positions below the carrier board 210 for signal and power connection with the system motherboard of the server. The resulting structure is formed as a common structure of various smart accelerators for OAM packaging, but the overall dimensions of smart accelerators of different manufacturers may be somewhat different. For example, the OAM smart accelerator recommended in OCP has a footprint of 165 mm×02 mm.

It should be noted here that the data processing devices shown in the drawings and described in this specification are only a few examples of many data processing devices that can using the principles of the present disclosure. It should be clearly understood that the principle of the present disclosure is not limited to any details or any components of the data processing device shown in the drawings or described in this specification.

Figure 57:
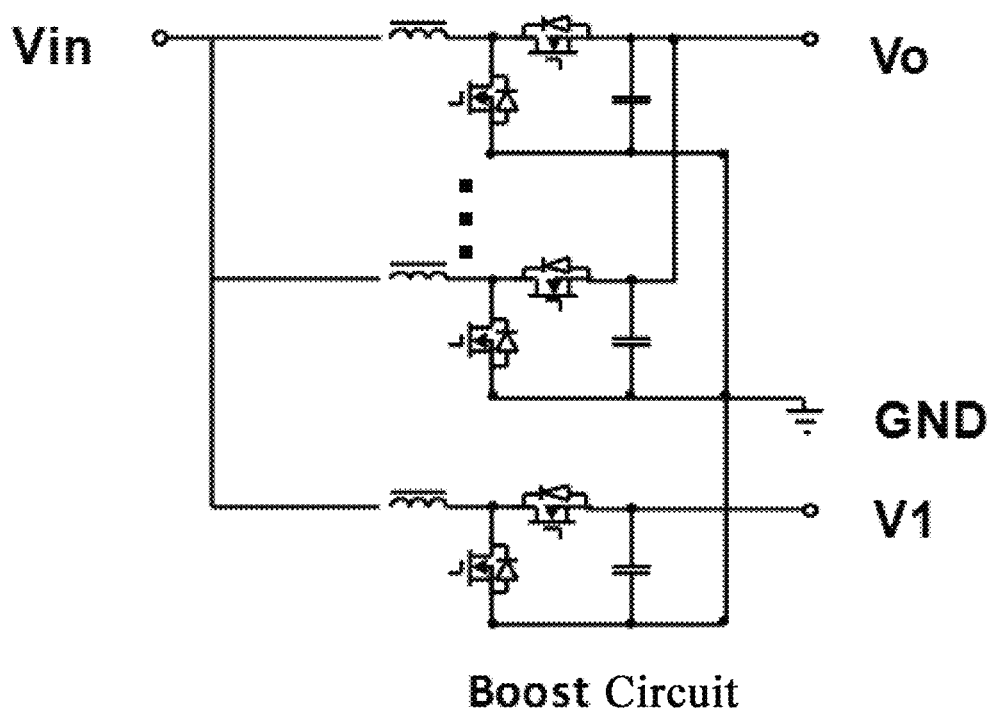
Figure 58:
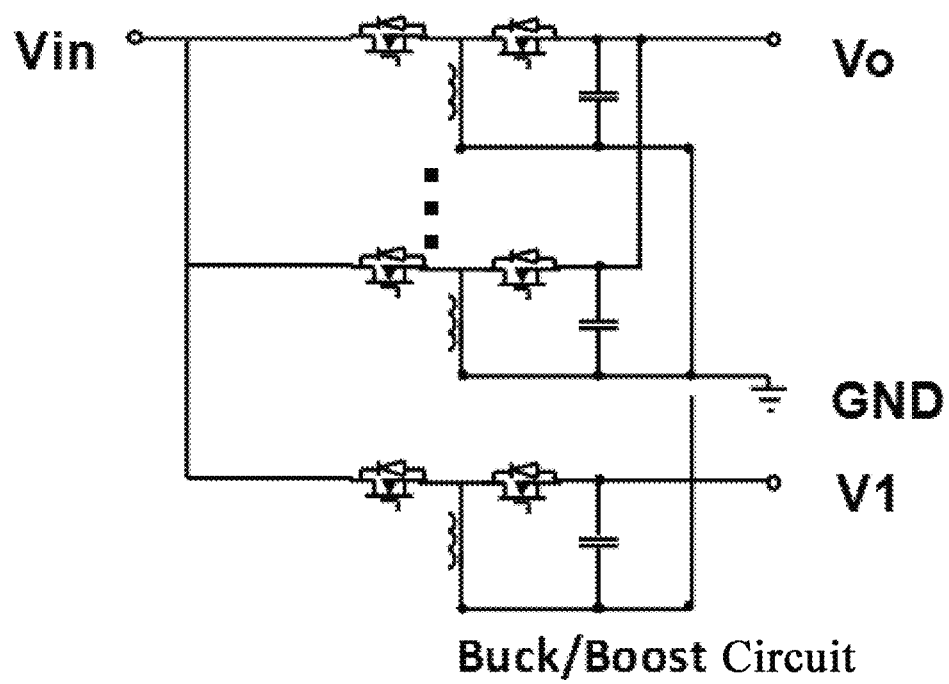
Figure 59:
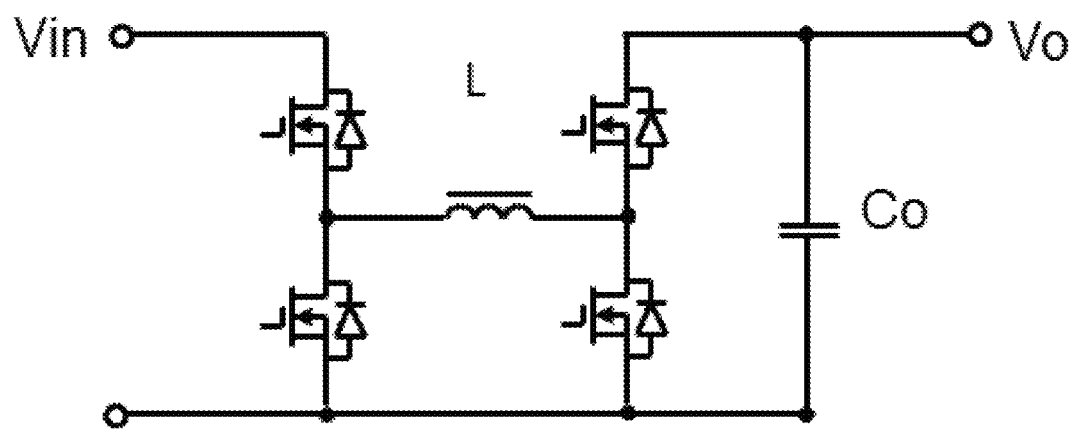
Figure 60:
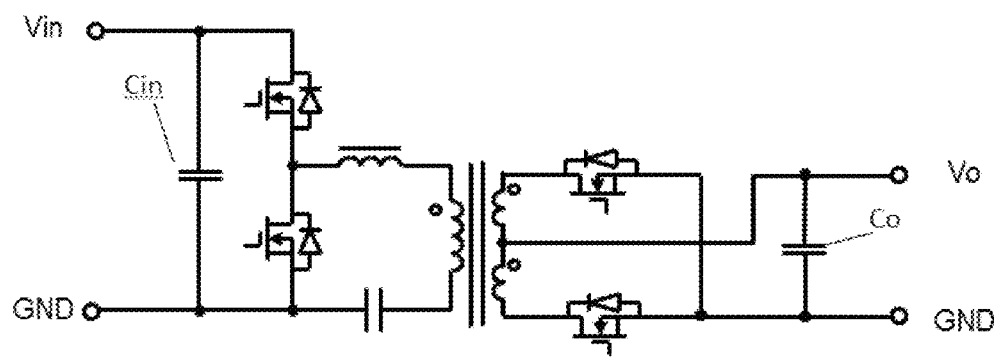
Figure 61:
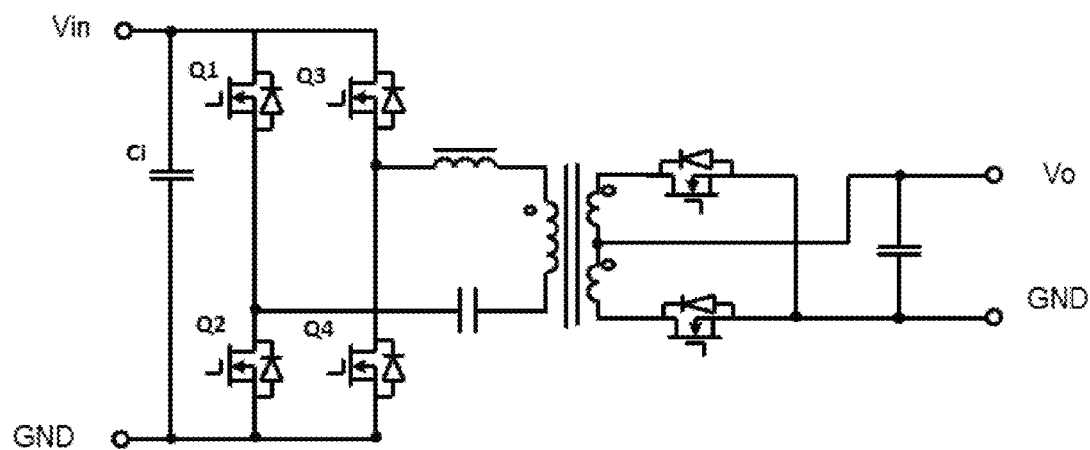
Figure 62:
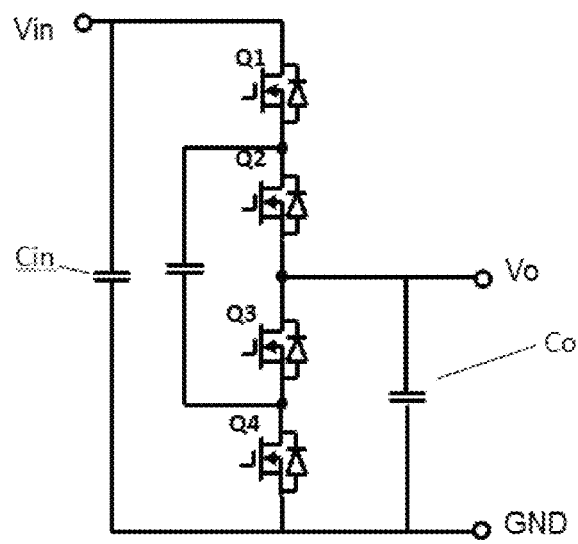

For example, FIG. 56 to FIG. 62 respectively show a part of the circuit diagram of the power module 250 applicable to the data processing device provided by the present disclosure. Cin in each circuit diagram indicates input capacitance, Co indicates output capacitance, Vin indicates input of the circuit is positive, GND indicates input of the circuit is negative, Vo indicates output of the circuit is positive, SW indicates midpoint of a half-bridge circuit, FIG. 56 showing a parallel connection of two half-bridge circuits, and V1 indicates output of a half-bridge circuit with a different output voltage from Vo is positive. On this basis, FIG. 57 shows a Boost circuit, FIG. 58 shows a Buck-Boost circuit, FIG. 59 shows a four-switch Buck-Boost circuit, and FIG. 60 shows a half bridge LLC circuit, FIG. 61 shows a full-bridge LLC circuit, and FIG. 62 shows a switching capacitor circuit. In addition, the power module 250 may also use other circuit topologies, including but not limited to a Cuk circuit or a flyback circuit.

To sum up, in the data processing device provided by the present disclosure, the heat transfer plate is provided below the power module located below the carrier board, and the first extension portion of the heat transfer plate is extended upward and connected to the first heat sink located above the carrier board. Based on the above design, the data processing device provided by the present disclosure can meet the heat dissipation requirements when the power module and the data processor are respectively provided on the two opposite sides of the carrier board, especially the heat dissipation requirements of the power module when the data processing device using a vertical architecture. Accordingly, the data processing device provided by the present disclosure has the advantage of good heat dissipation. In addition, the data processing device provided by the present disclosure does not have the problem that it is difficult to install a heat dissipation structure due to the small space under the carrier board, so that the data processing device is more suitable for the design trend of thinning and miniaturization.

The exemplary embodiments of the data processing device provided by the present disclosure have been described and/or illustrated in detail above. However, the embodiments of the present disclosure are not limited to the embodiments described herein. On the contrary, the components and/or steps of each embodiment can be used independently and separately from other components and/or steps described herein. Each component and/or step of one embodiment can also be used in combination with other components and/or steps of other embodiments. When introducing the elements/components/and the like described and/or illustrated herein, the terms "a". "an", and "above" are used to indicate that there are one or more elements/components/etc. The terms "include", "including" and "have" used herein indicate open-ended inclusion and mean that there may be additional elements/components/and the like in addition to the listed elements/components/and the like. In addition, the terms "first" and "second" in the claims and specification are used only as marks, and are not numerical limitations on their objects.

Although the data processing device provided by the present disclosure has been described according to different specific embodiments, those skilled in the art will recognize that the implementation of the present disclosure can be modified within the spirit and scope of the claims.

What is claimed is:

1. A data processing device, comprising:
   a carrier board,
   a data processor provided above the carrier board,
   a power module provided below the carrier board and used for supplying power to the data processor through the carrier board;
   a first heat sink provided above the carrier board;
   a heat transfer plate, comprising:
   a main body portion provided below the power module; and
   a first extension portion extending upward from one side of the main body portion and connected to the first heat sink; and
   a second heat sink provided above the data processor to dissipate heat for the data processor, wherein the second heat sink is connected to the first heat sink,
   wherein the first heat sink is provided on the first extension portion, and the first heat sink and the second heat sink are arranged on different planes,
   wherein heat generated by the power module is transferred to the first heat sink through the main body portion and the first extension portion of the heat transfer plate, and
   wherein the first heat sink comprises a body and a first mounting board, and the first extension portion is assembled to the body through the first mounting board,
   wherein the first heat sink further comprises a heat pipe passing through the body and having an end connected to the first mounting board.

2. The data processing device of claim 1, wherein the first heat sink is provided above the data processor and is configured to dissipate heat for the data processor.

3. The data processing device of claim 1,
   wherein the first extension portion extends upward from one side of the main body portion;
   wherein the heat transfer plate further comprises:
   a second extension portion extending upward from other side of the main body portion and connected to the first heat sink; and
   a second mounting board fixed to the body and connected to the second extension portion.

4. The data processing device of claim 3, wherein the heat transfer plate further comprises a second extension portion extending upward from the other side of the main body portion and connected to the first heat sink; and
   wherein the main body portion of the heat transfer plate is a vapor chamber, and the second extension is formed by an extension portion of an upper copper plate or a lower copper plate of the vapor chamber; or,
   the second extension portion is a vapor chamber or a heat pipe.

5. The data processing device of claim 1, wherein the heat transfer plate further comprises:

a transverse heat transfer plate connected to the first extension portion, extending in a horizontal direction and contacting an upper surface of the first heat sink.

6. The data processing device of claim 1, wherein the first extension portion extends from the main body portion and upward across periphery of the carrier board; or
wherein the first extension portion extends from the main body portion and upward through the carrier board.

7. The data processing device of claim 6, wherein the carrier board is provided with an opening, and the first extension portion extends upward through the carrier board via the opening; or,
a groove is formed on periphery of the carrier board, and the first extension portion extends upward through the carrier board via the groove.

8. The data processing device of claim 1, wherein at least one protrusion is provided on an upper surface of the heat transfer plate, and located at a side of the power module.

9. The data processing device of claim 1, wherein an orthographic projection of the data processor on the carrier board is at least partly overlapped with an orthographic projection of the power module on the carrier board.

10. The data processing device of claim 1, wherein the carrier board is a system main board.

11. The data processing device of claim 1, wherein a side groove or an opening is provided at a position of the carrier board corresponding to the first extension portion, and the first extension portion at least partly passes through the side groove or opening.

12. The data processing device of claim 1, wherein the main body portion is provided with a positioning column extending upward and passing through the carrier board, and a threaded hole is provided on a top end of the positioning column, the threaded hole is threadingly engaged to a screw, and the positioning column is fixed to the carrier board by the screw.

13. The data processing device of claim 1, wherein an orthographic projection of the power module on an upper surface of the carrier board is located at one side or both sides of an orthographic projection of the data processor on the upper surface of the carrier board; and
wherein the power module comprises two groups of power modules, and orthographic projections of the two groups of the power modules on the surface of the carrier board are respectively located at the both sides of the orthographic projection of the data processor on the upper surface of the carrier board; and
wherein the data processing device further comprises two heat transfer plates, and two main bodies of the two heat transfer plates are respectively provided below the two groups of power modules.

14. The data processing device of claim 1, wherein the first heat sink is provided with a fitting hole, and the first extension passes through the fitting hole to be connected to the first heat sink;
wherein one end of the first extension portion is connected to the main body portion, and other end of the first extension portion passes through the fitting hole and protrudes from a side of the first heat sink distal to the main body portion, wherein a spring is connected between the other end of the first extension portion and the side of the first heat sink distal to the main body portion; and
wherein a part of the first extension portion passing through the fitting hole is tapered, and an outer diameter of the other end of the first extension portion is smaller than an outer diameter of the end of the first extension portion connected to the main body portion, wherein the fitting hole of the first heat sink is a tapered hole, and the fitting hole has a shape being matched with a shape of the tapered part of a first extension part.

15. A data processing device, comprising:
a carrier board,
a data processor provided above the carrier board,
a power module provided below the carrier board and used for supplying power to the data processor through the carrier board;
a first heat sink provided above the carrier board; and
a heat transfer plate, comprising:
    a main body portion provided below the power module; and
    a first extension portion extending upward from the main body portion and connected to the first heat sink,
wherein heat generated by the power module is transferred to the first heat sink through the main body portion and the first extension portion of the heat transfer plate,
wherein the first extension portion extends upward from one side of the main body portion,
wherein the heat transfer plate further comprises a second extension portion extending upward from the other side of the main body portion and being connected to the first heat sink,
wherein the data processing device further comprises a first reinforcement board provided between the carrier board and the main body portion, wherein a first through hole is provided on the first reinforcement board, and the power module passes through the first through hole and contacts the main body portion, wherein the first reinforcement board comprises a first recess being recessed from bottom to top in a vertical direction and passing through opposite sides of the first reinforcement board in a horizontal direction, and
wherein the main body portion comprises a first portion, a second portion and a third portion, the first portion and the third portion are respectively located at two sides of the second portion and respectively connected to the first extension portion and the second extension portion through the first recess, and the second portion of the main body portion is in thermal contact with the power module.

16. A data processing device, comprising:
a carrier board,
a data processor provided above the carrier board,
a power module provided below the carrier board and used for supplying power to the data processor through the carrier board;
a first heat sink provided above the carrier board; and
a heat transfer plate, comprising:
    a main body portion provided below the power module; and
    a first extension portion extending upward from the main body portion and connected to the first heat sink,
wherein heat generated by the power module is transferred to the first heat sink through the main body and the first extension portion of the heat transfer plate,
wherein the data processing device further comprises:
a capacitor board provided between the carrier board and the power module, wherein a capacitor is provided in the capacitor board and is electrically connected to the data processor and the power module, and the power module is used for supplying power to the data processor through the capacitor board; and wherein the capacitor comprises a first capacitor and a second capacitor, and the first capacitor is an I/O decoupling capacitor of the data processor, and the second capacitor is an input loop capacitor for supplying power to the data processor.

17. A data processing device, comprising:
a carrier board,
a data processor provided above the carrier board,
a power module provided below the carrier board and used for supplying power to the data processor through the carrier board;
a first heat sink provided above the carrier board; and
a heat transfer plate, comprising:
   a main body portion provided below the power module; and
   a first extension portion extending upward from the main body portion and connected to the first heat sink,
wherein heat generated by the power module is transferred to the first heat sink through the main body and the first extension portion of the heat transfer plate,
wherein the data processing device further comprises:
a system main board provided below the main body portion; and
a base provided below the system main board, and passing through the system main board to contact the main body portion.

* * * * *